(12) United States Patent
Leung et al.

(10) Patent No.: US 7,502,240 B2
(45) Date of Patent: Mar. 10, 2009

(54) DISTRIBUTED POWER SUPPLY SYSTEM WITH SEPARATE SYNC CONTROL FOR CONTROLLING REMOTE DIGITAL DC/DC CONVERTERS

(75) Inventors: Kafai Leung, Austin, TX (US); Ka Y. Leung, Austin, TX (US); Donald E. Alfano, Round Rock, TX (US)

(73) Assignee: Silicon Laboratories Inc., Austin, TX (US)

( * ) Notice: Subject to any disclaimer, the term of this patent is extended or adjusted under 35 U.S.C. 154(b) by 458 days.

(21) Appl. No.: 11/396,145

(22) Filed: Mar. 31, 2006

(65) Prior Publication Data

US 2006/0279969 A1    Dec. 14, 2006

Related U.S. Application Data

(63) Continuation-in-part of application No. 11/172,358, filed on Jun. 30, 2005, now Pat. No. 7,426,123, which is a continuation-in-part of application No. 11/096,597, filed on Mar. 31, 2005, now Pat. No. 7,428,159.

(51) Int. Cl.
*H02J 1/10* (2006.01)
*H02J 1/00* (2006.01)

(52) U.S. Cl. .......................... 363/72; 307/40
(58) Field of Classification Search ............. 363/71, 363/72; 307/41, 40
See application file for complete search history.

(56) References Cited

U.S. PATENT DOCUMENTS

| | | |
|---|---|---|
| 4,630,187 A | 12/1986 | Henze |
| 5,191,520 A * | 3/1993 | Eckersley .................. 363/72 |
| 5,298,871 A | 3/1994 | Shimohara et al. |

(Continued)

FOREIGN PATENT DOCUMENTS

AU    2003298643 A1    6/2004

(Continued)

OTHER PUBLICATIONS

Aleksandar Prodic, et al.; Mixed-Signal Simulation of Digitally Controlled Switching Converters; Colorado Power Electronics Center, Department of Electrical and Computer Engineering, University of Colorado at Boulder; Boulder, CO 80309-0425, USA.

(Continued)

Primary Examiner—Shawn Riley
(74) Attorney, Agent, or Firm—Howison & Arnott, L.L.P.

(57) ABSTRACT

A distributed power system for delivering DC power to a plurality of loads. A plurality of switching DC/DC converter modules are provided, each disposed proximate one of the loads, and each having associated therewith a switching pulse generator for generating switching pulses. A distributed power line distributes input power to each of the modules and a data communication line distributes command data between the modules, each of the modules uniquely addressable over the data communication line. A timing communication line is also provided for distributing timing information to each of the switching pulse generators. A master controller generates commands and communicates them to the data modules over the data communication line, the master controller operable to generate timing information over the timing communication line to each of the modules for controlling the associated switching pulse generator.

19 Claims, 41 Drawing Sheets

U.S. PATENT DOCUMENTS

| | | | |
|---|---|---|---|
| 6,121,760 | A | 9/2000 | Marshall et al. |
| 6,249,111 | B1 | 6/2001 | Nguyen |
| 6,400,127 | B1 | 6/2002 | Giannopoulos |
| 6,465,993 | B1 | 10/2002 | Clarkin et al. |
| 6,487,246 | B1 | 11/2002 | Hoeld |
| 6,563,294 | B2 | 5/2003 | Duffy et al. |
| 6,686,831 | B2 | 2/2004 | Cook et al. |
| 6,788,035 | B2 | 9/2004 | Bassett et al. |
| 6,801,027 | B2 | 10/2004 | Hann et al. |
| 6,917,186 | B2 | 7/2005 | Klippel et al. |
| 6,933,711 | B2 | 8/2005 | Sutardja et al. |
| 6,965,220 | B2 | 11/2005 | Kernahan et al. |
| 6,977,492 | B2 | 12/2005 | Sutardja et al. |
| 2002/0070718 | A1 | 6/2002 | Rose |
| 2004/0095122 | A1 | 5/2004 | Chapuis |
| 2004/0135560 | A1 | 7/2004 | Kernahan et al. |
| 2004/0155637 | A1 | 8/2004 | Chapuis |
| 2004/0174147 | A1 | 9/2004 | Vinciarelli |
| 2004/0196014 | A1 | 10/2004 | Chapuis |

FOREIGN PATENT DOCUMENTS

| | | |
|---|---|---|
| CN | 1736018 A | 2/2006 |
| EP | 1579561 A2 | 9/2005 |
| JP | 5176547 A | 7/1993 |
| JP | 2885256 B2 | 4/1999 |
| US | 2005017702 A1 | 1/2005 |
| WO | 2004047260 A2 | 6/2004 |

OTHER PUBLICATIONS

Patella, B.J. et al.; High-Frequency Digital PWM Controller IC for DC-DC Converters; Power Electronics, IEEE, vol. 18, Issue 1; pp. 438-446; Jan. 2003.

Albert M. Wu, et al.; Digital PWM Control: Application in Voltage Regulation Modules; Department of Electrrical Engineering and Computer Sciences, University of California, Berkeley; IEEE 1999.

F. Baronti, et al.; DC/DC Switching Power Converter with Radiation Hardened Digital Control Based on SRAM FPGAs; P/MAPLD 2004.

Angel V. Peterchev, et al.; Quantization Resolution and Limit Cycling in Digitally Controlled PWM Converters; Department of Electrical Engineering and Computer Science, University of California, Berkeley.

Biranchinath Sahu, et al.; Adaptive Power Management of Linear RF Power Amplifiers in Mobile Handsets: An Integrated System Design Approach; Georgia Tech Analog and Power IC Design Laboratory, School of Electrical and Computer Engineering, Georgia Institute of Technology; Submission for IEEE Asia Pacific 2004.

Aleksandar Prodic, et al.; Design of a Digital PID Regulator Based on Look-Up Tables for Control of High-Frequency DC-DC Converters; Colorado Power Electronics Center, Department of Electrixcal and Computer Engineering, University of Colorado; Boulder, CO 80309; 0425, USA.

John Sustersic, et al.; Design and Implementation of a Digital Controller for DC-to-DC Power Converters; NASA Clen Research Center, Robert Button; The Advanced Engineering Research Laboratory, Cleveland State University. Copyright 2000 Society of Automotive Engineers, Inc.

Gu-Yeon Wei, et al.; A Fully Digital, Energy-Efficient, Adaptive Power-Supply Regulator; IEEE Journal of Solid State Circuits, vol. 34, No. 4, Apr. 1999.

Dragan Maksimovic, et al.; Custom IC Blocks for Enabling Digital Control in Switching Power Converters; Colorado Power Electronics Center, University of Colorado, Boulder, Jul. 11, 2003.

LM2636 5-Bit Programmable Synchronous Buck Regulator Controller, National Semiconductor, Mar. 2005; 2005 National Semiconductor Corporation.

Jinwen Xiao, et al.; An Ultra-Low-Power Digitally-Controlled Buck Converter IC for Cellular Phone Applications; University of California, Berkeley; IEEE 2004.

Jinwen Xiao, et al.; Architecture and IC Implementation of a Digital VRM Controller, Department of Electrical Engineering and Computer Science, University of California, Berkeley; IEEE 2001.

O'Malley, E. et al.: "A programmable digital pulse width modulator providing versatile pulse patterns and supporting switching frequencies beyond 15 mhz" Applied Power Electronics Conference and Exposition, 2004. APEC '04. Nineteenth Annual IEEE Anahiem, CA, USA Feb. 22-26, 2004 Piscataway, NJ, USA, IEEE, vol. 1,Feb. 22, 2004, pp. 53-59, XP010703999 ISBN: 0-7803-8269-2.

Gu-Yeon Wei, Mark Horowitz: "A Low Power Switching Power Supply for Self-Clocked Systems" International Symposium on Low Power Electronics and Design Archive Proceedings of the 1996 International Symposium on Low Power Electronics and Design, Monterey, California, United States, 1996, pp. 313-317, XP008067382.

* cited by examiner

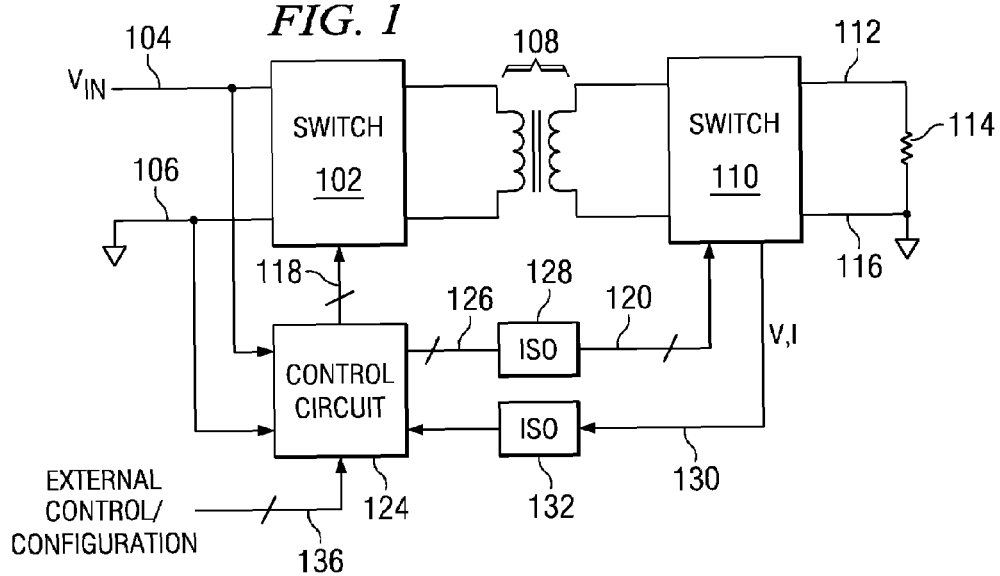
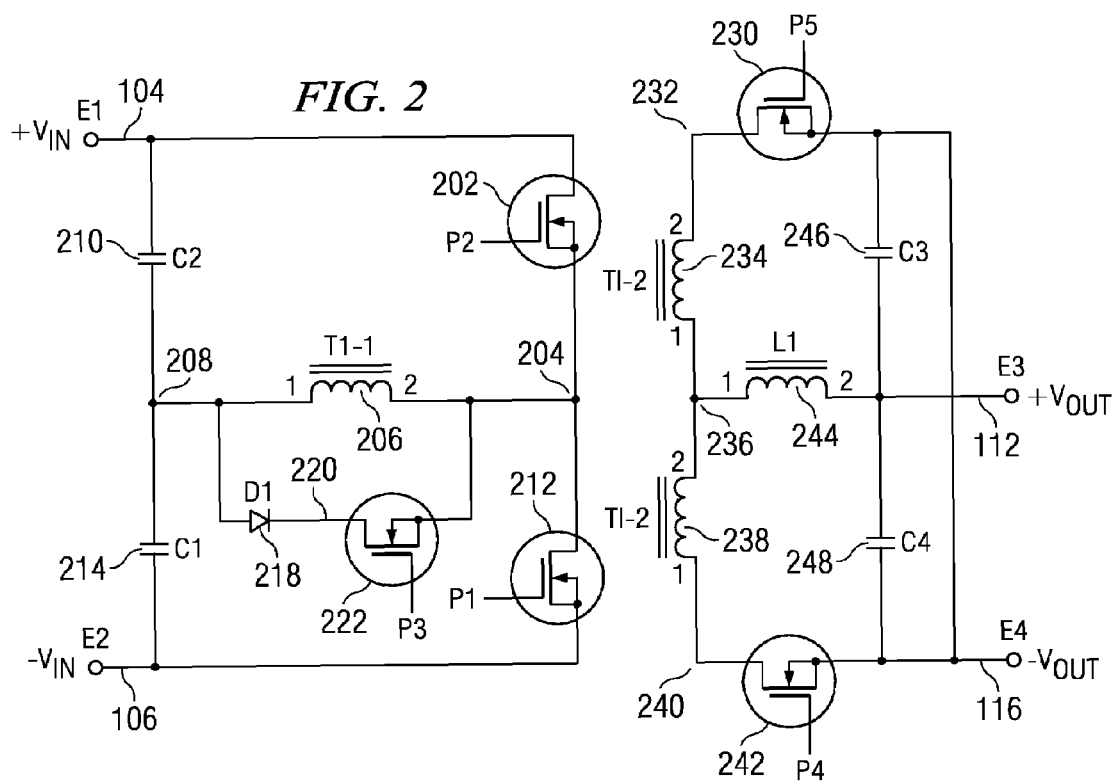

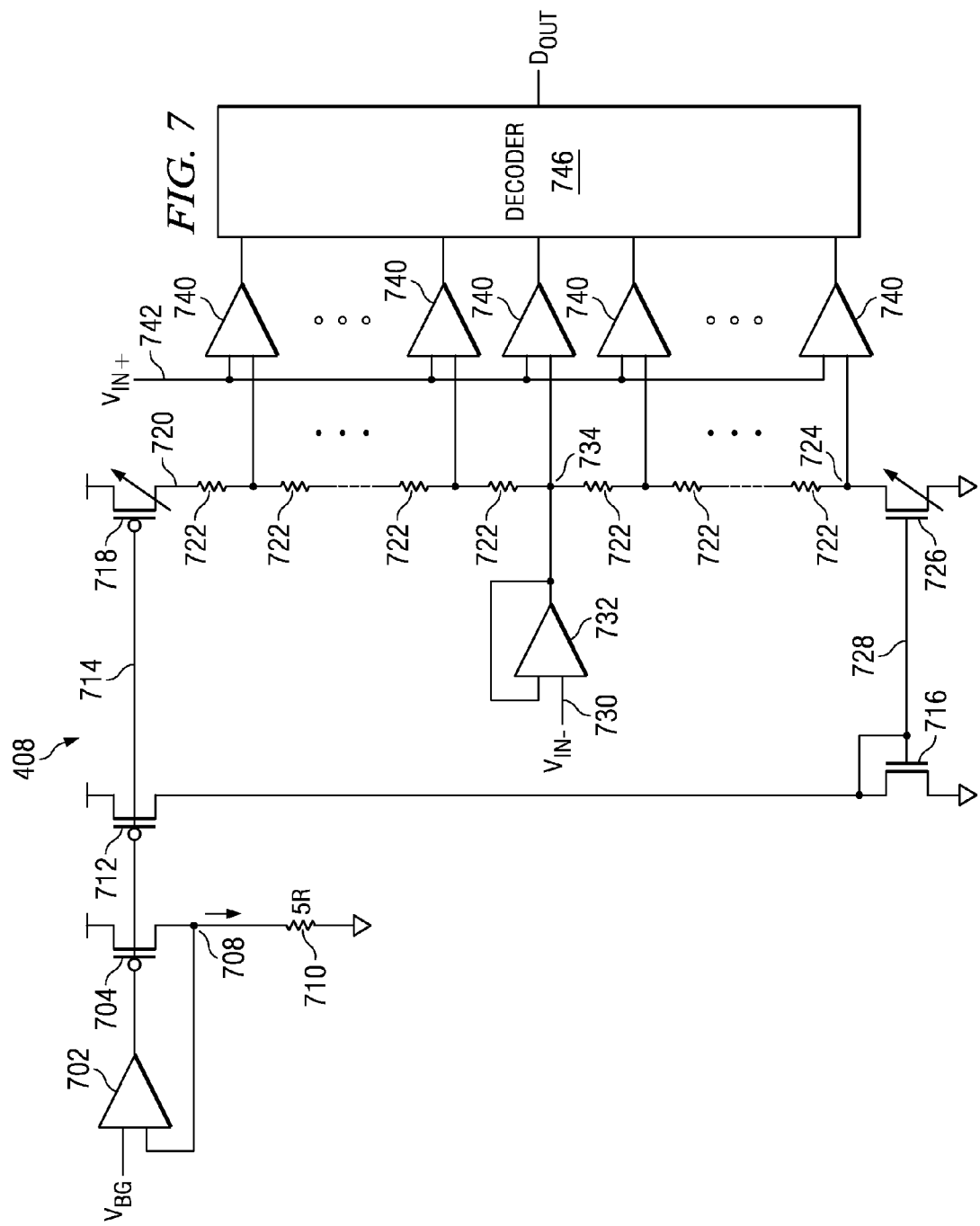

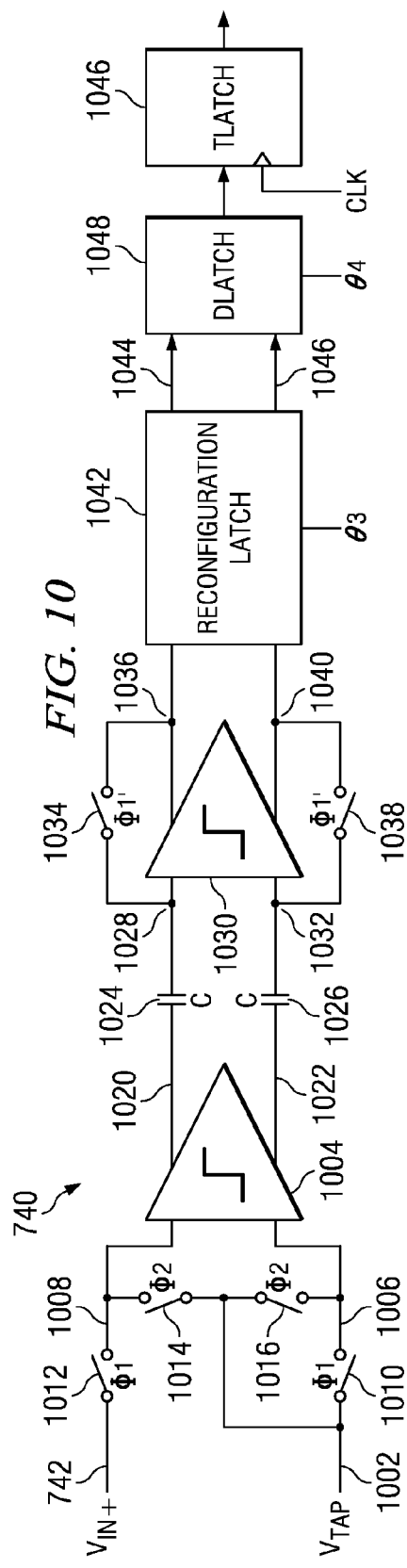
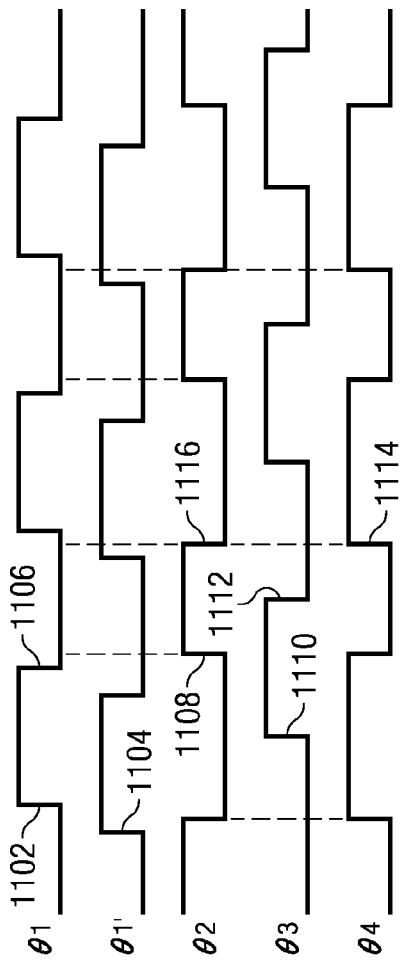
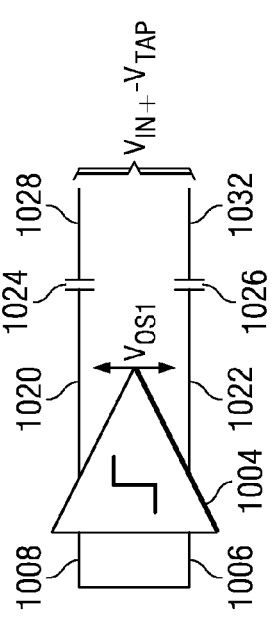
FIG. 10
FIG. 11
FIG. 10a

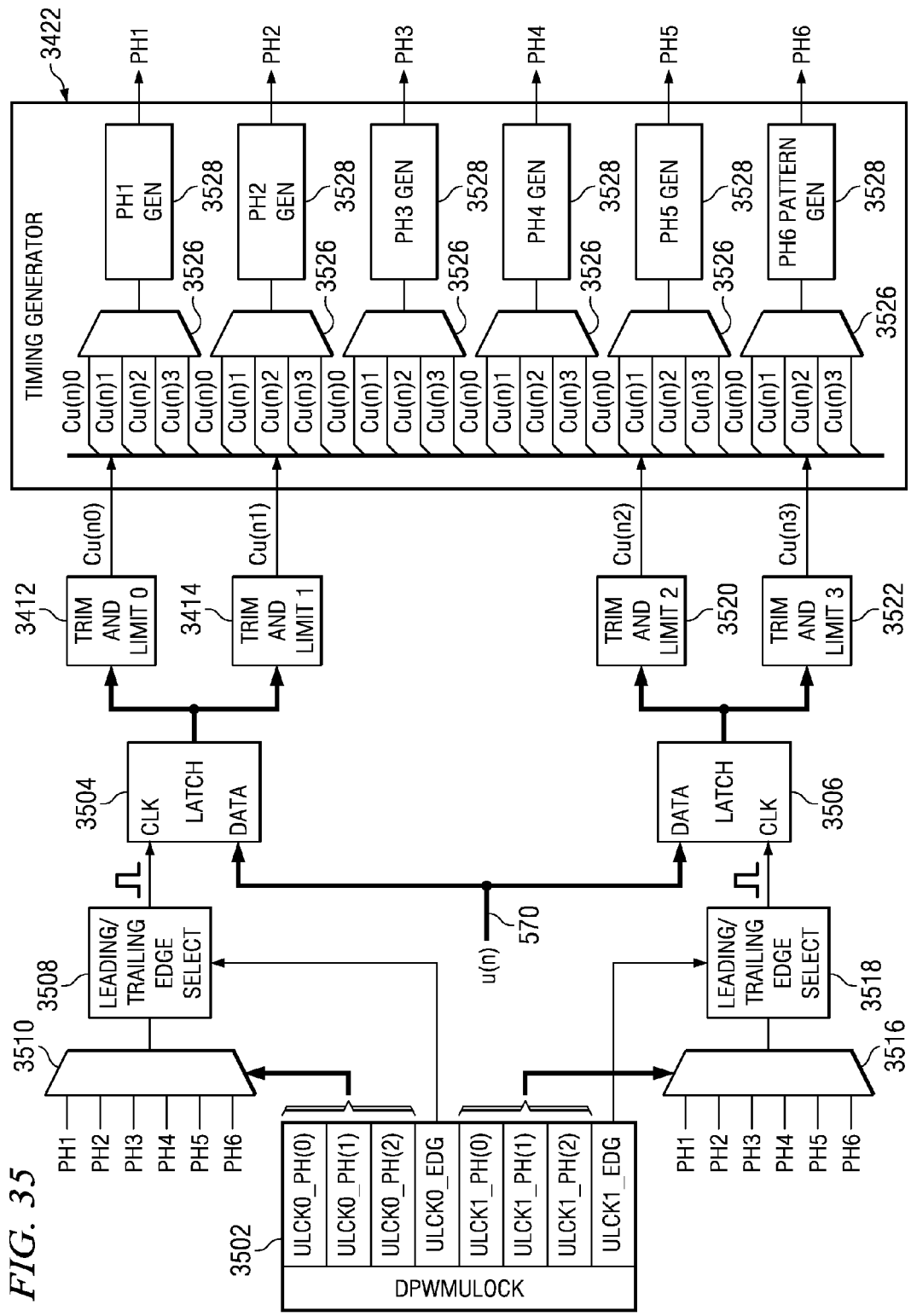

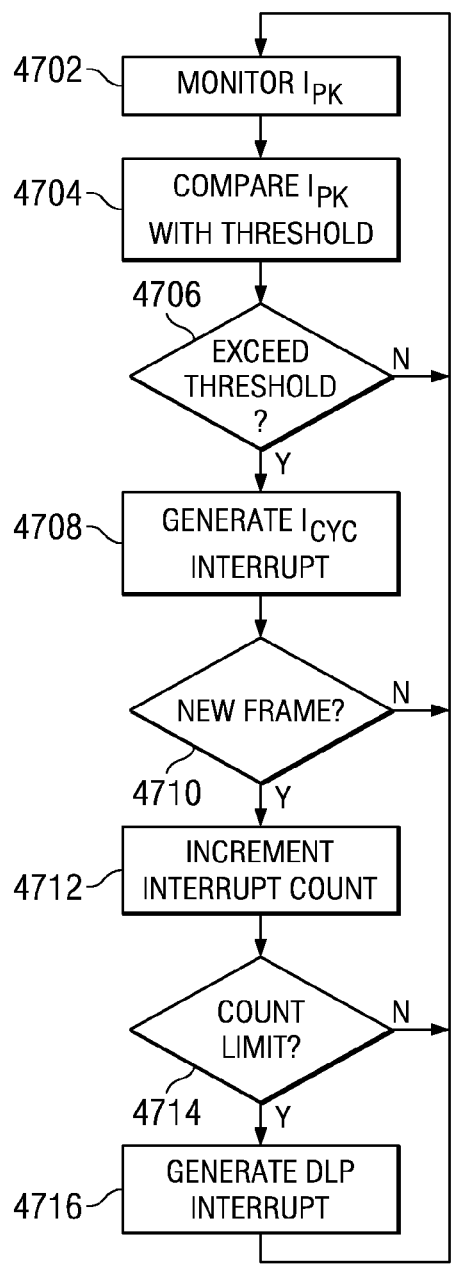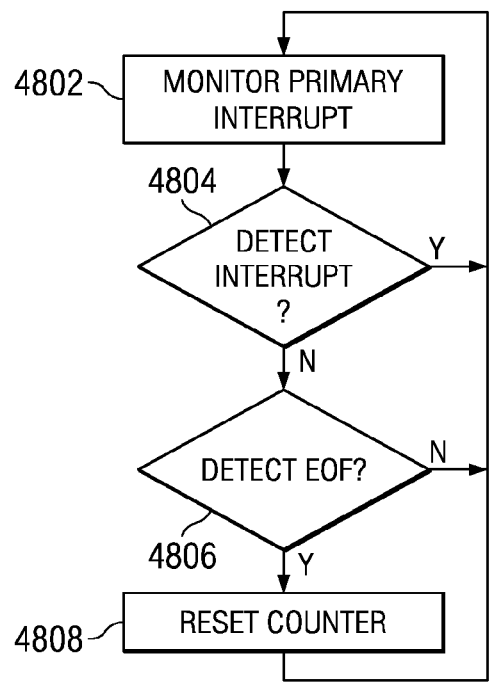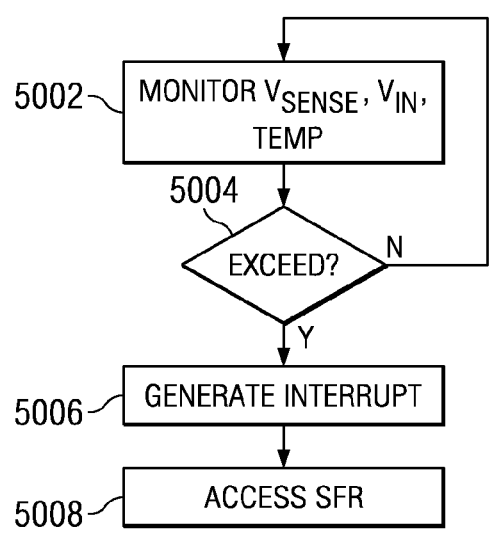

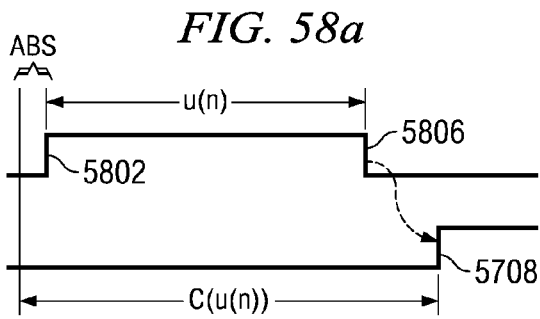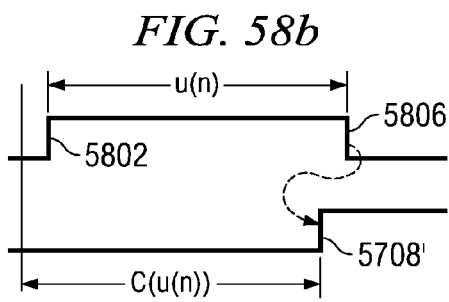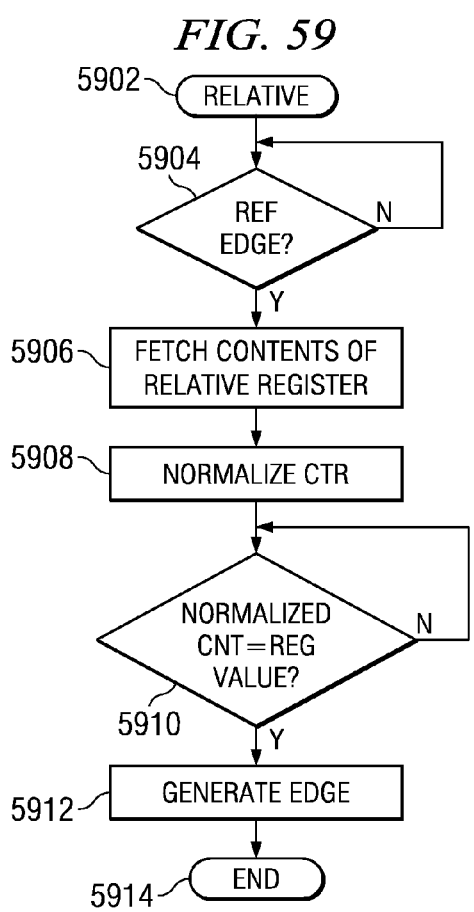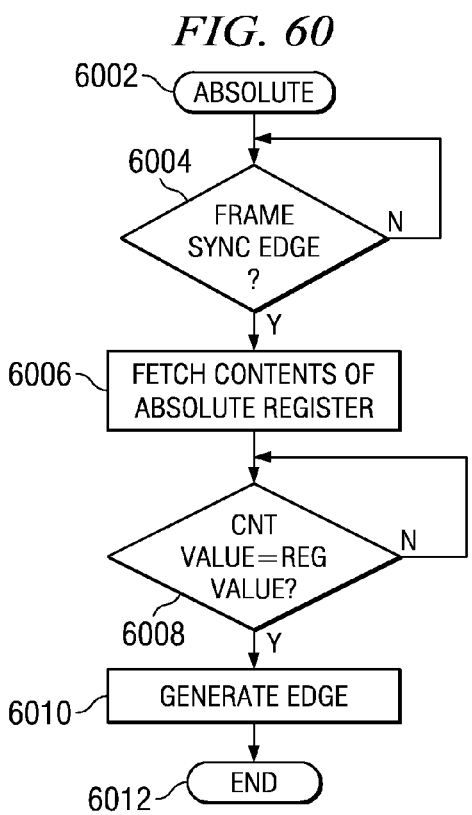

US 7,502,240 B2

DISTRIBUTED POWER SUPPLY SYSTEM WITH SEPARATE SYNC CONTROL FOR CONTROLLING REMOTE DIGITAL DC/DC CONVERTERS

CROSS-REFERENCE TO RELATED APPLICATIONS

This application is a Continuation-in-part application of U.S. Ser. No. 11/172,358, filed Jun. 30, 2005, entitled "FINITE STATE MACHINE DIGITAL PULSE WIDTH MODULATOR FOR A DIGITALLY CONTROLLED POWER SUPPLY", which is a Continuation-in-part application of U.S. Ser. No. 11/096,597, filed on Mar. 31, 2005, entitled "DIGITAL PWM CONTROLLER" and it is related to U.S. patent application Ser. No. 11/096,598, filed Mar. 31, 2005, and entitled "PID BASED CONTROLLER FOR DC-DC CONVERTER WITH POST-PROCESSING FILTERS" and U.S. patent application Ser. No. 11/096,853, filed Mar. 31, 2005, and entitled "DIGITAL POWER SUPPLY CONTROLLER WITH VOLTAGE POSITIONING", both of which are incorporated herein by reference in their entirety and claims priority in Provisional Application No. 60/591,463, filed Jul. 27, 2004, which is incorporated herein by reference in its entirety.

TECHNICAL FIELD OF THE INVENTION

The present invention pertains in general to DC-DC power converters and, more particularly, to a system for controlling a plurality of DC-DC power converters.

BACKGROUND OF THE INVENTION

DC-DC power converters are utilized in situations where one DC voltage at a higher level must be converted to a lower voltage DC level. In certain situations, the current required by the peripheral unit such a micro-processor, can be very high, whereas the voltage can be very low on the order of less than 3.0 Volts and even as low as 1.7 Volts. If this conversion is facilitated at a power supply and then connected to a remote microprocessor on a printed circuit board, the size of the conductor to handle the current and the associated I²R power loss would be large. Thus, it is more desirable to route a higher DC voltage level around the printed circuit board and then do the conversion at the load itself. These type of DC-DC converters are referred to as "Point of Load" (POL) devices.

When a plurality of these type of POL DC-DC converters are disposed within a system, it is desirable to provide control thereof. This typically is facilitated with some type of communication bus, such as serial communication bus, that interfaces with a master computer with each of the POLs having associated therewith some type of controller with memory for storing configuration information. Thus, commands can be sent down to the various POLs to configure the operation thereof, such as the DC operating voltage, and other parameters thereof. In addition, it is also necessary that the systems be synchronized together. Each of the POLs utilize the DC-DC converter that requires some type of switching operation in association with magnetics. The switching control signals are typically developed by some type of pulse width modulated (PWM) and it is desirable to maintain the switching frequencies in a synchronized state.

SUMMARY OF THE INVENTION

The present invention disclosed and claimed herein comprises, in one aspect thereof, a distibuted power system for delivering DC power to a plurality of loads. A plurality of switching DC/DC converter modules are provided, each disposed proximate an associated one of the loads, each of the switching DC/DC converter modules having associated therewith a switching pulse generator for generating switching pulses. A distributed power line distributes input power to each of the modules and a data communication line distributes command data between the modules, each of the modules uniquely addressable over the data communication line. A timing communication line is also provided for distributing timing information to each of the switching pulse generators. a master controller generates commands and communicates them to the data modules over the data communication line, the master controller operable to generate timing information over the timing communication line to each of the modules for controlling the associated switching pulse generator.

BRIEF DESCRIPTION OF THE DRAWINGS

For a more complete understanding of the present invention and the advantages thereof, reference is now made to the following description taken in conjunction with the accompanying Drawings in which:

FIG. 1 illustrates an overall block diagram of a switching power supply;

FIG. 2 illustrates a schematic diagram of the switching portion of a half-bridge power supply;

FIG. 7 illustrates an overall block diagram of the Flash ADC;

FIGS. 10 and 10a illustrate a block diagram of a comparator string;

FIG. 11 illustrates a timing diagram for the operation of the compare operation;

FIG. 35 illustrates a more detailed diagrammatic view of the DPWM;

FIG. 47 is a flow diagram illustrating the generation of primary and secondary interrupts by the over current protection circuitry;

FIG. 48 is a flow diagram illustrating the operation of the reset circuitry of the over current protection circuitry;

FIG. 50 is a flow diagram illustrating the method for providing over voltage and over temperature protections;

FIGS. 58a and 58b illustrate the generation of a relative edge associated with dead time between two edges;

FIG. 59 illustrates a flow chart depicting the operation of the generating a relative edge;

FIG. 60 illustrates a flow chart depicting the operation of generating an absolute edge;

DETAILED DESCRIPTION OF THE INVENTION

Figure 1A:
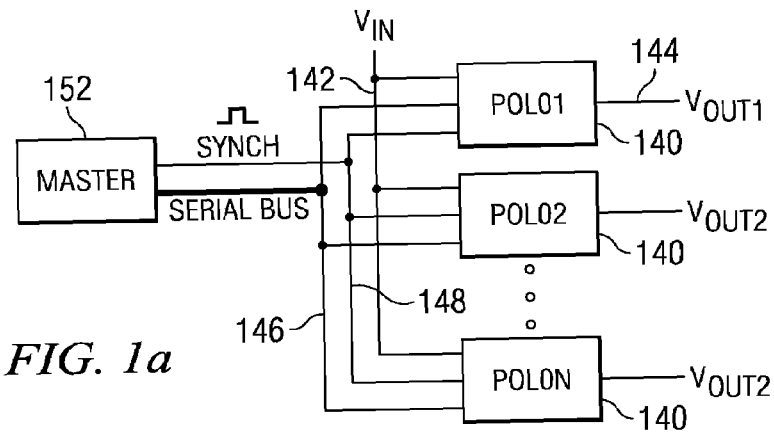
FIGS. 1a and 1b illustrate diagrammatic views of two embodiments for operating the switching power supply in a network environment.

Referring now to FIG. 1, there is illustrated a top level schematic diagram for the switching power supply of the present embodiment, which in this Fig. is illustrated as a half bridge power supply. The main portion of the power supply comprises a primary switch group 102 that is operable to receive an input voltage on a node 104, this being a DC voltage, and ground on a node 106. The primary switch group 102 is coupled through an isolation transformer 108 to a secondary switch group 110. The secondary switch group 110 is operable to drive an output voltage node 112 that is connected to one terminal of a load 114, the secondary switch group 110 also having a ground connection on a node 116, the load 114 disposed between the node 112 and the node 116. The two switch groups 102 and 110 are operable to operate in conjunction with various pulse inputs on a control bus 118 associated with the primary switch group 102 and with various pulse inputs on a control bus 126 associated with the secondary switch group 110.

A digital control circuit 124 is provided which is operable to control the operation of the primary switch group 102 and the secondary switch group 110. The nodes 104 and 106 are provided as inputs to the digital control circuit 124 for sensing the voltage and current on the primary, the digital control circuit 124 generating the information on the bus 118 for control of the primary switch group 102. The control circuit 124 must be isolated from the secondary switch group 110. This is facilitated by driving a bus 126 through an isolation circuit 128, such as an opto-isolator, to drive the bus 120. Similarly, the control circuit 124 is operable to sense the voltage and current levels on the output node 112 through sense lines 130 which are also connected through an isolation circuit 132 to the digital control circuit 124. The digital control circuit 124 is also interfaced to a bus 136 to receive external control/configuration information. This can be facilitated with a serial data bus such as an SMB serial data bus.

Referring now to FIG. 1a, there is illustrated a diagrammatic view of a system comprised of a network of switching power supplies. Each of the switching power supplies is disposed in a network such that the switching power supplies can be disposed remote from each other and proximate to an associated load. These are referred to as "Point of Load" (POL) DC-DC converters. Each of these is referred to by a reference numeral 140, there being illustrated a first POL, POLO1, a second POL, POL02, upwards to and entering an Nth POL, POLON. Each of the POLs 140 is operable to receive an input DC voltage on a distributed DC voltage line 142 and provide an output voltage on an output line 144. Each of the POLs 140 can provide a different output voltage and operate in a different manner from the other ones. However, each of the POLs 140 receives the same input DC voltage which is distributed in the system to each of the POLs 140.

Each of the POLs 140, as described hereinabove, has associated therewith some type of external control/configuration input. There are two inputs provided in this network. The first is a serial communication bus 146, which is a type of SMBus, for example. This is a particular type of 2-wire communication bus that requires a ground, a data line and a clock line. This is a conventional serial data bus. This is based on the conventional I²C serial data bus. Further, there can be overlying software protocols disposed thereon to allow for different command structures. However, any type of command structure can be utilized, as long as the particular POL 140 is configured to interface with such a command structure. In addition to the serial data bus 146, there is also provided a SYNC line 148. This SYNC signal is utilized for the purpose of synching up the operation of the POLs wherein the switches 102 and 110 operate in a synchronous mode such that the edges thereof can be aligned.

A master system 152 is provided, which is basically a master central processing unit that is operable to communicate with the various POLs 140 through the serial bus to download configuration information and command information thereto. In the operating mode, this configuration information is comprised of operating parameters that provide various set points and the such to the POLs. For example, one set point would be a desired operating voltage such that a set point for the output voltage would be provided to which regulation is effected. Another operating parameter could be a turn on delay which requires the particular POL to turn on a predetermined time after an enable signal is sent. Other commands that could be sent are such things as enable commands for enabling various functions such as the operation of the SYNC command. As will be described hereinbelow, there are various Special Function Registers (SFRs) which can be written to, which control the way the POL 140 operates. However, each POL is initially configured with various software downloads to define how the particular POL will operate. For example, a different type of buck converters could be realized with the POL 140 and the control circuit 124 contained therein. By changing the software program provided thereto, the POL 140 can operate in many different configurations. Further, there can be a command set that is downloaded to the POL such that, for example, it is able to communicate via an SMBus protocol. However, this could also facilitate communications via a UART serial bus. The command set could be any type of command set associated with a control language. As noted hereinabove, the SMBus is a command protocol disposed based on an I²C physical layer. There are other command structures that are even more robust that can be implemented in software to overlie the physical I²C physical layer. This must be loaded initially into each POL such that the master 152 can communication therewith.

Figure 1B:
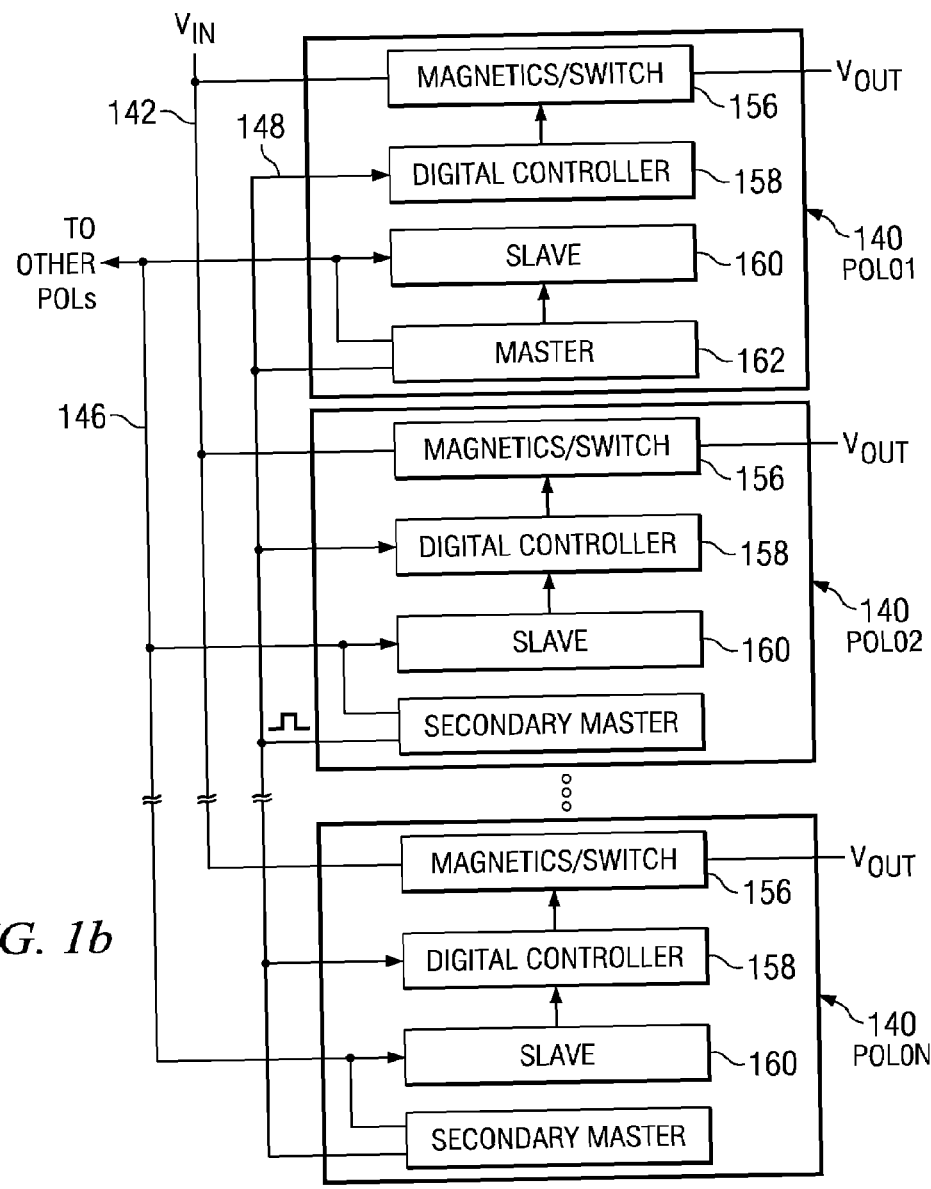

Referring now to FIG. 1b, there is illustrated an alternate embodiment illustrates in the incorporation of the master into the POL 140. In this configuration, each of the POLs 140 have associated therewith the various magnetics and switches represented by a block 156, which are controlled with a digital controller 158, this being a portion of the control circuit 124. The digital controller 158, as will be described hereinbelow, provides a digital control loop a that is free running and provides the control for the overall operation of the POL. All that is required is that various parameterization be performed on that digital controller 158. A processor is associated with the control circuit, which can be divided up into multiple functions. In the present system, each processor operates as a slave portion 160, this primarily for the purpose of monitoring the operation of the digital controller 158 and the overall POL, receiving parameters for the configuration and operation thereof and downloading these parameters to the digital controllers 158 and for effecting communications through the serial bus 146. However, one of the POLs has the processor contained therein configured to further operate as the master, this represented by a master block 162. Basically, the master and the slave in this particular POL both operate in the same processor. However, the master is a program that is operable to communicate with the external world and also communicate with each of the slaves on all of the POLs to control the overall system. Therefore, this is a distributed power system wherein the overall control of the system can be effected at each one of the POLs 140 or at a select one thereof. Further, although not shown, each POL could have the program for the master disposed therein such that the program and all parameters associated therewith would be mirrored to the secondary masters 162'. Each POL can be given a priority such that, if the primary master fails, a secondary master 162' can take over in the prioritized manner. This provides some redundancy to the operation of the system. All that is required is that each of the secondary masters 162', when not operating, poll the primary master 162 and, if for some reason there is no response from the primary master 162, then a secondary master 162' can be placed into. operation. Again, this is just a program that runs on the processor associated with each POL.

In an initial operation, each POL 140 is configured to provide the identity or nature of the POL through a programming port into the control circuit 124. At this point, each POL is given its particular address on the serial bus, the serial bus is configured for the appropriate operation, such as the SMBus, and the software is downloaded for the command structure and for the overall operation of the POL. Once this is configured, then the POL 140 is placed into the system. At this point, one of the POLs, typically that with the lowest address, will have the master program enabled such that it will be the master for the overall system. The operation of this distributed control system will be described in more detail hereinbelow.

When the POL 140 that is configured as the master operates, it will generate a SYNC signal on the line 148 for the other POLs and also, it will generate the SYNC signal for the slave portion thereof. As will be described hereinbelow, it is necessary for the master to first enable the SYNC mode and, thereafter, send out the SYNC signal. To enable the SYNC mode, the master 162 must first send a command to all of the slaves 160 to enable that mode. However, when the master resides in the same POL 140, it is only necessary to write a particular bit into the appropriate SFR register to enable that mode.

Referring now to FIG. 2, there is illustrated a detailed schematic diagram of the primary switch group 102, isolation transformer 108 and secondary switch group 110. The node 104 is connected to one side of the source-drain path of a power switching transistor 202, the other side thereof connected to a node 204. Node 204 is connected to one side of the primary of isolation transformer 108, a primary 206. The other side of primary 206 is connected to a node 208. Node 208 is coupled to node 104 through a capacitor 210. Node 106 is coupled to one side of the source-drain path of a switching transistor 212, the other side thereof connected to node 204. Node 208 is coupled through a capacitor 214 to node 106. A diode 218 has the anode thereof connected to node 208 and the cathode thereof connected to a node 220, node 220 connected to one side of the source-drain path of a switching transistor 222, the other side thereof connected to node 204.

Switching transistor 212 is controlled by a switching pulse P1, the gate of switching transistor 202 controlled by a switching pulse P2 and the gate of switching transistor 222 controlled by switching pulse P3. Switching pulses P1, P2 and P3 all form part of the bus 118.

The secondary switch group 110 is comprised of a switching transistor 230 having the source-drain path thereof connected between the node 116 and a node 232, the gate thereof controlled by a switching pulse P5. Node 232 is connected to one side of a winding 234 which forms part of the secondary of the isolation transformer 108. The other side of winding 234 is connected to a center tap node 236, node 236 connected to one side of a winding 238, the other side thereof connected to a node 240. Winding 238 and winding 234 form the secondary of transformer 108.

Node 240 is connected to one side of the source-drain path of a switching transistor 242, the other side thereof connected to node 116 and the gate thereof connected to a switching pulse P4. An inductor 244 is connected between node 236 and the output node 112. The output node 112 is coupled to the ground node 116 through a capacitor 246 which is connected proximate to the other side of the source-drain path of transistor 230 and coupled through a capacitor 248 to node 116 proximate to the other side of the source-drain path of switching transistor 242.

Figure 3:
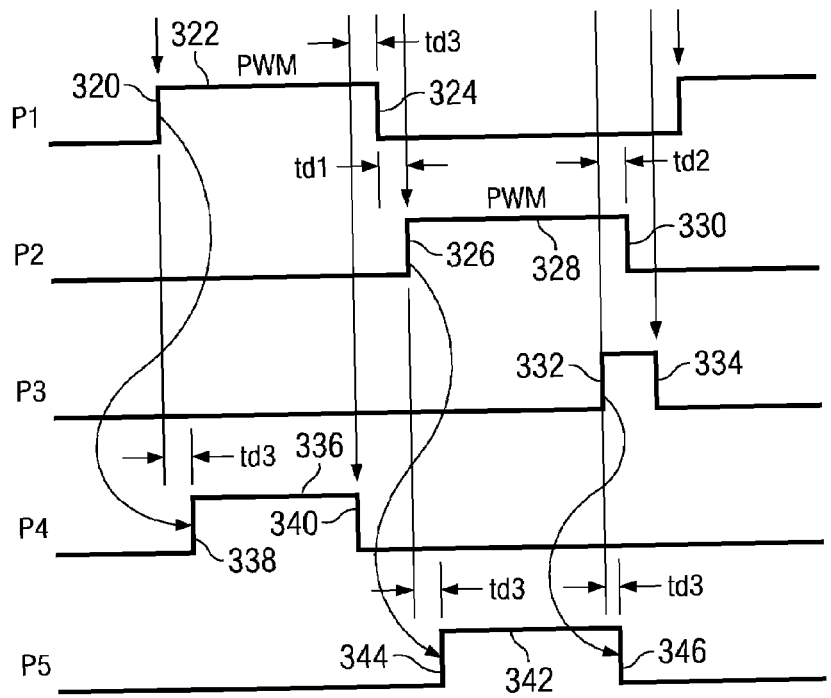
FIG. 3 illustrates the timing diagram for the control pulses to the switching power supply.

Referring now to FIG. 3, there is illustrated a timing diagram for generating the switching pulses to operate the switch of FIG. 2. The switching pulse P1 is a pulse-width modulated switching pulse having a rising edge 320. The rising edge 320 changes the level to a high level 322 which then returns to the low level at a falling edge 324. The switching pulse P2 is delayed from the falling edge 324 by a delay $t_{d1}$. The rising edge 326 changes the level of switching pulse P2 to a high level 328 followed by a change back to a low level having a falling edge 330. The switching pulse P3 goes from a low level to a high level ahead of the falling edge of P2 by delay time $t_{d2}$. The switching pulse P3 returns to the low level at a falling edge 336.

In the output switch, the switching pulse P4 goes from a low level to a high level 336 at a rising edge 338. The rising edge 338 is delayed from the rising edge 320 by a delay $t_{d3}$. The switching pulse P4 returns to a low level ahead of the falling edge of P1 by delay time $t_{d3}$. The switching pulse P5 goes from a low level to a high level 342 at a rising edge 344 which is delayed from edge 326 of switching pulse P2 by a delay $t_{d3}$. Switching pulse P5 returns to a low level ahead of the rising edge of P3 by delay $t_{d3}$.

It can be seen that the switches 202 and 212 in FIG. 2 are controlled by switching pulses P1 and P2. The delay $t_{d1}$ is the duration of time required for transistor 212 to go from a conducting state to a non-conducting state and prior to transistor 202 going to a conducting state. The delay $t_{d1}$ is a delay that is required in order to ensure that the switches are completely off such that connecting the node 204 to the ground node 106 does not cause current to flow through transistor 202. This could result in a "shoot-through" current spike. Depending upon the circuit components and operating frequency, it may be necessary to vary this delay. Similarly, transistor 222 will be turned on prior to turning off switch 202 with the delay $t_{d2}$ allowing the diode 218 to be placed in parallel with the primary 206 prior to turning off transistor 202. Similarly, on the output switch, it is necessary that transistor 242 is maintained in a non-conducting state until transistor 212 is fully turned on and node 204 is sufficiently grounded. Further, it is necessary that the falling edge 346 be delayed until the transistor 222 has fully turned on, which requires the delay $t_{d3}$. This timing is conventional and, depending upon the application, the various delays will be adjusted, these adjustments due to the size of the load, circuit characteristics and operating frequency.

Digital Controller—Overall

Figure 4:
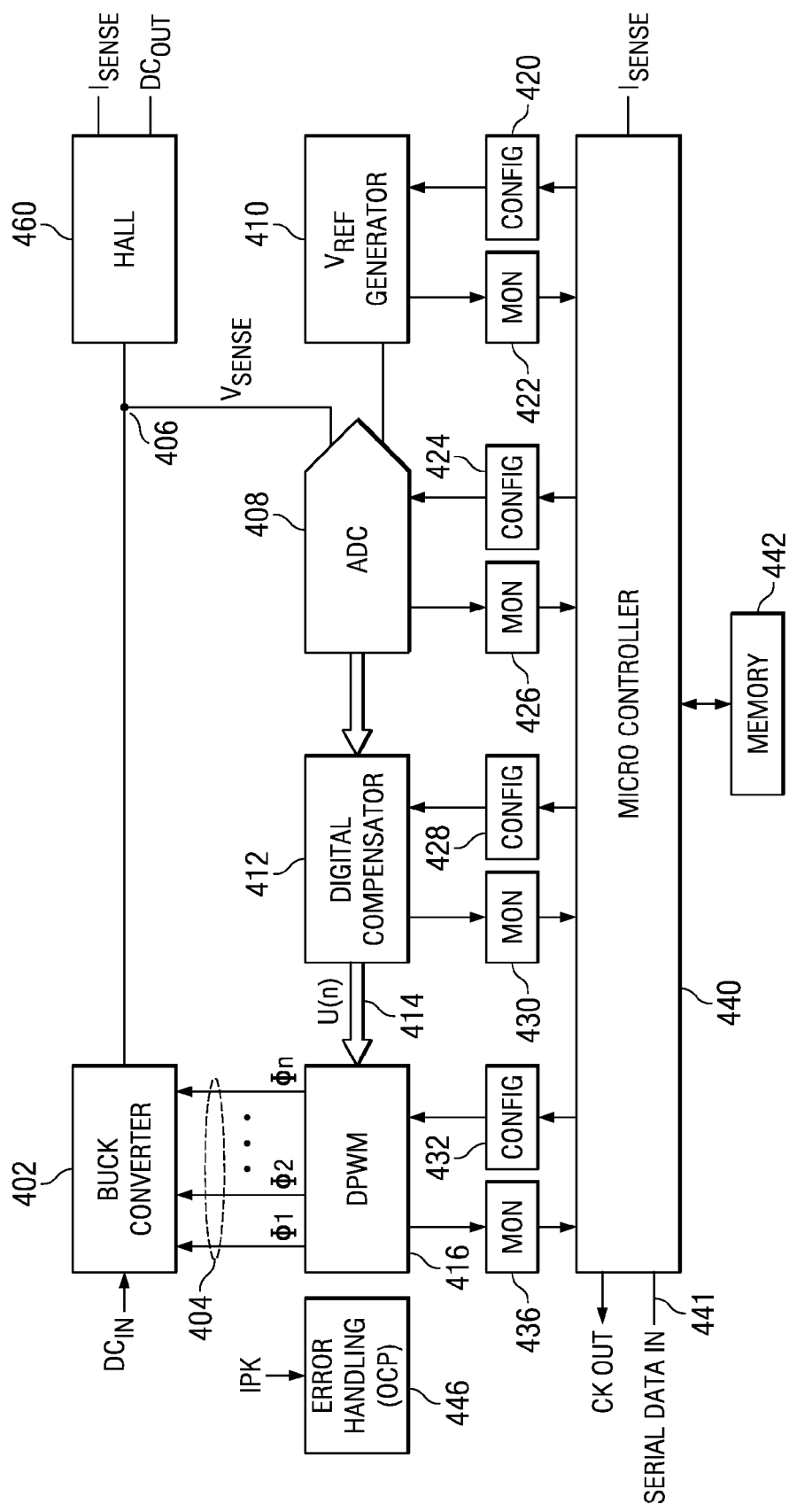
FIG. 4 illustrates a diagrammatic view of the digital controller utilized in conjunction with a buck converter.

Referring now to FIG. 4, there is illustrated a block diagram of the digital controller 124 of FIG. 1. As described hereinabove, the switching converter is generally realized with a half bridge converter, but a simpler buck converter 402 is illustrated in this figure. This requires a plurality of phases 404 for controlling the switches internal to the buck converter 402. This will allow a DC input voltage to be converted to a DC output voltage on output 406. The digital controller senses the output voltage on the output 406 as a sense voltage, $V_{SENSE}$, and inputs this to one input of a differential analog-to-digital converter (ADC) 408. The other input of the ADC 408 is connected to an analog or reference voltage generated by a $V_{REF}$ generator 410 that, as will be described hereinbelow, comprises a digital-to-analog converter (DAC).

The output of the ADC 408 is a digital output that represents the difference between the analog output voltage on the DC output 406 and the "set point" generated by $V_{REF}$ generator 410. The output of the $V_{REF}$ generator 410 is typically the desired output voltage. As such, the operation of the control loop at regulation will typically result in a "0" output from the ADC 408. As will be described hereinbelow, this is the "0" code for the ADC 408. This is input to a digital compensator 412, which is operable to provide some phase lead in the loop. The buck converter 402 is comprised of a combination of a series inductor and shunt capacitor that forms an LC network, which provides a phase lag of 180°. The control loop will typically be provided by a negative feedback loop and will result in an additional negative phase shift of 180°. If the loop were allowed to operate in this manner, this would result in a 0° total phase change which would be an unstable loop. As such, the digital compensator 412 provides some phase lead to stabilize the loop. The output of digital compensator 412 provides the digital control value u(n) on a digital output bus 414 for input to a digital pulse width modulator (DPWM) 416. This provides the various clock signals which provide the switching phases 404 to the buck converter 402 (or to a half bridge converter described herein above).

The ADC 408, digital compensator 412 and DPWM 416 are realized in hardware such that they provide relatively fast digital response and, once operating, operate in a fixed manner. However, each of the ADC 408, digital compensator 412, DPWM 416 and $V_{REF}$ generator 410 are operable to be configured and have the operation thereof monitored. The $V_{REF}$ generator 410 has a configuration block 420 associated therewith for configuring the operation thereof such that the voltage of the $V_{REF}$ generator 410 can be controlled. Additionally, a monitoring circuit 422 is provided for monitoring the operation thereof. Similarly, the ADC 408 has a configuration block 424 for configuring the operation thereof and a monitoring block 426 for monitoring the operation thereof. The digital compensator 412 has a configuration block 428 for configuring the operation thereof and a monitoring block 430 for monitoring the operation thereof. The DPWM 416 has a configuration block 432 for configuring the operation thereof and a monitoring block 436 for monitoring the operation thereof.

As will be described hereinbelow, the ADC 408 is a parallel data converter that is configured with a Flash ADC topology. The digital compensator 412 is configured with a proportional-integral-derivative (PID) compensator with post processing filtering and DPWM 416 is realized with a state machine. The PID compensator is a discrete compensation network that is operable to apply a discrete time PID control law to the signal. The operation of each of these blocks is controlled through the associated configuration and monitoring blocks with a microcontroller 440. The microcontroller 440 is an instruction based engine that operates on instructions that can be downloaded to Flash memory 442, which is non-volatile memory. A serial data input 441 allows instructions to be input to the microcontroller 440 for storage in the memory 442 and for various debug and control operations. Additionally, error handling is provided by a block 446 that basically provides for over current protection and over voltage protection to prevent damage to the buck converter 402 under certain conditions, as will be described in more detail hereinbelow.

By providing a digital controller that, when operating and configured, operates independent of the programmable microcontroller 440, the functionality of the digital controller is embedded primarily within the circuitry of the primary block involving the ADC block 408, the digital compensator block 412 and the DPWM block 416. The microcontroller 440 basically is the "housekeeper" for the digital controller which is operable to monitor the operation thereof. When the digital controller is operating at voltage regulation and once configured, very few actions need to be taken by the microcontroller 440. However, when the digital controller is originally configured, depending upon the environment, the type of switching converter utilized, etc., the digital controller will be configured by the microcontroller 440 for a specific application. Even for the given application, there are certain transients that occur, such as when the converter is powered up, when short circuits occur, when transient loads are applied, etc. and, thus, certain parameters of the various blocks need to be varied to accommodate such during the operation of the DC-DC converter. By providing an instruction based engine such as the microcontroller 440 in a monitoring mode and configuration mode, the operation of the digital controller can be monitored and then the parameters thereof changed temporarily, if necessary, to account for this change. To implement the entire digital controller in an instruction-based engine such as a DSP would require a large amount of programming operations. By providing a hardware based digital controller as the primary block, the functionality has been embedded within the hardware by the chip designer. The DSP solution, on the other hand, typically utilizes a general purpose DSP and the value or functionality of the digital controller is facilitated through programming, which can be complex and typically is utilized only for very high-end digital controllers. Further, the implementation of the primary digital control in hardware provides for a more efficient design that utilizes the circuitry and is more power efficient, which is important in low power DC-DC converters, without sacrificing the benefits of digital control.

Figure 5:
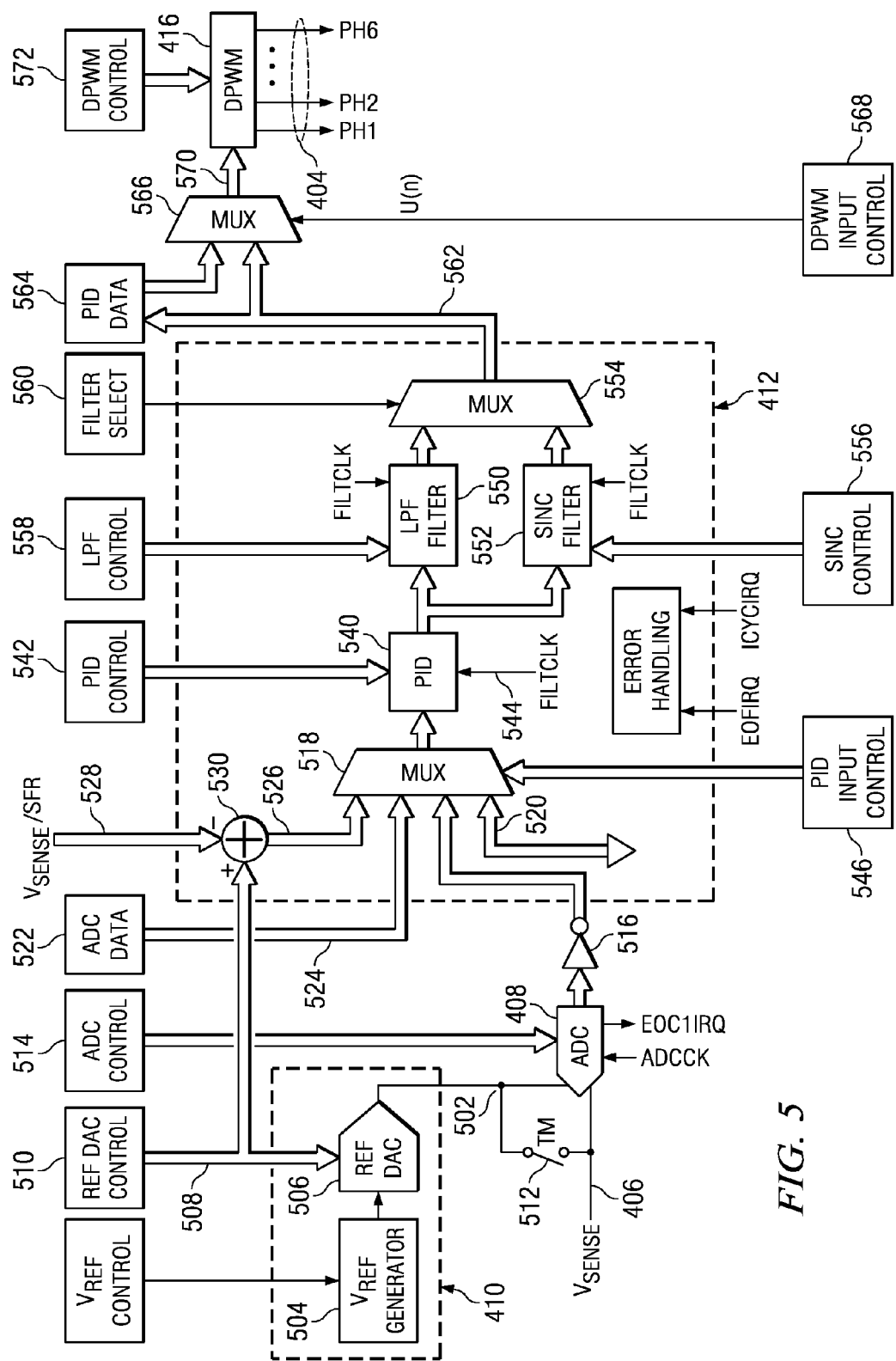
FIG. 5 illustrates a more detailed view of the digital controller.

Referring now to FIG. 5, there is illustrated a more detailed block diagram of the digital controller. The ADC 408 is a differential Flash ADC that is operable to determine as a digital value the difference between the voltage on the DC output node 406, that being the $V_{SENSE}$ voltage, and a reference voltage on a node 502. This analog reference voltage on node 502 is generated by the $V_{REF}$ generator 410. This is comprised of an analog reference voltage generator 504 which is operable to generate a fixed analog reference voltage based on an internal reference such as a bandgap generator. The bandgap generator is a conventional circuit that is utilized to generate temperature and process stable voltages. This is not shown in the illustration of FIG. 5. The $V_{REF}$ generator 504 will generate this reference voltage and provide it as a reference input to a conventional reference digital-to-analog converter 506 (reference DAC). This is a scaling DAC that is operable to receive a digital word on a bus 508 from a reference DAC control block 510 that is controlled by the microcontroller 440. This is basically a register that can be written to for the purpose of generating the reference DAC voltage. The reference DAC 506 is operable to convert this digital value on bus 508 to an analog voltage on node 502 for input to one of the differential inputs of the ADC 408. Typically, the voltage generated by $V_{REF}$ generator 504 is a 1.25 V analog voltage. The output of the reference DAC 506 comprises the desired voltage of the DC-DC converter. In one embodiment, this is approximately 1.0 V, a conventional processor voltage. The reference voltage on node 502 is compared with the $V_{SENSE}$ voltage on node 406 and, when regulated, this should essentially be zero. In the test mode of operation, there is provided a switch 512 which is operable to short the two inputs together. This will be described hereinbelow.

The ADC 408, as will be described hereinbelow, is a parallel ADC of the Flash type. It is a window ADC that is operable to generate a zero voltage output when the differential input is "0." An ADC control block 514 is operable to provide a control input to the ADC 408. The control block 514 provides a variable LSB input to the ADC 408 for use with some of various features thereof. The ADC operates on an ADC CK clock signal and also generates an end of conversion cycle interrupt, EOC1 IRQ. This provides an indication of when a data conversion operation is complete on a given sample and digital data associated with the analog sample is ready to be output. The data is output through an inverter circuit 516 for input to one input of a 4-input digital multiplexer 518, which is part of the input interface to the digital compensator 412.

The digital compensator 412, in addition to receiving the output of the ADC 408 through the inverter 516, is also operable to receive a ground input on a digital input bus 520, ADC data from a register 522 through a bus 524 for digitally generated ADC data, primarily for test purposes, and also a "raw" data input on a bus 526. In one mode of operation, primarily associated with start-up and the such, the sensed voltage, $V_{SENSE}$, is determined by another ADC, which is described hereinbelow, which is a SAR ADC. This is a slower ADC and the output thereof is stored in a special function register, $V_{SENSE/SFR}$, the output of which is provided on a bus 528. The difference between the digital representation of the $V_{SENSE}$ voltage and the actual input to reference DAC 506 on the bus 508 is determined by a digital subtraction block 530, the output of which comprises the bus 526. Therefore, a single-ended SAR can be utilized to bypass the ADC 408 and determine a value for input to the digital compensator 412 during start-up and the such, this providing the differential operation in the digital domain. However, during regulation, the ADC 408 is the preferred input data converter.

The output of the multiplexer 518 is input to a PID controller block, which provides a proportional, integral, derivative (PID) control algorithm. One difficulty associated with designing a controller arises from the LC resonance of a buck converter. An open-loop frequency-response analysis exhibits a resonant peak at the cutoff frequency of the LC filter. A sharp peak, quantified by the quality factor (Q), is desirable for efficient power conversion for lossless power conversion. For a simple integral control, this resonant peak must be kept below unity gain in the open-loop frequency response to ensure stability. Such a controller configuration has a low loop bandwidth and leads to slow transit response characteristic. This PID block 540 provides the requisite loop stability without sacrificing bandwidth and improves the loop's transient response. The proportional and derivative control blocks, as will be described hereinbelow, introduce compensation zeros that push unity-gain beyond the resonant peak and eliminates the bandwidth limitation otherwise imposed by the resonant nature of the buck converter. There is provided a PID control block 542 that controls the operation of the PID 540 by providing, as will be set forth hereinbelow, gain constants for the operation thereof. The operation is clocked with a filter clock, FILTCLK, on a clock input 544. The input to the PID 540 is determined by the output of multiplexer 518, which is controlled by a PID input control block 546. The clock rate is around 10 MHz, wherein the switching frequency of the power supply is around 500 kHz The analog corollary to the digital controller has one inherent benefit in that the overall operation of the analog controller has an inherent low pass filter function associated therewith. The PID 540, on the other hand, has an amplitude and phase response that increases with increasing frequency such that the gain thereof becomes relatively high at higher frequencies and the phase also increases in an ever increasing phase leading manner. To accommodate the frequency response of the PID, post processing filtering is required. This is facilitated in the present embodiment with either a low pass filter, represented by an LPF filter block 550 or a sinc filter block 552. The output of the PID 540 is input to both of these blocks 550 and 552 and the outputs thereof selected with a two-input digital multiplexer 554. The sinc filter operation 552 provides for a plurality of "notches" which are controlled by a sinc control block 556, the sinc filter block 552 clocked by the FILTCLK clock signal. The LPF filter block 550 also utilizes variable poles and zeros that are set by an LPF control block 558. The LPF filter block 550 is also clocked by the filter clock, FILTCLK. The output of multiplexer 554 provides the output from the digital compensator 412, the output selected by the multiplexer 554 controlled by a filter select block 560.

The output of the multiplexer 554 from the digital compensator 412 is provided on a digital data bus 562. This is input to a PID data register 564 for the purpose of monitoring the operation thereof, such that the output of the digital compensator block 412 can be monitored. The output of the multiplexer 554 is also input to the input of a two-input digital multiplexer 566, the other input thereof receiving data from the PID data block 564, such that the operation of the compensator 412 can be bypassed. The multiplexer 566 is controlled by a DPWM input control block 568. The output of the multiplexer 566 provides the u(n) error signal, which is output on a bus 570 to the DPWM 416. The DPWM 416, as set forth hereinabove, is a state machine and is controlled by a DPWM control block 572. The DPWM block, as will be described hereinbelow, is operable to receive various control signals from the DPWM control block 572 from the microcontroller 442 and is also operable to generate a plurality of interrupts (not shown) and receive various interrupts. For example, at the end of a given frame, there will be an EOFIRQ interrupt generated, and the DPWM 416 will also receive various interrupts from the error handling block 446 to indicate either over current situations or over voltage situations.

Figure 6C:
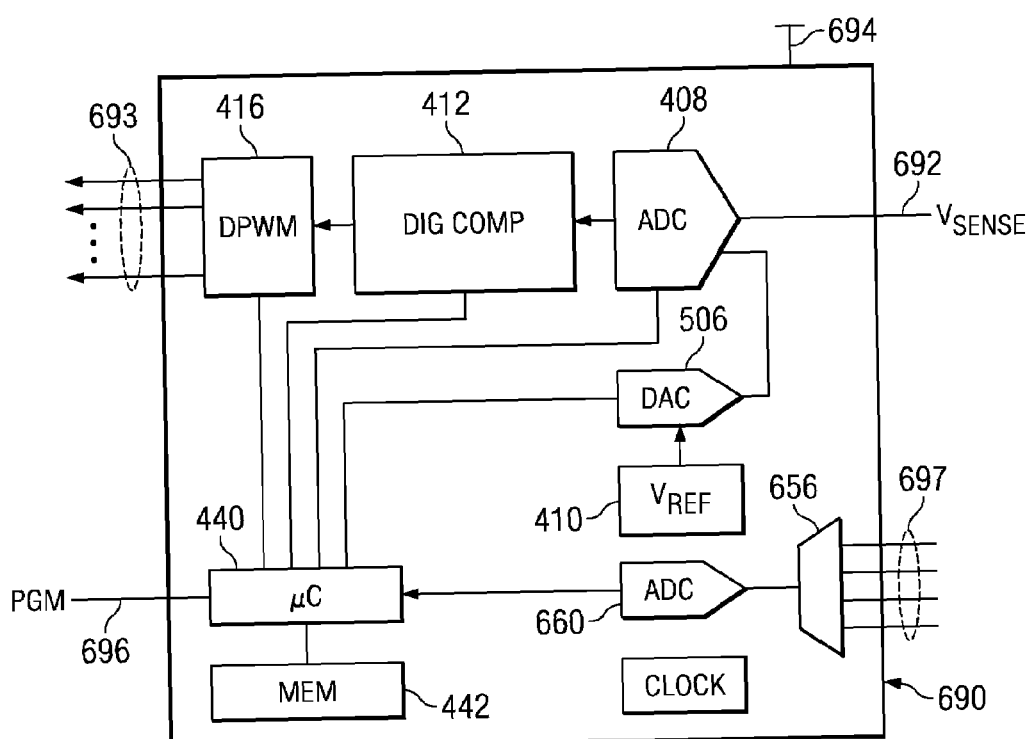
FIG. 6c illustrates a diagrammatic view of a monolithic solution utilizing the embodiments of FIGS. 4, 5, 6a and 6b.
Figure 6A:
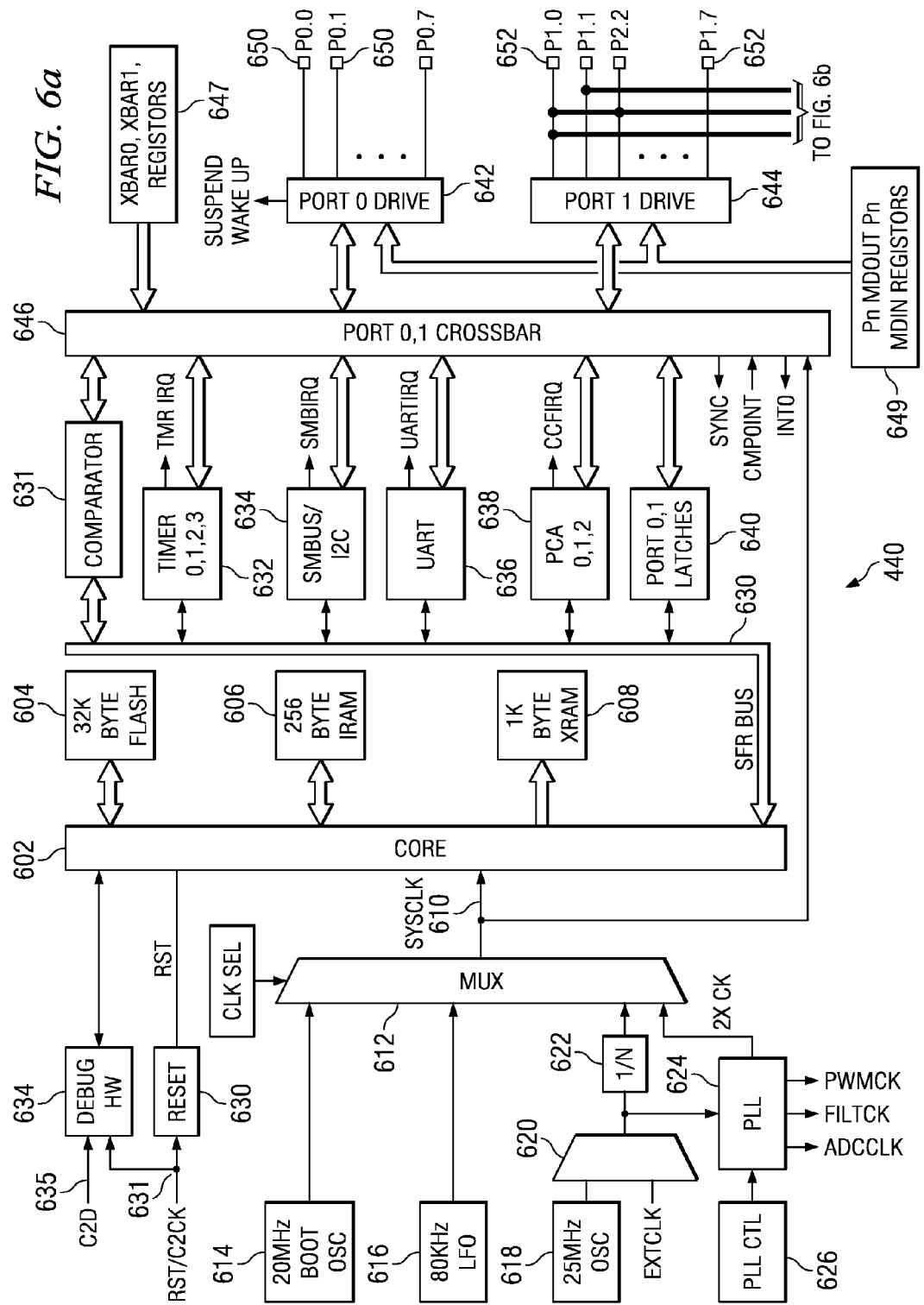
FIGS. 6a-6b illustrates a block diagram of the microcontroller portion of the digital controller.
Figure 6B:
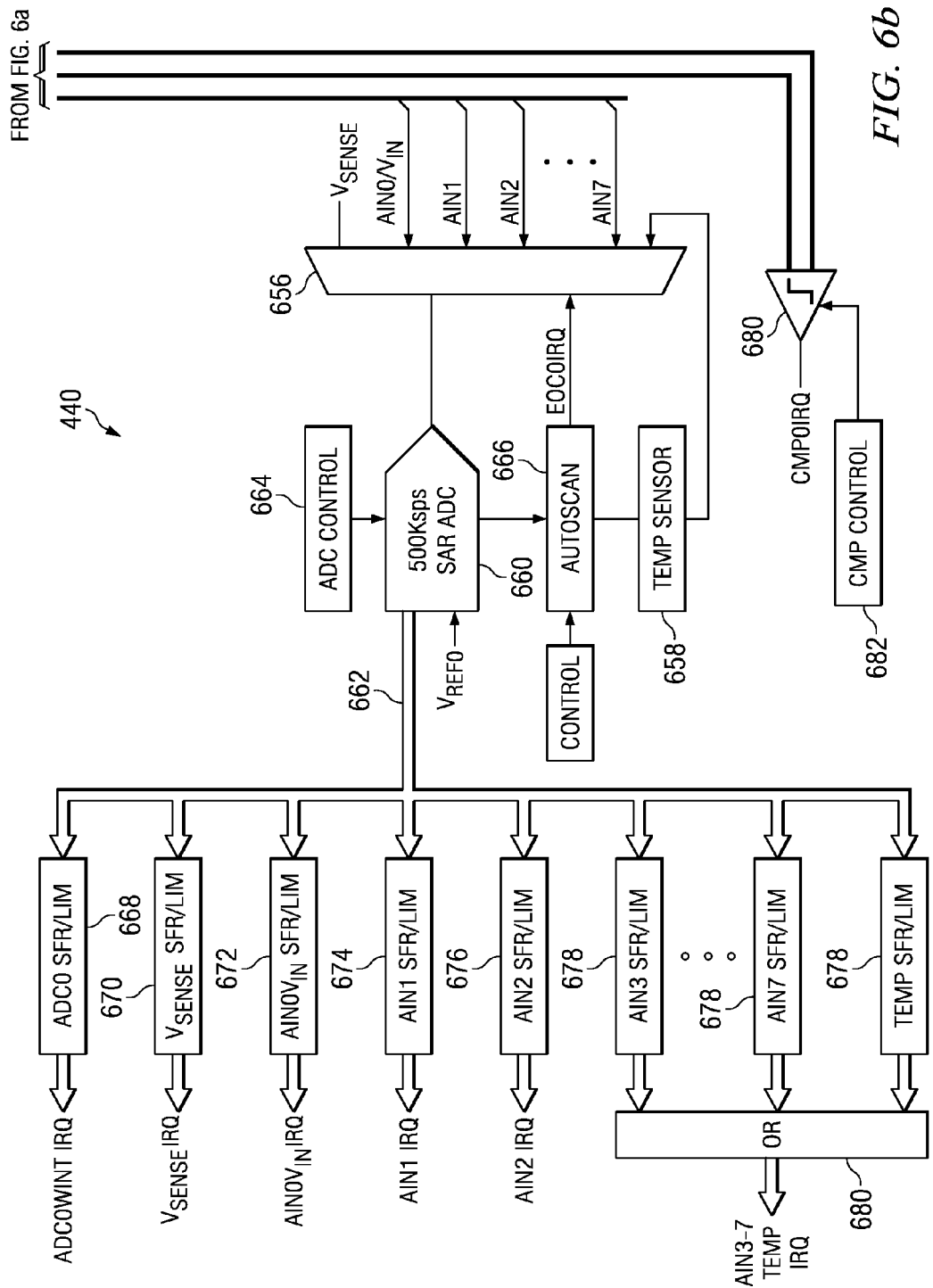

Referring now to FIGS. 6a and 6b, there is illustrated a detailed block diagram of the microcontroller 440. This microcontroller 440 is an 8051 instruction-based engine which is substantially disclosed in U.S. Patent Application Ser. No. 10/244,344, filed on Sep. 16, 2002 and entitled "Precision Oscillator for an Asynchronous Transmission System," which is incorporated herein in its entirety by reference for all purposes whatsoever. At the center of the microcontroller 440 is a processing core 602 which is an 8051 microprocessor engine. This is an instruction-based engine. There is provided a 32K byte Flash memory block 604, 256 byte IRAM block 606 and a 1K byte XRAM block 608, providing memory for the processing core 602. Clock signals are provided to the core 602 in the form of a system clock, SYSCLK, on a clock line 610. This is provided on the output of a multiplexer 612. The multiplexer is operable to receive the input thereof from a 20 MHz boot oscillator block 614, an input from an 80 kHz low frequency oscillator block 616 to provide an 80 kHz clock for use in a sleep mode, or a higher frequency clock in the form of a divided down 25 MHz oscillator 618. The 25 MHz oscillator is the primary oscillator at the operating frequency of the core 602, as the core 602 operates at high frequency or at low frequency. However, at low frequency, the processing of instructions occurs at a much slower rate and this mode is typically used in a sleep mode. In the normal operating mode, typically the higher frequency clock oscillator is utilized. This clock is a non-crystal based clock and has an accuracy of approximately 2%. The output of the clock 618 is input through a two-input multiplexer 620 to the multiplexer 612, the output of multiplexer 620 passed through a divide block 622 in order to divide the frequency of the clock, if necessary. Additionally, an external clock is input to the other input of multiplexer 620, such that either the internally generated 25 MHz clock can be utilized or an external clock can be utilized. A phase lock loop 624 is provided which is controlled by a PLL control block 626 and this utilizes the 25 MHz clock 618 as a reference and then multiplies this clock up to as high as 400 kHz. This provides an output to one end of the multiplexer 612 for selection as the SYSCLK. This PLL 624 is operable to generate the other clocks associated with the operation of a digital controller, the clock for the DPWM 416, PWMCK, the filter clock, FILTCLK, and the ADC clock, ADCCLK. This will be described hereinbelow.

The core 602 is also operable to receive a Reset signal on a block 630, which is operable to generate a reset when it is not in a debug operating mode. In a debug operating mode, the Reset input on a node 631 is input to the clock input of a debug hardware block 634 to provide a clock signal thereto, the other input being a serial data input on a line 635. This is a two-wire serial data port that allows for very low clocked data to be input to the core 602 during a debug mode. In the reset mode, the reset block 630 provides the reset signal to the core 602.

The core 602 is interfaced through a special function register (SFR) bus 630 to various I/O blocks. In the embodiment illustrated herein, comparators 631 are provided, in addition to four timers 632. Each of these timers is operable to have the parameters thereof set, and initiated and each of them generates various timer interrupts, TMRXX IRQ, signals. Additionally, there are provided a number of serial bus configurations for allowing for various formats of a serial data interface. One of these is the SM Bus/I2C format, in a block 634. This is a conventional serial data format. Additionally, there is provided a UART functionality in a block 636. There is provided a programmable counter/timer array (PCA) block 638 and a plurality of port latches 640 for interfacing with a port "0" block 642 and a port "1" block 644 for transmitting and receiving data therefrom. All of the blocks 631-640 are interfaced through a crossbar matrix block 646, which is disclosed in U.S. Pat. No. 6,738,858, issued May 18, 2004, which is incorporated herein by reference. The crossbar matrix is operable to selectively connect any of the outputs of the blocks 631-640 to any of a plurality of output pins associated with the port driver 642 and 644, there being eight pins 650 associated with the port "0" driver 642 and eight pins 652 associated with the port "1" driver. These pins can function as digital outputs, digital inputs or analog inputs. There is also provided a SYNC input that can be connected to any of the port pins in addition to the SYSCLK that can be provided as an output by the crossbar matrix block 646.

The crossbar matrix block 646 is controlled by two registers, the XBAR0 and XBAR1 registers. These are special function registers (SFR). An additional SFR is the Port Output Mode register (PnMDOUT) and Port Input Mode register (PnMDIN) register 649 for controlling the configuration of the port driver 642 and 644. This sets these drivers as digital outputs, digital inputs or even analog input registers.

is a priority crossbar decoder as described in U.S. Pat. No. 6,738,858, already incorporated herein by reference. This decoder assigns a priority to each I/O function associated with the internal resources of the blocks 631-638, in addition to the SYNC signal and the SYSCLK output. These priorities are predetermined and it is only necessary to enable the function to assign it to a pin. For example, the UART 636 is predetermined to operate at the highest priority and, if it is selected, the pins preassociated with the UART 636 will be assigned to the first pins in port "0" or to predetermined pins. The result is that these assigned pins can no longer be used by other resources on the chip. When a digital resource is selected in the register 647, the least significant unassigned port pin is assigned to that resource (excluding the UART, which is preassigned to pins P0.4 and P0.5, for example). These are just predetermined prioritized assignments. If a port pin is already assigned to a higher priority resource, the crossbar skips that pin when assigning the next selected resource. Additionally, the crossbar will skip port pins whose associated bits in the a PnSKIP register (not shown) is set. This is a register that allows the software to skip various port pins that are to be used for analog input (port "1"only), dedicated function or a global port input/output (GPIO). If a port pin is claimed by a peripheral without use of the crossbar, its corresponding PnSKIP bit should be set. This applies to any selected ADC or comparator inputs. The crossbar skips selected pins as if they were already assigned, and moves to the next unassigned pin. As an example, suppose that only the SYNC resource were selected in the XBAR0, XBAR1 register 647. If this was the case, and no pins were to be skipped, then the SYNC input would be assigned to P0.0 (the first pin on port "0") by enabling the SYNC function. The crossbar matrix 646 would automatically assign that port pin to that function just by selecting that function. The system designer would have to know that placing a SYNC pulse onto that pin would be recognized by core 602 as being an SYNC pulse. Selection by the register 647 just indicates to the core 602 that it will look to that particular assigned pin by the crossbar matrix 646 for that input. As noted hereinabove, the XBAR0, XBAR1 registers 647 are used to assign the digital I/O resources to the physical I/O port pins. When the SMBus block 634 is selected, the crossbar assigns both pins associated with the SMBus; when the UART block is selected, the crossbar assigns both pins associated with the UART—a transmit and receive pin. The UART pin assignments are fixed for reloading purposes: with UART transmit pin always assigned to P0.4 and the UART receive pin always assigned to P0.5. Standard port I/Os appear contiguously starting at P0.0 after prioritized functions and skipped pins are assigned.

In order to initialize a port, it is necessary to first select the input node (analog or digital) for all port pins, using the Port Input Mode register (PnMDIN) 649. Then the output mode is selected (open-drain or push-pull) for all port pins, using the Port Ouput Mode register (PnMPOUT) 649. Then, any pins that are to be skipped by the I/O crossbar 646 using the Port Skip register (PnSKIP) (not shown). Then, the port pins are assigned to desired peripherals using the XBARO, XBAR1 register 647. The crossbar is then enabled utilizing the crossbar enable bit (XBARE="1"). The following tables for XBAR0 and XBAR1 illustrate the various functionalities associated therewith. The XBAR0 register is associated with the CP comparator functions, the SYSCLK function, the SMBus, the SYNC enable function and the UART enable function. It is only necessary write a "1" in the associated bit to enable this function. The XBAR1 register is associated with the Weak Pullup disable function, the crossbar enable function, the timer enable functions and the programmable counter (PCA) module enable function. By setting the appropriate bits, the crossbar switch is enabled to select the various resources for interface to the port pins in accordance with the priority decoder function associated therewith, and which was described in U.S. Pat. No. 6,738,858.

| SFR Definition, XBAR0: Port I/O Crossbar Register 0 | | | | | | | | |
|---|---|---|---|---|---|---|---|---|
| R/W | R/W | R/W | R/W | R/W | R/W | R/W | R/W | Reset Value |
| — | — | CP0AE | CP0E | SYSCKE | SMB0E | SYNCE | UART0E | 00000000 |
| Bit 7 | Bit 6 | Bit 5 | Bit 4 | Bit 3 | Bit 2 | Bit 1 | Bit 0 | |

SFR Address: 0xE1
Bits 7-6: Unused
Bit 5: CP0AE: Comparator0 Asynchronous Output Enable
0: Asynchronous CP0 output unavailable on port pin.
1: Asynchronous CP0 Output available on port pin.
Bit 4: CP0E: Comparator0 Synchronous Output Enable
0: Synchronous CP0 output unavailable on port pin.
1: Synchronous CP0 output available on port pin.

Bit 3: SYSCKE:/SYSCLK Output Enable
    0: SYSCLK unavailable at port pin.
    1: SYSCLK available at port pin.
Bit 2: SMB0E: SMBus I/O Enable
    0: SMBus I/O unavailable at Port pins.
    1: SMBus I/O available at Port pins.
Bit 1: SYNCE: DPWM Sync Input Enable
    0: SYNC unavailable at port pins.
    1: SYNC available at port pins.
Bit 0: UART0E: UART I/O Enable
    0: UART unavailable at port pins.
    1: UART available at port pins.

SFR Definition, XBAR1: Port I/O Crossbar Register 1

| R/W | R/W | R/W | R/W | R/W | R/W | R/W | R/W | Reset Value |
|---|---|---|---|---|---|---|---|---|
| WEAKPUD Bit 7 | XBARE Bit 6 | T1E Bit 5 | T0E Bit 4 | ECIE Bit 3 | PCA0ME2 Bit 2 | PCA0ME1 Bit 1 | PCA0ME0 Bit 0 | 00000000 |

SFR Address: 0xE2
Bits 7: WEAKPUD: Port I/O Weak Pullup Disable
    0: Weak Pullups enabled (except for Ports whose I/O are configured as analog input).
    1: Weak pullups disabled
Bit 6: XBARE: Crossbar Enable
    0: Crossbar disabled.
    1: Crossbar enabled.
Bit 3: T1E: Timer1 I/O Enable
    0: T1 unavailable at port pins.
    1: T1 available at port pins.
Bit 2: T0E: Timer1 I/O Enable
    0: T0 unavailable at port pins.
    1: T0 available at port pins.
Bit 1: ECIE: PCA0 External Counter Input Enable
    0: ECI unavailable on port pin.
    1: ECI available on port pin.
Bit 0: PCA0ME[2:0]: PCA Module I/O Enable Bits
    000: All PCA I/O unavailable at Port pins.
    001: CEX0 routed to Port pin.
    010: CEX0, CEX1 routed to Port pins.
    011: CEX0, CEX1, CEX2 routed to Port pins.
    1xx: CEX0, CEX1, CEX2 routed to Port pins.

Port pins that remain unassigned by the crossbar matrix 646 and are that are not used by analog peripherals can be used for general purpose I/O. Ports P "0" and P "1" are accessed through corresponding special function registers that are both byte addressable and bit addressable. When writing to a Port, the value written to the SFR is latched to maintain the data value at each pin. When reading, the logic level of a Port's input pins are returned regardless of the XBARn settings, i.e., even with the pin assigned to another signal by the crossbar, the Port register can always read its corresponding port I/O pin. The exception to this is the execution of the read-modify-write instruction that target a port latch register as the destination. The read-modify-right instructions when operating on a port SFR are the following: ANL, ORL, XRL, JBC, CPL, INC, DEC, DJNZMOV, CLR, or SETB, when the destination is an individual bit in the port SFR. For these instructions, the value of the register (not the pin) is read, modified and written back to the SFR. The following tables indicate the various SFRs that are associated with these functions for Port "0" as an example:

SFR Definition, XBAR1: Port I/O Crossbar Register 1

| R/W | R/W | R/W | R/W | R/W | R/W | R/W | R/W | Reset Value |
|---|---|---|---|---|---|---|---|---|
| WEAKPUD Bit 7 | XBARE Bit 6 | T1E Bit 5 | T0E Bit 4 | ECIE Bit 3 | PCA0ME2 Bit 2 | PCA0ME Bit 1 | PCA0ME0 Bit 0 | 00000000 |

SFR Address: 0xB0
Bits 7-0: High Impedance Overdrive Mode Enable Bits for P0.7-P0.0 (respectively).
    0: Corresponding P0.n pin is configured to Normal Overdrive Mode.
    1: Corresponding P0.n pin is configured to High-Impedance Overdrive Mode

| SFR Definition, XBAR0: Port I/O Crossbar Register 0 | | | | | | | | |
|---|---|---|---|---|---|---|---|---|
| R/W | R/W | R/W | R/W | R/W | R/W | R/W | R/W | Reset Value |
| P0SKIP7 Bit 7 | P0SKIP6 Bit 6 | P0SKIP5 Bit 5 | P0SKIP4 Bit 4 | P0SKIP3 Bit 3 | P0SKIP2 Bit 2 | P0SKIP1 Bit 1 | P0SKIP0 Bit 0 | 00000000 |

SFR Address: 0xE1
Bits 7-0: P0SKIP[7:0]: Port0 Crossbar Skip Enable Bits
These bits select Port pins to be skipped by the Crossbar Decoder. Port pins used as analog inputs (for ADC or Comparator) or used as special functions (VREF input, external oscillator circuit, CNVSTR input) should be skipped by the Crossbar.
0: Corresponding P0.n pin is not skipped by the Crossbar.
1: Corresponding P0.n pin is skipped by the Crossbar.

For analog sensing, all of the eight pins 652 associated with the port "1" driver are connectable to analog inputs of a multiple input analog multiplexer 656 which is operable to receive eight analog inputs, AIN0, AIN1, . . ., AIN7, a $V_{SENSE}$ input and a Temperature input. The input voltage is connected to the AIN0 input for sensing thereof. A separate dedicated pin is provided for the $V_{SENSE}$ input for input to the multiplexer 656. An additional input is provided by an internal temperature sensor 658, which senses the chip temperature, which basically constitutes the environmental temperature, this being an input to the analog multiplexer 656. The output of the analog multiplexer 656 is input to the input of a 12-bit SAR ADC 660, operating at a sampling clock of 500 Ksps. This is a single-ended ADC that provides the digital output on a bus 662. The control for the ADC 660 is provided by the ADC control block 664. The analog multiplexer 656 is controlled by an auto scan block 666, which is operable to scan through all of the inputs in a cyclical manner. At the end of each conversion cycle, there is generated an interrupt EOC0 IRQ indicating the end of the conversion cycle for the ADC 660. This is input to the auto scan block 666 which will then increment the select control on the multiplexer to the next input to initiate a second or subsequent conversion operation. For each scan step, the output of the ADC 660 is "steered" or directed toward an associated special function register (SFR)/limiter (LIM). Each of these SFR/LIM blocks is operable to store the associated output, compare it with an internal fixed upper and/or lower limit, which can be varied upon power-up, and then output an interrupt if it exceeds the limit(s). In the first five SFR/LIMs, there is provided an ADC window interrupt in an SFR/LIM block 668, an SFR/LIM block for the VSENSE output 670, an SFR/LIM block 672 for the AIN0 output, an SFR/LIM block 674 for the AIN1 input, and an SFR/LIM block 676 for the AIN2 input. Each of these blocks 668-676 provide an associated interrupt, ADCOWINTIRQ, VSENSE IRQ, AINOVIN IRQ, AIN1 IRQ, and AIN2 IRQ. Since the core 602 can only handle a certain number of interrupts, the remaining inputs, AIN3-AIN7 and TEMP are associated with respective SFR/LIM blocks 678. The output of each block 678 provides an associated interrupt to an OR gate 681. The output of the OR gate 680 provides an interrupt, which when recognized by the core 602, requires that the core 602 then "poll" the outputs of the SFR/LIM blocks 678, it being recognized that each of the SFR/LIM blocks occupies a unique address in the address space of the core 602, such that the contents thereof can be read, or in certain circumstances, written to. Whenever an interrupt is generated, the core 602 initiates an interrupt sub-routine for servicing that particular interrupt, as is the case with any interrupt generated.

There is also provided a comparator function for generating a comparator interrupt. A comparator block 680 is provided which is operable to have one compare input interface with the even ones of the pin 652 and a second input interface with the odd inputs thereto. This is a four comparator block, which is controlled by a comparator control block 682 and will generate a comparator interrupt whenever any of the respective inputs exceeds the threshold set therein.

Referring now to FIG. 6c, there is illustrated a diagrammatic view of an integrated circuit 690, which is operable to provide all of the functions for the digital control operation in a single integrated circuit. This integrated circuit 690 requires only connections from $V_{SENSE}$ on a pin 692, switching control signals on output pins 693, a power supply input on a power supply pin 694 and a ground connection on a pin 695. With these minimal number of pins, the entire digital control operation can be facilitated. This assumes that a program is provided in the memory 442. If the program is not "hard coded," some type of serial connection on at least one pin 696 is required, but it should be understood that other pins in the system can be multiplexed for use in programming, since programming is facilitated in a nonoperating mode. Further, there are provided a plurality of pins 697 that are operable to receive other sense analog input voltages. However, for the straightforward operation of the digital controller, all that is required is the $V_{SENSE}$ input. The other inputs are required for such things as over voltage protection and over current protection and for detecting the peak current for the purposes of voltage positioning, as will be described hereinbelow.

As set forth hereinabove, the digital control section is a hardware digital control section comprised of the ADC 408, the digital compensation network 412 and the DPWM 416. Once these blocks are parameterized, they will provide the control function associated therewith. The internal reference generator 410 is operable to provide the internal reference, for conversion to an analog signal by the DAC 506. Thus, all the voltage reference information is contained in the integrated circuit 690. The on chip self-contained microcontroller provides the monitoring and control functions such as over current protection, voltage positioning, etc. and, in general, provides all housekeeping functions to monitor the operation of the hardware digital control stream. The self-contained clock and on-board memory provide for the timing functions and the instructions for use by the microcontroller, respectively. Therefore, it can be seen that the system of the present disclosure provides for a single monolithic solution that is low power due to the use of a state machine-driven digital controller without requiring the power overhead of an instruction based system, but still retains the intelligence of an instruction based system in the monitoring and reparameterizing aspect provided by the microcontroller 440.

Flash Adc

Referring now to FIG. 7, there is illustrated a logic diagram of the window ADC 408. A first reference voltage is generated by an on-chip bandgap generator, a voltage $V_{BG}$. The bandgap generator is a conventional circuit that combines a very stable voltage that is stable over temperature. This voltage is input to the voltage follower circuit comprised of an amplifier 702, the output thereof driving the gate of a p-channel transistor 704. The source/drain path of the transistor 704 is connected between $V_{DD}$ and a node 708. Node 708 is connected to the other input of amplifier 702, such that the amplifier 702 and transistor 704 provide a source follower configuration. Node 708 is connected to a string 710 of resistors of value "5R." The output of amplifier 702 also drives a current mirror, such that the current through resistor string 710 is mirrored over to the current mirror. The current mirror is comprised of a p-channel transistor 712 and the gate thereof connected to a node 714, node 714 connected to the output of amplifier 702. The source/drain of transistor 712 is connected between $V_{DD}$ and a node 728. Node 728 is connected to one side of the source/drain path of an n-channel transistor 716, the other side thereof connected to ground. The gate and drain transistor 716 are connected together to node 728 to form a diode-connected configuration. Node 714 is also connected to a variable width p-channel transistor 718, the source/drain path thereof connected between $V_{DD}$ and a node 720. Transistor 718, as will be described herein below, is comprised of a plurality of parallel connected binary-weighted transistors, the connection thereof being programmable, such that one or all of the parallel connected transistors can be connected in parallel on a selective basis.

Node 720 is connected on one side thereof to a resistor string comprised of a plurality of resistors 722. There are provided sixty four of these resistors 722 having a total resistive value of "R," each having a voltage disposed there across equal to the voltage of a least significant bit (LSB) of the ADC. This will be described in more detail herein below. The bottom of the resistor string of resistors 722 is connected to a node 724, which is connected on one side thereof to the drain of a variable n-channel transistor 726, the source thereof connected to ground, and the gate thereof connected to the gate of transistor 716 on a node 728. Transistor 726 is substantially identical to transistor 718 and is also programmable to allow selection of the number of transistors connected together, which will be described in more detail herein below.

A voltage input on an input node 730 represents the negative input voltage. This is input to one input of a unity gain amplifier 732, which has the other input thereof connected to the output on a node 734. Node 734 represents the mid-point of the resistor string of resistors 722, such that there are an equal number of resistors above as below. Thus, for the disclosed embodiment of sixty four resistors 722, there will be thirty two resistors above and thirty two resistors below the point 734. The unity gain amplifier 732 provides the drive voltage node 734 and isolates the input voltage on node 730 therefrom.

The current through resistor string 710 is ratiometrically related to the current through transistors 718 and 726 and all of the resistors 722. Thus, the current through resistors 722 is set by the current through resistor string 710, which current is set by the voltage on the input to amplifier 702, voltage $V_{BG}$, such that the current is $V_{BG}/5R$. The only way to vary the current of the resistors 722 is through the ratio of the size of the transistors 718 and 726 to the size of the transistor 704. This will be described in more detail herein below.

Each of resistors 722, at the bottom thereof, is connected to one of sixty four comparators on one input thereof of comparators 740, on one input thereof. (It is noted that the number sixty four defines a "window," but any number of comparators could be utilized to represent the entire Flash ADC window). The other input of each of the comparators 740 is connected to a node 742, which is connected to the positive input voltage $V_{IN+}$. Therefore, the output of each of the respective comparators will be a "0" if the input voltage is below the resistor tap voltage and a "1" if the input voltage is above the associated tap voltage. The outputs of all of the comparators 740 having the reference input connected to resistor taps below the input voltage will have a "1" on the output thereof. This, therefore, represents a thermometer code on the output thereof. This is input to a decoder 746 to decode the thermometer code and provide the digital output therefrom. 100491 The output voltage from decoder 746, $D_{OUT}$, represents the difference voltage between the voltage on node 742 and the voltage on node 730, $V_{IN+}-V_{IN-}$. By comparing the positive input voltage on node 742 to the negative input voltage on node 730, the output voltage, $V_{OUT}$, will have a resolution defined by the voltage across each of the resistors 722, this being the LSB of voltage. This overall circuit provides the circuitry of the Flash ADC, this being a "window" Flash ADC as opposed to an absolute value ADC. When the difference between the voltage on positive input voltage node 742 and negative input voltage node 730 is "0," the comparators 740 below the node 734 will have a "1" on the output thereof and the comparator 740 having the reference input thereof connected to node 734 will have a "0" on the output thereof. This, as will be described herein below, represents the "0" code for the Flash ADC, this being a differential input ADC. As the size of the transistors 718 and 726 is varied, this will vary the current through the resistors 722 and, therefore, vary the size of the LSB. However, the "0" code will not vary. In effect, the negative input voltage on node 730 represents the reference voltage input of the ADC whereas the positive input voltage on node 742 represents the analog input voltage.

Figure 8:
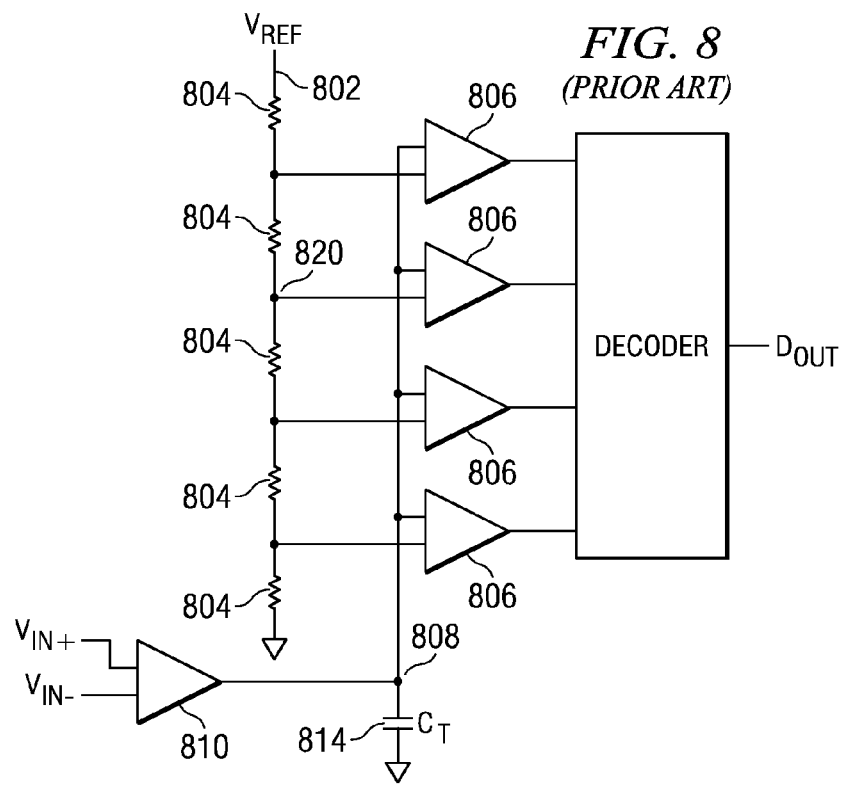
FIG. 8 illustrates a prior art Flash ADC.

To distinguish the current architecture of the Flash ADC with a conventional architecture, the prior art Flash ADC of FIG. 8 will be described. In FIG. 8, a four comparator Flash ADC is described. A reference voltage is defined that is variable, this being for the purpose of varying the size of the LSBs. This reference voltage is provided on a node 802 at the top of a resistor ladder comprised of a plurality of tapped resistors 804. At each of the taps, there is an output provided to the reference input of an associated comparator 806. The other input on each of the comparators 806 is connected to an input node 808. For a single ended input, the reference voltage on node 802 will typically be connected to the supply voltage and resistor 804 adjusted such that the full rail-to-rail voltage could be provided. In this example, this would only provide a resolution of ¼ of the supply voltage. Typically, a very large number of comparators 806 will be provided associated with a large number of resistors. For a 16-bit Flash ADC, this would require $2^{16}$ comparators and a corresponding number of resistors. This results in a significant power consumption for each of the comparators. However, for a differential input signal, it is only necessary to resolve the difference between a positive and negative input signal over a defined range. Thus, a smaller reference voltage can be utilized which is divided by a predetermined number of resistors in the corresponding comparator 806. In a prior art embodiment, the differential input voltage is determined by a differential amplifier 810 receiving the positive and negative input voltage and outputting a differential voltage on node 808. This differential voltage is then input to the input of each of the comparators 806. Of course, in order to utilize the full range, the output of the amplifier 810 must be centered around some common node voltage which is equal to $V_{REF}/2$. In one alternate embodiment, the prior art system of FIG. 8 can have the LSB is changed by a factor of, for example, 10X, which will require the common mode voltage, $V_{CM}=V_{ref}/2$, to change by a factor of 10X. Although this will provide a stable zero code, the common mode voltage, $V_{CM}$, of the amplifier 810 should be around $V_{CM}/2$ in order to have a large voltage swing.

It can be seen that, if the LSB size is varied through a variation of the reference voltage, this will cause the reference voltage on the zero-code node to change. If, for example, a node 820 associated with the second from the top comparator 806 on the reference input thereof represents the zero-code wherein the positive input voltage equals the negative input voltage, then, when the positive input voltage equals the negative input voltage, this comparator will have a "0" on the output thereof, comparators above will have a "0" output and comparators below will have a "1" output. As long as the voltage difference is "0," and the reference voltage is not varied, then the zero-code will not change but, if the voltage $V_{REF}$ is changed, the size of the LSB will change and the zero code will also change, since the zero-code is now "coupled" to the value of $V_{REF}$. Therefore, if the LSB is required to be changed, then the tap associated with the resistor string that defines the zero-code may change. This will be described in more detail herein below.

Associated with each of the inputs of the comparator 806, is a distributed capacitance, which distributed capacitance would sum up to a total capacitance of $C_T$, represented by capacitor 814. It can be seen that the amplifier 810 must drive the capacitance 814 during a conversion operation. By reducing the number of comparators in the "window," the value of $C_T$ can be reduced, in addition to the power consumption. However, the amplifier 810 must still drive this input with a capacitance.

Figure 9:
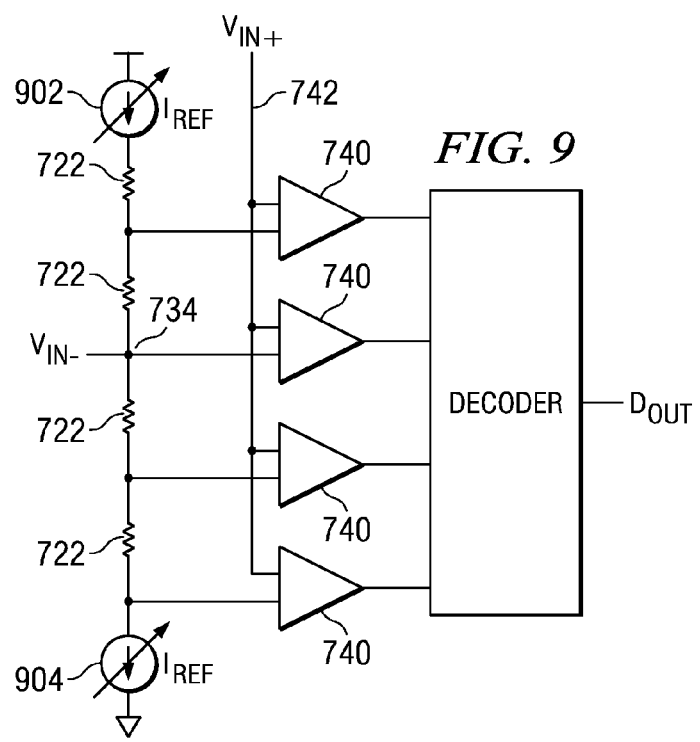
FIG. 9 illustrates a more detailed diagram of the comparator portion of the Flash ADC of the present disclosure.

Referring now to FIG. 9, there is illustrated a simplified diagram of the disclosed ADC of FIG. 7, which is utilized for comparison therewith to the prior art embodiment of FIG. 8. In this embodiment, it can be seen that the resistive string comprised of the resistors 722 are driven by an upper current source 902 from the supply voltage, $V_{DD}$, and the bottom of the resistive string is driven with a lower current source 904. Both of these current sources provide a current $I_{REF}$, which is variable. This variable current source varies the current through the resistors 722 and, therefore, sets the size of the LSB or, more specifically, the resolution of the ADC. The voltage on the node 734 is a negative input voltage and this provides the center reference voltage of the window with the current sources 902 and 904 in conjunction with the current through the resistors, providing the LSB voltage increments increasing toward current source 902 and decreasing toward current source 904. As the voltage on node 734 varies, the voltage across node resistors 722 does not vary, as that voltage is controlled by the current sources 902 and 904. However, if the current value of the current sources 902 and 904 is varied, then the size of the LSB voltage will vary.

As will be described herein below, each of the current sources 902 an 904 are identical and are comprised of four separate parallel connected current sources, each having a binary-weighted current there through, such that a binary word can be input thereto for defining the value thereof. In the disclosed embodiment, there are provided four current sources, a 1x current source, a 2x current source, a 4x current source and an 8x current source, associated with a 4-bit word. This, however, is not meant to be limiting in that any number of current sources could be utilized, and any type of variable method for varying the current source could be utilized.

The output voltage, $V_{OUT}$ is defined in the following equation:

$$D_{OUT}=(V_{IN+}-V_{IN-})G$$

The value of G is related to the inverse of LSB as follows:

$$G = \frac{1}{LSB\ size}$$

The current through the resistor string is a ratiometric current such that it is the current through the resistor string 710 multiplied by a ratio metric factor $\alpha$. Thus, the current through the resistor string of resistors 722 provided by transistors 718 and 726 is:

$$\frac{V_{BG}}{5R}\alpha$$

where:
R is the total value of the sixty four resistors 722 in the ladder; and
$\alpha$ is a scaling or ratiometric factor.

Thus, the LSB is defined as the current through a given resistor and it will be multiplied by the current through the resistor string multiplied by the value of resistor, R, as follows:

$$\left(\frac{V_{BG}}{5R}\alpha\right)\frac{R}{K} = \frac{V_{BG}}{5K}\alpha$$

where:
K is a factor representing the number of resistors 722 in the resistor string, there being sixty four in the disclosed embodiment.

As noted herein above, the ratio metric multiplier is a binary weighted multiplier that, in the disclosed embodiment, utilizes a 4-bit word. This will be defined by the following relationship:

$$LSB = \left(\frac{V_{BG}}{5K}\right)\cdot\left(\frac{2^3\cdot b3 + 2^2\cdot b2 + 2^1\cdot b1 + 2^0\cdot b0}{2}\right)$$

$$\text{where: } \alpha = \left(\frac{2^3\cdot b3 + 2^2\cdot b2 + 2^1\cdot b1 + 2^0\cdot b0}{2}\right)$$

Thus, it can be seen that the value of R is removed from the equation such that temperature and process variations therein do not affect the value of the LSB. All that is necessary is to have a stable voltage, this provided by the bandgap voltage generator.

Referring now to FIGS. 10 and 10*a*, there is illustrated a logic diagram for a comparator bank, each comparator bank representing each of the comparators 740. This comparator string is a differential comparator having a positive input and a negative input. The positive input is connected to the positive input voltage on the node 742 which is connected to the voltage $V_{IN+}$. The other input is connected to a node 1002 which is the tap voltage $V_{TAP}$, this reference input to the comparator. There is provided a first comparator 1004 having a reference voltage input on node 1006 and a primary input on a node 1008. Node 1002 is connected to one side of a switch 1010, the other side thereof connected to node 1006. Similarly, the node 742 is connected through one side of a switch 1012, the other side thereof connected to node 1008. Node 1002 is also connected to one side of two switches 1014 and 1016, the other sides thereof connected to the nodes 1008 and 1006, respectively. Switches 1010 and 1012 are controlled by the clock signal φ1 and the switches 1014 and 1016 are controlled by the clock signal φ2.

The output of comparator 1004 is provided on differential outputs 1020 and 1022. Output 1020 is connected to one side of a sample capacitor 1024 and the node 1022 is connected to one side of a sample capacitor 1026, both having a value of "C." The other side of the capacitor 1024 is connected to a node 1028, which comprises one input of a second comparator 1030. The other side of capacitor 1026 is connected to a node 1032, which is connected to the other input of the comparator 1030, the comparator 1030 being a differential input comparator. Node 1028 is connected to one side of a switch 1034, and the other side thereof is connected to a differential output node 1036 of comparator 1030. Similarly, node 1032 is connected to one side of a switch 1038, the other side thereof connected to a second differential output node 1040 of differential comparator 1030. Nodes 1036 and 1040 are connected to the differential inputs of a reconfigurable latch 1042. Switches 1034 and 1038 are controlled by a clock signal φ1'. The reconfigurable latch 1042 is controlled by a clock signal φ3. The reconfigurable latch 1042 is operable to provide a latched output on differential outputs 1044 and 1046 for input to the dynamic latch 1048, which is controlled by a clock signal φ4. This provides a latched output for input to a T-latch 1046, which is clocked by a clock signal to provide a data output, this being the output of the overall comparator 740.

Referring now to FIG. 11, there are illustrated timing diagrams for the clock signals associated with the embodiment of FIG. 10. The operation of the comparator bank will be described with reference to these clock signals. When φ1 goes high, as denoted by an edge 1102, the switches 1012 and 1010 will close, resulting in the output of the respective voltage on the respective nodes 1020 and 1022. Shortly thereafter, the clock signal φ1' will go high at an edge 1104. This will result in switches 1034 and 1038 closing, thus reducing the gain of the comparator 1030 such that the voltage on nodes 1036 and 1040 is substantially the same. At this time, the switches 1014 and 1016 are open, since the clock φ2 is low at this time. This is the sampling operation. Thereafter, φ1 goes low at an edge 1106 and φ2 goes high at an edge 1108, thus opening switches 742 and 1010 and closing switches. 1014 and 1016. This, in effect, disposes the nodes 1020 and 1022 at the same voltage or substantially the same voltage, thus "boosting" the other side of capacitors 1024 and 1026 to the voltages that were previously on the nodes 1020 and 1022. In general, the voltage on the input to the comparator 1004 on nodes 1008, 1006 comprises the difference voltage $V_{IN+}-V_{TAP}$. The output voltage of the comparator 1004 will have an offset voltage $V_{OSI}$ associated therewith. This offset voltage and difference voltage will be multiplied by the gain of comparator 1004, a gain $A_1$. Therefore, the output voltage on nodes 1020 and 1022 will be $A_1(V_{IN+}-V_{TAP}+V_{OSI})$. When φ2 goes high at 1108, this represents the "hold" operation. Therefore, this represents a sample and hold operation. However, when switches 1014 and 1016 are closed, the voltage across nodes 1020 and 1022 is $V_{OSI}$ and, therefore, the voltage across nodes 1028 and 1032 will now be $(V_{IN+}-V_{TAP})$, such that the offset voltage associated with the comparator 1004 is effectively removed in the hold operation.

It can further be seen that the capacitors 1024 and 1026 are isolated from nodes 742 and 1002. Thus, the analog input voltage that is input on node 742 will not be required to drive a large capacitance. The amplifier 732 isolates the negative input voltage on node 730 from node 734 and from all the subsequent tap voltages. However, the input voltage on node 742 is required to drive the inputs of each of the multiple comparators 740. The sampling operation requires a larger capacitance for the purpose of holding the charge for a predetermined amount of time. Since this larger capacitor is disposed on the opposite side of comparator 1004, it can be seen that the need for driving a very large capacitance and holding the voltage on that large capacitance is reduced, as the charge driven to the capacitor is driven from internal circuitry to the comparator 1004, as opposed to a driving circuit associated with the node 742. Thus, the drive of the sampling capacitors is distributed among all of the comparators 740.

Figure 12:
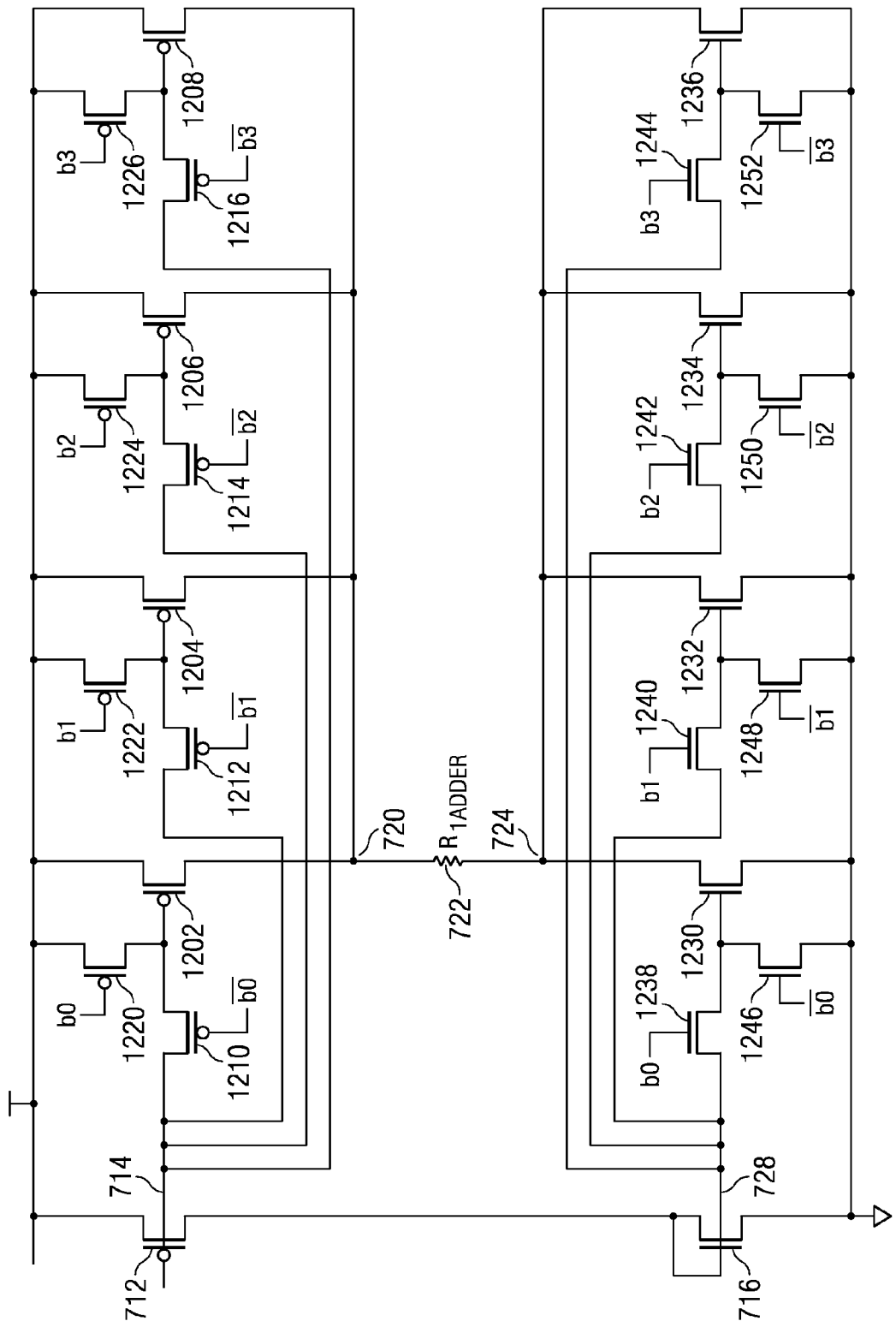
FIG. 12 illustrates a schematic diagram of the bias circuitry for the resistor ladder.

Referring now to FIG. 12, there is illustrated a schematic diagram of the transistors 718 and 726. The transistor 718 is comprised of four binary weighted transistors 1202, 1204, 1206 and 1208, each of these being a p-channel transistor having the source/drain path thereof connected on one side thereof to the supply voltage $V_{DD}$. The other side of the source/drain path thereof is connected to the node 720. The gate of transistor 1202 is connected through the source/drain path of a p-channel transistor 1210 to node 714, the gate thereof connected to bit b0-Bar. The gate of transistor 1204 is connected to node 714 through the source/drain path of a p-channel transistor 1212, the gate thereof connected to bit b1-Bar. The gate of transistor 1206 is connected to node 714 through the source/drain path of a p-channel transistor 1214, the gate thereof connected to bit b2-Bar. The gate of transistor 1208 is connected to node 714 through the source/drain path of a p-channel transistor 1216, the gate thereof connected to bit b3-Bar. Therefore, when the respective bits are a logic "high," then the respective gate transistors 1210-1216 will connect the gate of the respective transistors 1202-1208 to node 714. Transistors 1202-1208 are binary weighted in size. The transistor 1202 has a size of for reference purposes, 1X, transistor 1204 has a size of 2X, transistor 1206 has a size of 4X and transistor 1208 has a size of 8X. Therefore, the amount of current that will flow through the transistors is correspondingly larger. This provides the binary weighting, a fairly conventional weighted current scheme.

When the transistors 1202-1208 are deselected, their gates will be pulled high. A pull-up p-channel transistor 1220 has the source/drain path thereof connected between the gate of transistor 1202 and a supply voltage $V_{DD}$, and the gate thereof connected to bit b0. A pull-up p-channel transistor 1222 has the source/drain path thereof connected between $V_{DD}$ and the gate of transistor 1204 and the gate thereof connected to bit b1. A pull-up p-channel transistor 1224 has the source/drain path thereof connected between $V_{DD}$ and the gate of transistor 1206 and the gate thereof connected to bit b2. A pull-up p-channel transistor 1226 has the source/drain path thereof connected between $V_{DD}$ and the gate of transistor 1208 and the gate thereof connected to bit b3.

The transistor 726 is comprised of four n-channel transistors 1230, 1232, 1234 and 1236 having the source/drain paths thereof connected between node 724 and ground and sized in a binary weighted manner similar to transistors 1202-1208, such that they are respectively identical thereto in size. The gate of transistor 1230 is connected to node 728 through an n-channel transistor 1238, the gate thereof connected to bit b0. The gate of transistor 1232 is connected through an n-channel gate transistor 1240 to node 728, the gate thereof connected to bit b1. The gate of transistors 1234 is connected through an n-channel gate transistor 1242 to node 728, the gate thereof connected to bit b2. The gate of transistor 1236 is connected through an n-channel gate transistor 1244 to node 728, the gate thereof connected to the bit b3. Thus, by selecting the ones of the gated transistors 1238-1244, the binary weighted transistors 1230-1236 can be selectively connected between node 724 and ground. When not selected, the gates thereof are pulled low through the source/drain paths of pull-down n-channel transistors 1246, 1248, 1250 and 1252, respectively. The gates of transistors 1246-1252 are connected to bits b0-Bar, b1-Bar, b2-Bar and b3-Bar, respectively.

Figure 13:
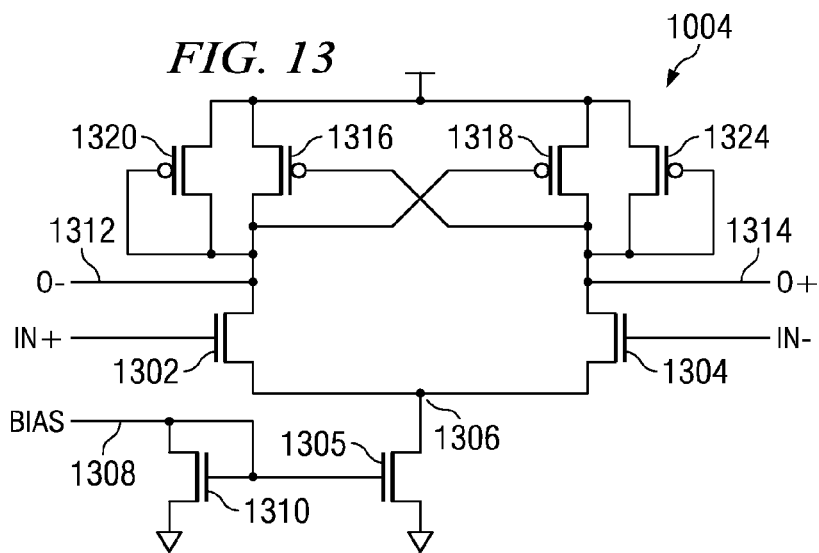
FIG. 13 illustrates a schematic diagram for the first comparator section.

Referring now to FIG. 13, there is illustrated a schematic diagram of the comparator 1004. This is a differential input comparator that is comprised of two differential input n-channel transistors 1302 and 1304 having the sources thereof connected in a common source configuration to a common source node 1306. Node 1306 is connected through the source/drain path of an n-channel transistor 1305 to ground, the gate thereof connected to a bias voltage on a node 1308. A diode connected n-channel transistor 1310 has the source/drain path thereof connected between node 1308 and ground and the gate thereof connected to node 1308. This provides the bias for the node 1306 for the transistor 1305. The drain of transistor 1302 is connected to a negative output node 1312 and the drain of transistor 1304 is connected to a node 1314, the positive output node. A cross coupled p-channel transistor pair comprised of a p-channel transistor 1316 connected between $V_{DD}$ and node 1312 at a p-channel transistor 1318 connected between $V_{DD}$ and node 1314 is configured such that the gate of transistor 1316 is connected to the opposite node, node 1314, and the gate of transistor 1318 is connected to the opposite node, node 1312. A diode connected p-channel transistor 1320 is connected between $V_{DD}$ and node 1312, the gate thereof connected to node 1312. A diode connected p-channel transistor 1324 is connected between $V_{DD}$ and node 1314, the gate thereof connected to node 1314. The gate of transistor 1302 is the positive input and the gate of transistor 1304 is the negative input.

Figure 14:
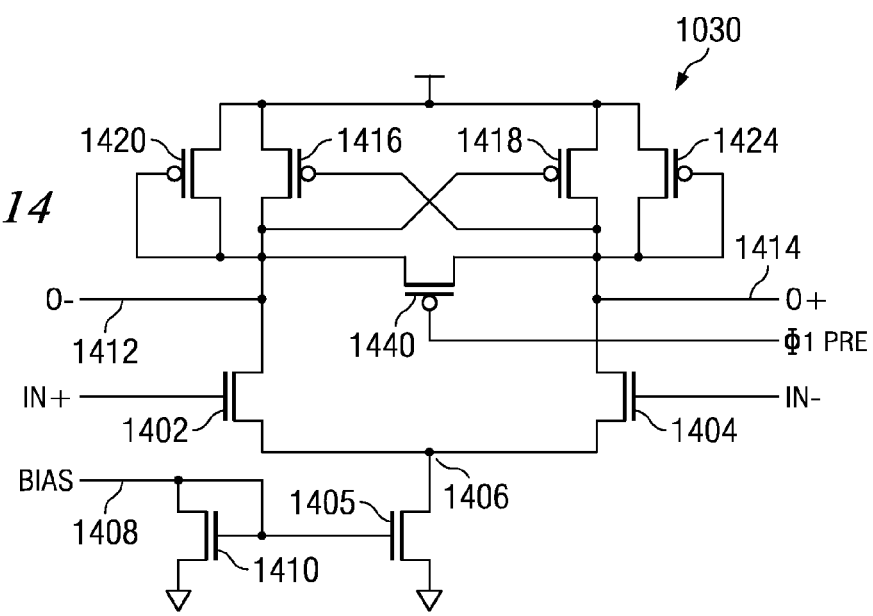
FIG. 14 illustrates a schematic diagram for the second comparator section.

Referring now to FIG. 14, there is illustrated a schematic diagram of the comparator 1030. This is a differential input comparator that is comprised of two differential input n-channel transistors 1402 and 1404 having the sources thereof connected in a common source configuration to a common source node 1406. Node 1406 is connected through the source/drain path of an n-channel transistor 1405 to ground, the gate thereof connected to a bias voltage on a node 1408. A diode connected n-channel transistor 1410 has the source/drain path thereof connected between node 1408 and ground and the gate thereof connected to node 1408. This provides the bias for the node 1406 for the transistor 1405. The drain of transistor 1402 is connected to a negative output node 1412 and the drain of transistor 1404 is connected to a node 1414, the positive output node. A cross coupled p-channel transistor pair comprised of a p-channel transistor 1416 connected between $V_{DD}$ and node 1412 and a p-channel transistor 1418 connected between $V_{DD}$ and node 1414 is configured such that the gate of transistor 1416 is connected to the opposite node, node 1414, and the gate of transistor 1418 is connected to the opposite node, node 1412. A diode connected p-channel transistor 1420 is connected between $V_{DD}$ and node 1412, the gate thereof connected to node 1412. A diode connected p-channel transistor 1424 is connected between $V_{DD}$ and node 1414, the gate thereof connected to node 1414. The gate of transistor 1402 is a positive input and the gate of transistor 1404 is the negative input. This is a conventional design.

A p-channel transistor 1440 that has the source/drain path thereof connected between nodes 1412 and 1414 and provides a short circuit for a short duration of time prior to the leading edge of φ1' to prevent kickback. The gate of transistor 1440 is connected to a clock signal φ1$_{pre}$, such that, when activated, the gain of the comparator stage 1030 is substantially reduced. This clock signal is not shown in FIG. 11.

Figure 15:
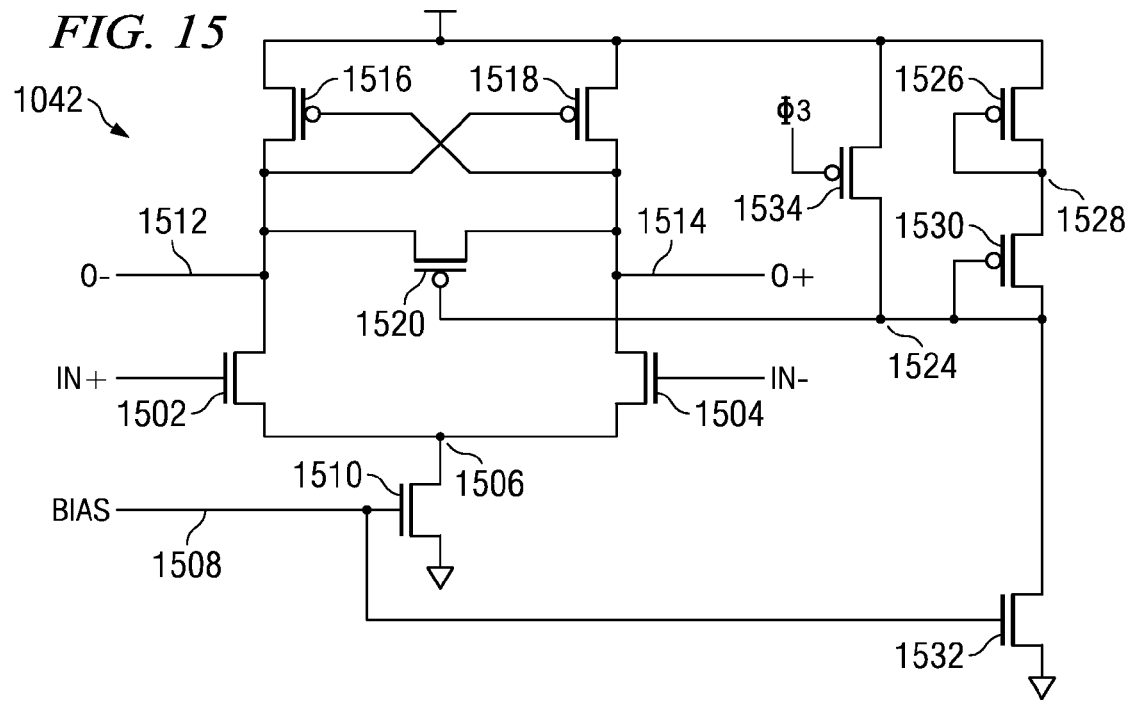
FIG. 15 illustrates a schematic diagram for the reconfigurable latch.

Referring now to FIG. 15, there is illustrated a schematic diagram of the reconfigurable latch 1042. This latch has two modes of operation. In the first mode, the gain is set at a relatively low gain and, in a second mode, the gain is increased substantially. The input is provided by a common source pair of differential input n-channel transistors 1502 and 1504, having the source thereof connected to a common source node 1506. The n-channel transistor 1510 is connected between node 1506 and ground with the gate thereof connected to a bias voltage on a node 1508. The drain of transistor 1502 is connected to a negative output node 1512 and the drain of transistor 1504 is connected to a node 1514, the positive output node. A cross-coupled pair of p-channel transistors 1516 and 1518 is provided, with the source/drain path of transistor 1516 connected between $V_{DD}$ and node 15 al2nd the source/drain path of transistor 1518 connected between $V_{DD}$ and node 1514. The gate of transistor 1516 is connected to node 1514 and the gate of transistor 1518 is connected to node 1512. A p-channel transistor 1520 has the source/drain path thereof connected between nodes 1514 and 1512 and the gate thereof connected to a node 1524. A diode connected p-channel transistor 1526 is connected between $V_{DD}$ and a node 1528 (p-channel), the gate thereof connected to node 1528. A second diode connected p-channel transistor 1530 is connected between node 1528 and node 1524, the gate thereof connected to node 1524. An n-channel transistor 1532 is connected between node 1524 and ground, the gate thereof connected to the bias voltage on node 1508. A p-channel transistor 1534 has the source/drain path thereof connected $V_{DD}$ and node 1524, the gate thereof connected to the clock signal φ3. In general, the transistor 1520 is operated in the triode region and, therefore, when turned on, constitutes a resistor. The input impedance looking into the source of transistor 1516 and into the source of transistor 1518 is equal to $-1/g_m$. When transistor 1520 is turned on, it provides a resistance, $R_{1520}$, that is disposed in parallel with this impedance. Initially, this is a negative impedance until a transistor is turned on, at which time it is impedance above zero, which, when turned on, results in a relatively low gain. When turned off, the gain goes high. Thus, when φ3 goes high, node 1524 is biased to place the transistor 1520 in the triode region. This occurs at an edge 910 on the waveform φ3 in FIG. 11. This occurs prior to the switches 1014 and 1016 closing in response to φ2 going high at the edge 1108. Thus, prior to the sample operation, the latch 1042 is configured for a low gain operation. When φ2 goes high at edge 1108, the reconfigurable latch 1042 will evaluate the difference voltage at the gates of transistors 1502 and 1504 which will result in a difference voltage generated across the output nodes 1512 and 1514 with a gain of two. When φ3 goes low at an edge 1112, this value will be latched on the outputs.

Figure 16:
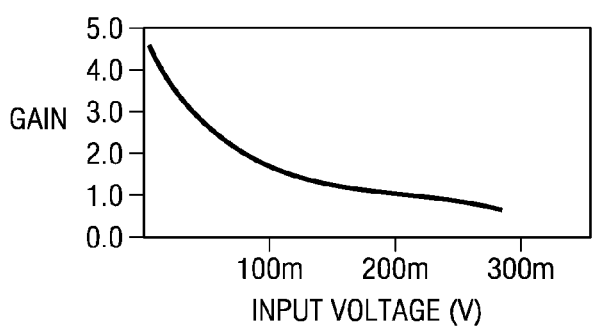
FIG. 16 illustrates a gain response curve for the reconfigurable latch.

Referring now to FIG. 16, there is illustrated a plot of gain of the reconfigurable latch when φ3 is high. It can be seen that the gain varies from a value of 4.5 at a substantially zero voltage input to a value of 1.5 at a voltage of 100 millivolts and a voltage of 1.0 at a value of 200 millivolts on the input.

Figure 17:
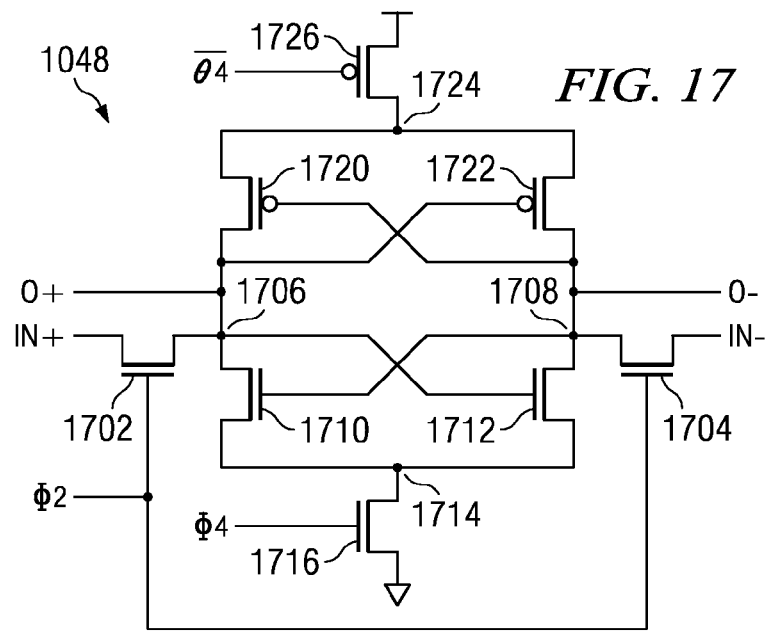
FIG. 17 illustrates a schematic diagram for the dynamic latch.

Referring now to FIG. 17, there is illustrated a schematic diagram of the dynamic latch 1048. There are provided two n-channel gate transistors 1702 and 1704 for connecting the positive and negative inputs associated therewith to respective nodes 1706 and 1708, the gates of transistors 1702 and 1704 gated by the φ2 clock signal. Two common source n-channel transistors 1710 and 1712 have the sources thereof connected to a common source node 1714 and the drains thereof connected respectively to nodes 1706 and 1708. An n-channel transistor 1716 is connected between node 1714 and ground and controlled by the φ4 clock signal. Therefore, the sources of transistors 1710 and 1712 will be connected to ground when φ4 is a logic "high." Node 1706 is associated with a positive output and node 1708 is associated with a negative output. Two cross-coupled p-channel transistors 1720 and 1722 are provided, transistor 1720 connected between a node 1724 and node 1706 and transistor 1722 connected between node 1724 and node 1708. The gate of transistor 1720 is connected to node 1708 and the gate of transistor 1722 is connected to node 1706. A p-channel gate transistor 1726 is provided for connection between $V_{DD}$ and node 1724 and the gate thereof connected to the clock signal φ4-Bar. Thus, when transistor 1726 is turned on, node 1724 is connected to $V_{DD}$.

In operation, when the clock signal φ2 goes high, the differential output of the reconfigurable latch is connected to nodes 1706 and 1708. However, this latch is essentially powered down until the evaluation phase is complete and φ4 goes high at an edge 114, the same time that φ2 goes low at a negative falling edge 116. Thus, the output of the reconfigurable latch which is provided at the falling edge of φ3, falling edge 112, will be disposed on nodes 1706, and 1708 while the latch 1048 is powered down. When transistors 1702 and 1704 are turned off, then the voltage on nodes 1706 and 1708 is "latched" into the latch 1048 by turning on transistors 1716 and 1726. This provides an output to the transmit latch 846.

Digital Compensator

Figure 18:
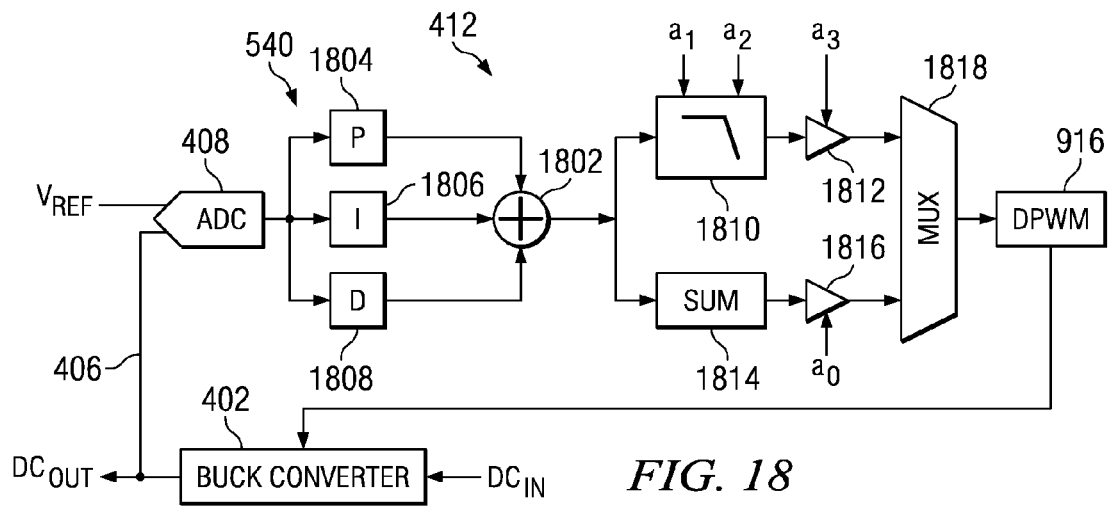
FIG. 18 illustrates a simplified block diagram of the PID.

Referring now to FIG. 18, there is illustrated a simplified diagrammatic view of the digital controller and the digital compensator 412. The PID block 540 is comprised of three paths that are summed with a summing junction 1802. The first path provides a proportional relationship with a block 1804, the second path provides an integration function with an integration block 1806 and the third block provides a differentiation path with a block 1808. As noted hereinabove, this is referred as a PID controller. The proportional block 1804 has a steady state proportional gain, $K_p$, and provides zero phase lag. The integral path and integration block 1806 has an integral gain, $K_i$, which generally reduces the steady state error. There is some phase lag associated with this. The differential path associated with the differentiation block 1808 has a derivative gain, $K_d$, which provides some phase lead by anticipating future operations. Thus, the overall PID block 540 provides phase compensation for the overall control loop.

The output of the summing junction 1802 is input to, as described hereinabove, either a low pass filter 550 or a sinc filter 552. The low pass filter 550 is comprised of a block 1810 that has associated therewith a low pass filter frequency response with two poles. This is passed through an amplification stage 1812 with another coefficient associated with the amplification, this being the coefficient that is controlled by the microcontroller 440. Thus, there are three coefficients, $a_1$, $a_2$ and $a_3$ that control the operation of the low pass filter function, these being the coefficients of the low pass filter. The sinc filter 552 is basically comprised of a summing block or an accumulation block 1814, which is operable to sum over a range of delay values, this being a decimation type sinc filter. A gain factor is provided by an amplification stage 1816 which has a coefficient $a_0$ associated therewith. This $a_0$ will set the position of the sinc filter notch, as will be described hereinbelow. A multiplexer 1818 is operable to select between the output of amplification stage 1812 and the -amplification stage 1816 for input to the DPWM 406.

Figure 19:
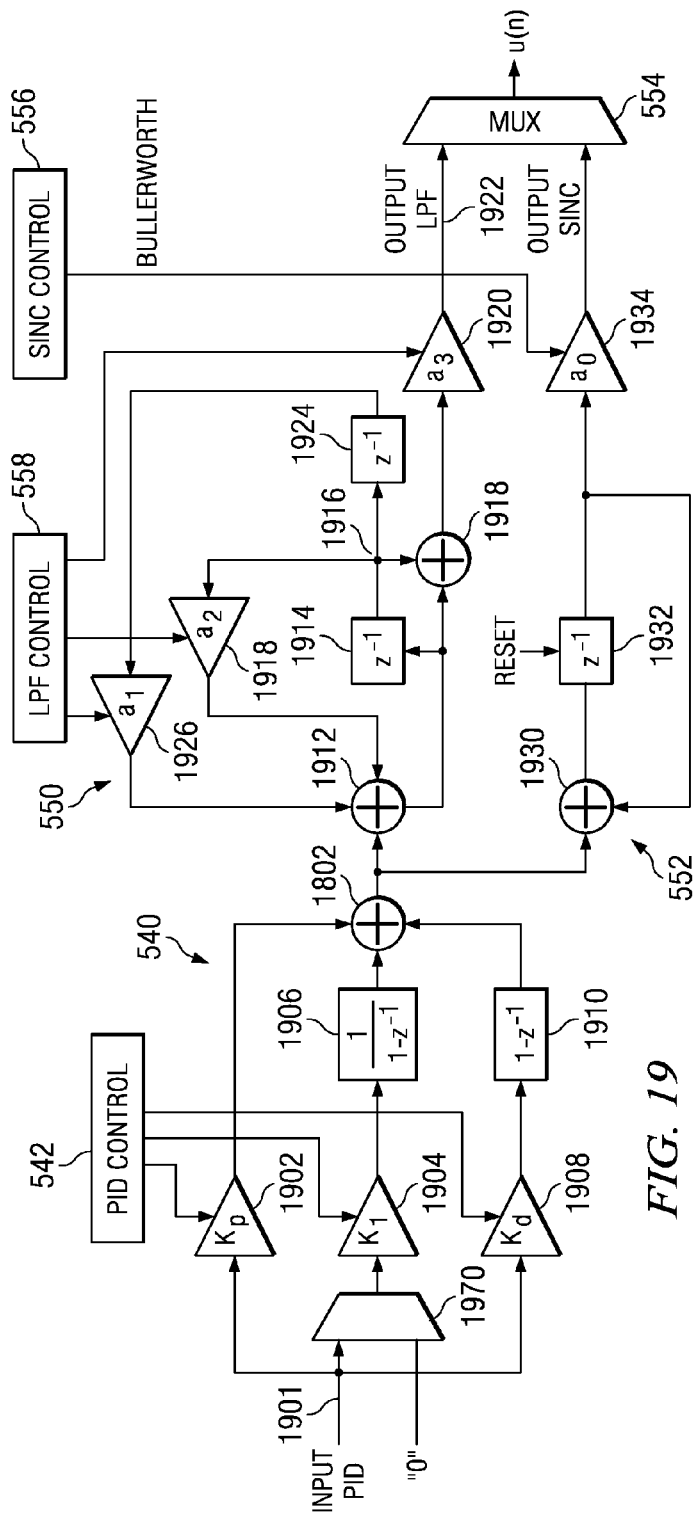
FIG. 19 illustrates a more detailed block diagram of the PID.

Referring now to FIG. 19, there is illustrated a more detailed block diagram of the PID 540 and the low pass filter 550 and the sinc filter 552. The proportional path of the block 1804 has a gain stage 1902 associated therewith with the gain factor $K_p$. This is controlled by the PID control block 542. The integral block has a gain block 1904 associated therewith with the integral gain factor $K_i$. The output of this is passed through a transfer function $1/(1-z^{-1})$ in a block 1906. The output of this block is input to the summing junction 1802. The integration path and the block 1808 are comprised of a gain block 1908 with a differential gain $K_d$. The output of this gain block 1908 is input to a delay block 1910 to provide the delay $(1-z^{-1})$. The output of block 1910 is input to the summing junction 1802. Additionally, there is provided a multiplexer 1970 having one input thereof connected to the input 1901 and the other input connected to a digital word with a value of "0." The output of the multiplexer 1970 is input to the input of the gain block 1904. In that error condition, the "0" value can be selected such that the integration path is on hold. This will be described in more detail hereinbelow.

The low pass filter is configured with an input summing junction 1912, the output thereof connected to a delay block 1914 with a delay of $z^{-1}$. The output of delay block 1914 is connected to a node 1916, which node 1916 has a signal associated therewith fed back through a coefficient block 1918 with a coefficient $a_2$, the output thereof input to the summing block 1912. Node 1916 is also input to one input of a summing junction 1918, the output thereof connected to the input of a coefficient block 1920, the output thereof providing the output of the low pass filter on a node 1922. The input to delay block 1914 is also input to summing junction 1912. Node 1916 is input through a delay block 1924 with a delay $z^{-1}$, the output thereof input through a coefficient block 1926 with a coefficient $a_1$, to another input of the summing junction 1912. The low pass filter control block 558 sets the coefficients $a_1$, $a_2$ and $a_3$. In general, this is a Butterworth configuration low pass filter, a fairly conventional digital filter.

The sinc filter is comprised of an input summing junction 1930, the output thereof input through a delay block 1932 with a delay of $z^{-1}$, the output thereof input to a coefficient block 1934, the output thereof providing the output of the sinc filter 552, coefficient block 1934 having the coefficient $a_0$ associated therewith, this coefficient provided by the sinc control block 556. The output of delay block 1932 is also fed back to the input of summing junction 1930 to provide the accumulation operation. This delay block 1932 has a reset input associated therewith which is reset at a predetermined time. As noted hereinabove, this is a decimation type sinc filter. The output of both the low pass filter and the sinc filter are input to respective inputs of the multiplexer 554. This provides the u(n) error signal. The low pass filter or the sinc filter can be selected, depending upon the particular application and the desire of the applications engineer.

Figure 20A:
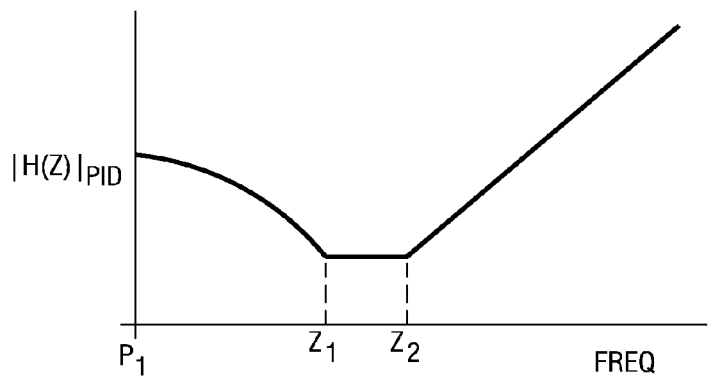
FIGS. 20a and 20b illustrate a z-domain plot of amplitude and phase.

Referring now to FIGS. 20a and 29b, the frequency response of the PID 540 will be described. First, the mathematics associated with the PID will be set forth as follows:

$$H(z)_{PID} = K_p + \frac{K_i}{1 - z^{-1}} + K_d(1 - z^{-1})$$

-continued $$= \frac{K_p(1-z^{-1}) + K_i + K_d(1-z^{-1})^2}{1-z^{-1}}$$

$$= \frac{(K_p + K_i + K_d) + (-K_p - 2K_d)z^{-1} + z^{-2}}{1-z^{-1}}$$

It can be seen from the above equations that there is a single pole at DC and that there are two zeros. Further, it can be seen that the value of the zeros is the function of the constants $K_p$, $K_i$ and $K_d$. By selecting these constants, the value of the zeros can be varied.

Figure 20B:
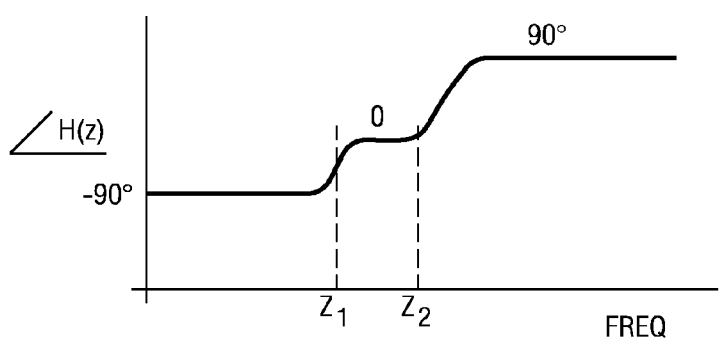
Figure 21:
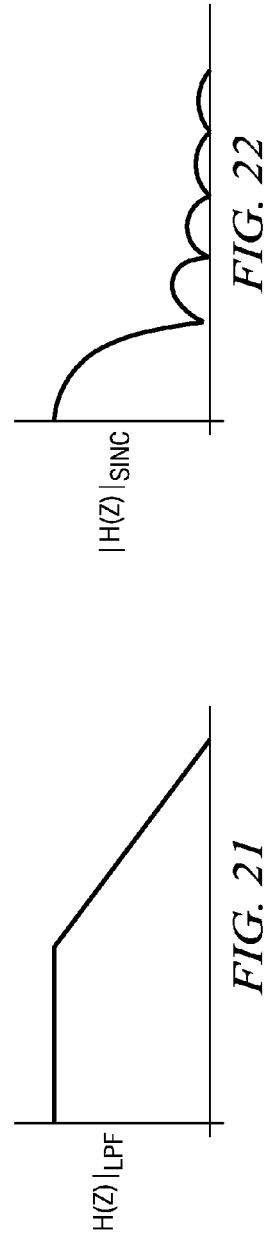
FIG. 21 illustrates a frequency plot of a low pass filter.
Figure 22:
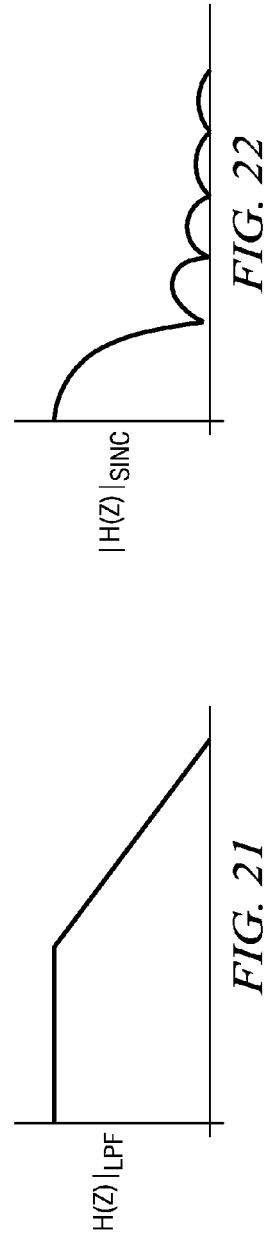
FIG. 22 illustrates a frequency response of the sinc filter.

Referring now to FIGS. 20a and 20b, there is illustrated frequency and phase plots for the response over frequency of the PID. It can be seen that there is a single pole at DC and the response will roll off until the first zero, at which time the response will flatten out until the second zero. At the second zero, the response changes in a positive manner, this due primarily to the differentiator term. However, it can be seen that without some type of filtering, the gain at high frequencies will be fairly high. This is the difference between a digital controller and an analog controller wherein the analog controller has an inherent low pass filter at the higher frequencies. It can be seen that the phase also exhibits a similar property wherein the phase is initially 90° and falls slightly to the first zero where it goes positive and then at the second zero continues to increase. At high frequencies, the phase is significantly leading in nature. With the use of a low pass filter, as set forth in FIG. 21, the high frequency portion of the PID response can be controlled. However, the corner frequency of the low pass filter cannot be too low or the phase associated therewith will cause instability in the loop. Typically, the switching frequency is around 500 KHz. It will be desirable to filter any noise associated with the switching frequency and, therefore, it will be desirable from a filtering standpoint to move the corner frequency of the low pass filter at or below this frequency. However, this would cause significant phase instability in the control loop. This is where the sinc filter will be beneficial. The sinc filter, with the response shown in FIG. 22, results in a plurality of "notches" at multiples of the sampling frequency, such that a notch can be placed at the switching frequency of the power supply.

As noted hereinabove, the sinc filter is a decimation type filter. The decimation ratio is defined as the ratio of the sampling frequency of the controller divided by the switching frequency of the power supply, the desired notch. If the sampling frequency $f_s$, is set at 10 MHz and the switching frequency of the power supply, $f_{sw}$, is equal to 500 kHz, that summation ratio would be equal to $f_s/f_{sw}$, which results in zeros at integer multiples of the switching frequency. This is equal to $(10 \times 10^6)/(500 \times 10^3)$, which results in a decimation ratio of 20. Therefore, a notch would exist at 500 kHz, 1 MHz, 1.5 MHz and finally at 5 MHz, $f_s/2$. Therefore, the accumulator would accumulate 20 samples and then be reset, at which time it would provide an output.

Figure 23A:
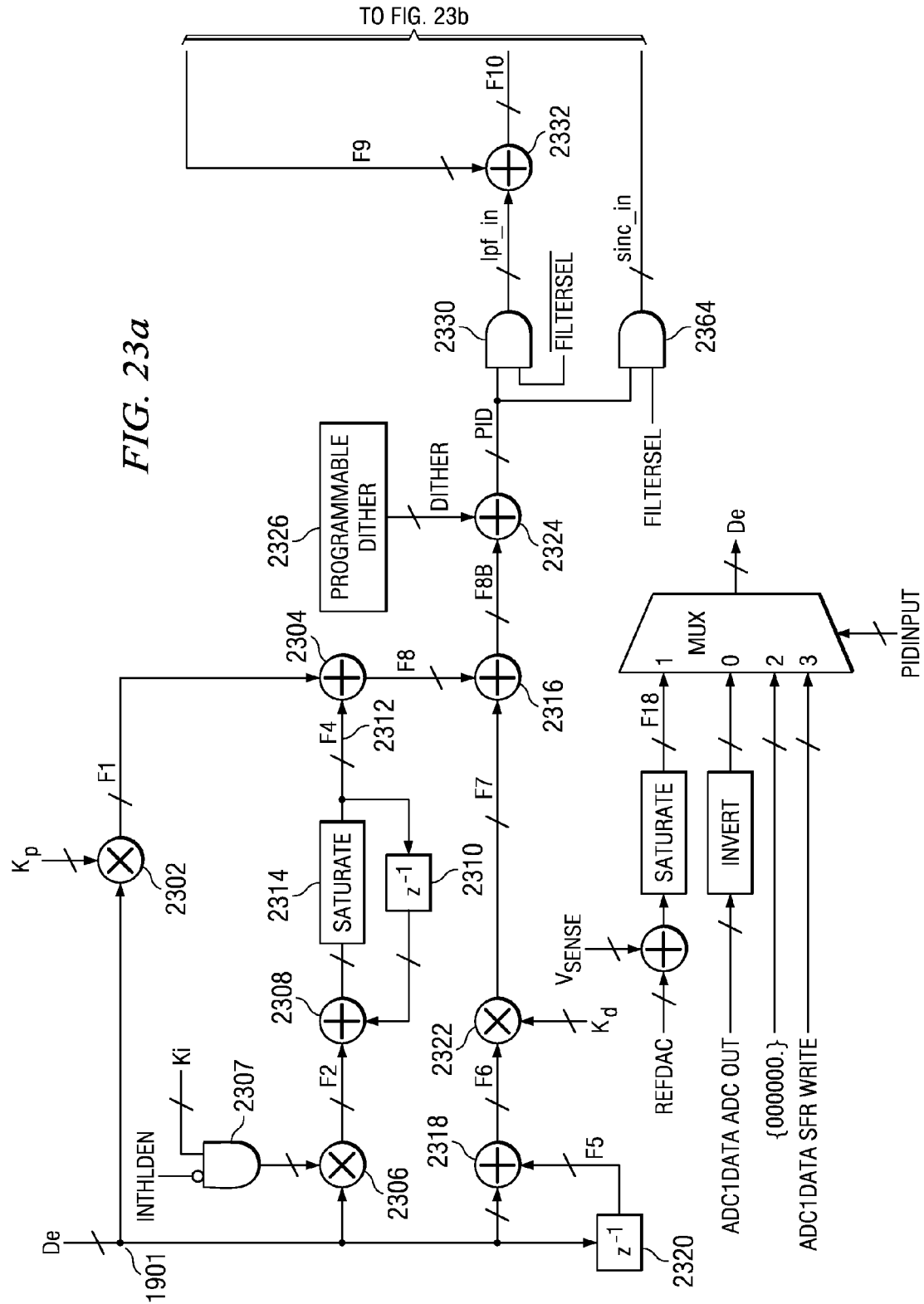
FIGS. 23a and 23b illustrate a block diagram of one implementation of the PID.
Figure 23B:
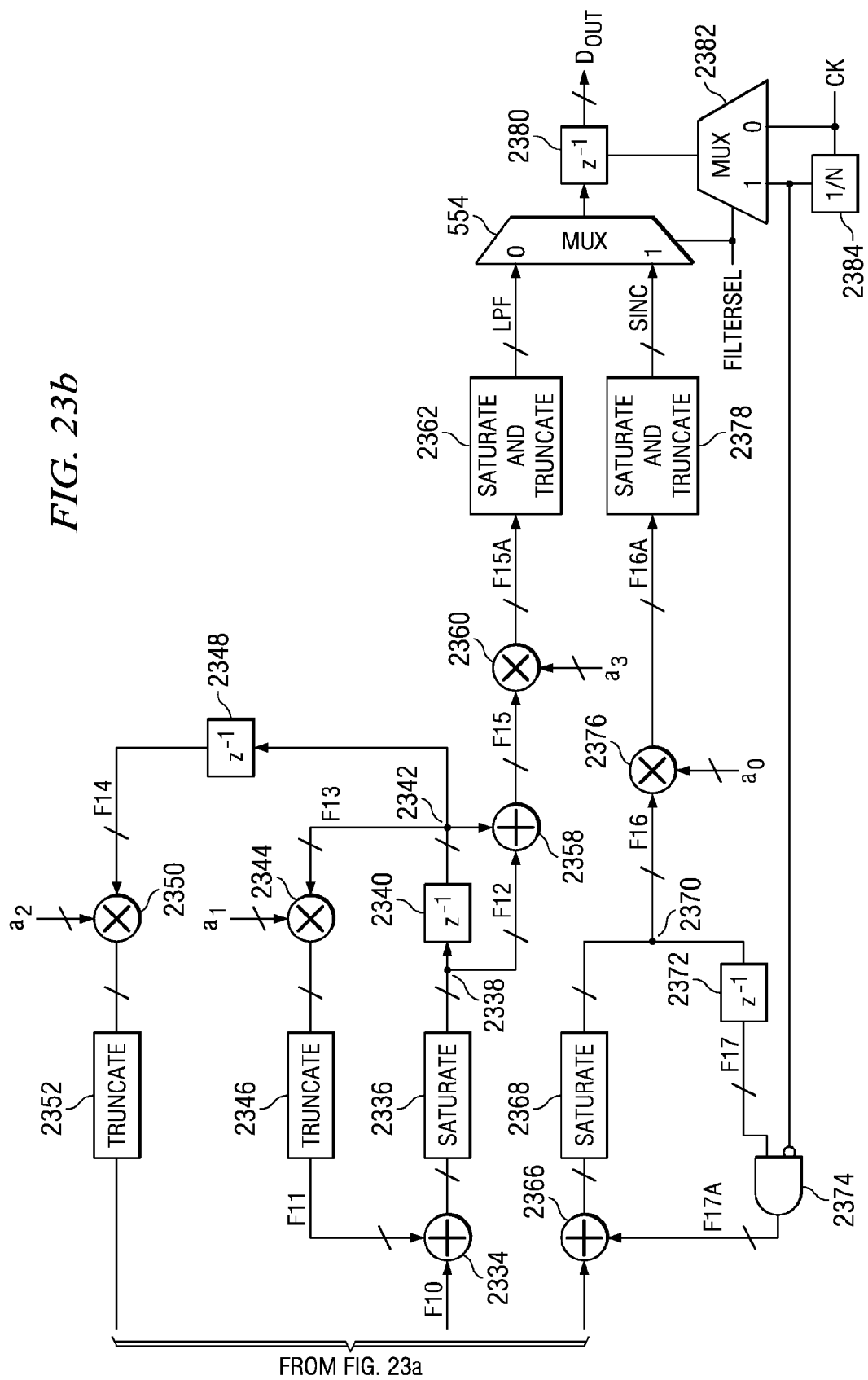

Referring now to FIGS. 23a and 23b, there is illustrated a more detailed implementational diagram of the digital compensator 412. The input 1901 of the PID is input along three paths, as noted hereinabove. The proportional path utilizes a multiplier 2302 having one input connected to the node 1901 and the other input thereof for receiving the digital value of $K_p$ and providing on the output the result for input to a first summing junction 2304. The integral path has a multiplier 2306 associated therewith having one input thereof connected to the input 1901 and the other input thereof for multiplication with the output of an AND gate 2307. One input of the AND gate is connected through an inverter node to an integrate hold enable signal, INTHLDEN, and the other input thereof connected to the $K_i$ integral constant. The output of multiplier 2306 is fed to the input of a summing junction 2308 for summing with the output of a feedback delay block 2310 which is operable to feedback the output from a node 2312. The output of the summing junction 2308 is passed through a saturation block 2314 to a node 2312. Node 2312 is input to the other input of the summing junction 2304. The output of summing junction 2304 is input to a summing junction 2316. The differentiator block has a summing node 2318 for receiving on the one input thereof the value on the node 1901 and on the other input thereof the value on node 1901 delayed by delay block 2320, this input to a negative input such that the block 2318 is a difference block. The output of the difference block 2318 is input to a multiplication block 2322 for multiplication of the output of the summing block 2318 with the constant case $K_d$. The output of multiplication block 2322 is input to the summing block 2316. The summing block 2316 is input to a summing block 2324, this operable to receive on the input thereof a programmable dither signal, generated by a programmable dither register 2326. By changing the value of this programmable dither, the value output by the summing junction 2316 can be varied.

The output of the summing junction 2324 comprises the PID output. This is input to the two filters. The low pass filter is configured with an AND gate 2330, one input connected to the PID output and the other input thereof connected to the filter select signal, FILTERSEL-EAR. The output of the enable gate 2330 is input to a summing junction 2332. The output of summing junction 2332 is input to the input of a summing junction 2334, the output thereof connected through a saturate block 2336 to a node 2338 for input to a delay block 2340, the output thereof connected to a node 2342. Node 2342 is input to one input of a multiplication block 2344, the other input thereof connected to the coefficient $a_1$, for multiplication therewith. The output of multiplication block 2344 is passed through a truncation block 2346 to truncate the value output therefrom for input to the other input of the summing junction 2334 on a negative input thereof to provide a subtraction operation with the summing junction 2334. The output of node 2342 is also input through a delay block 2348 to the input of a multiplication block 2350 for multiplication with the $a_2$ coefficient. The output of multiplication block 2350 is truncated with a truncation block 2352 for input to a negative input on the summing junction 2332 such that a subtraction operation is performed by the summing junction 2332. A summing junction 2358 is operable to the sum of the output of node 2342 and the output of node 2338, the output thereof input to a multiplication block 2360 for multiplication with the $a_3$ coefficient. The output of multiplication block 2360 is input to a block 2362 for saturation of truncation and then to the input of the multiplexer 554.

The sinc filter is facilitated with an input selection AND gate 2364 having one input connected to the PID output and the other input connected to the filter select signal, FILTERSEL. The output of the gate 2364, the enable gate, is input to one input of a summing junction 2366, the output thereof connected through a saturate block 2368 to a node 2370. Node 2370 is connected through a delay block 2372 to an input of an AND gate 2374. The output of AND gate 2374 is input to the other input of the summing junction 2366. Node 2370 is also input to a multiplication block 2376 for multiplication with the sinc filter coefficient, $a_0$, the output thereof connected to a saturate and truncation block 2378 for output to the other input of the multiplexer 554.

When the sinc filter is selected, a different clock signal is utilized for delaying the output. A delay 2380 is provided on the output of the multiplexer 554. A multiplexer 2382 selects the control signal for the delay 2380 to adjust the delay thereof. This either can be the raw clock signal or the raw clock signal divided by a factor of "N," with a divide block 2384. The clock signal is input to one input of the multiplexer 2380 and to the other input thereof through the divide block 2384 to provide the divide down clock signal. The divide down clock signal also provides the second input to the enable gate 2374 through inverting node thereon. Thus, the divide ratio provides the "reset" for the accumulation operation, the accumulation operation operating at the filter clock rate. The divide down "N" ratio sets the number of accumulations that will be allowed to occur before the reset, at which time the data output will be provided.

Figure 24:
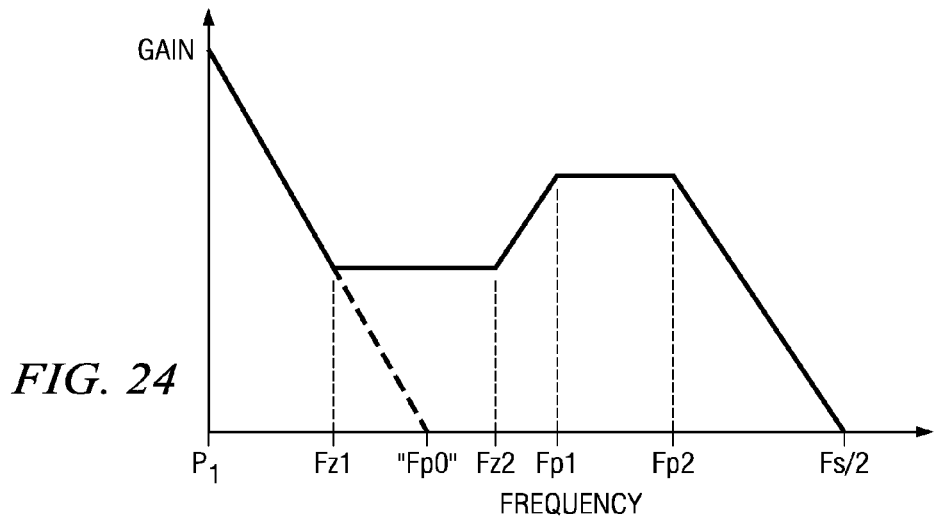
FIG. 24 illustrates a Bode plot of the overall digital compensator comprised of the PID and LPF.

Referring now to FIG. 24, there is illustrated a Bode plot of the digital compensator with a low pass filter. It can be seen that, at DC, there is a pole and the first zero of the PID occurs at Fz1 and the second zero occurs at Fz2. The response will increase at the second zero until the first pole of the low pass filter occurs, at Fp1, and the second pole occurs later at a pole Fp2. Thus, it can be seen that by moving the corner frequency of the low pass filter out from the switching frequency and the zeros of the PID, there will be some increase in the signal output by the PID. Of course, the two zeros of the PID could be identical and the two poles of the low pass filter could be closer together.

Figure 25:
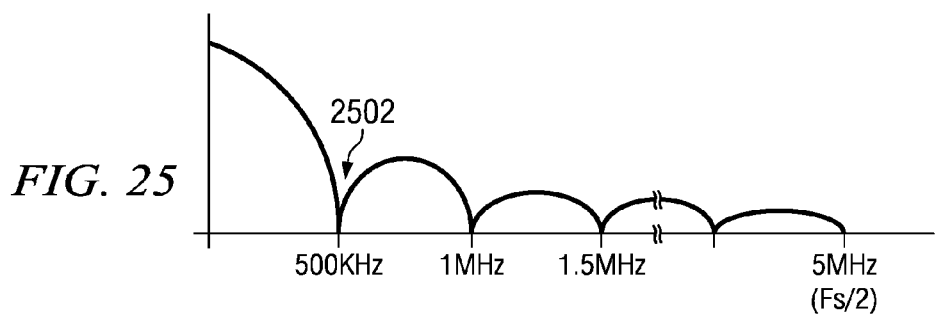
FIG. 25 illustrates a more detailed waveform of the sinc filter.

Referring now to FIG. 25, there is illustrated a frequency plot of the sinc filter operation in the frequency domain. It can be seen that, in this embodiment set forth hereinabove with respect to the example where the sampling frequency of the filter is 10 MHz and the switching frequency of the power supply is 500 kHz, there will be a notch 2502 placed proximate to the 500 kHz switching frequency. It is noted that this notch is programmable to the use of the coefficients utilized to realize the sinc filter, the decimation ratio, the sampling frequency and the switching frequency. By adjusting these values, the notch can be programmed for placement at the switching frequency of the power supply. This will result in a very quiet power supply, such that the switching frequency is effectively filtered out of the control loop.

Voltage Positioning

Figure 26:
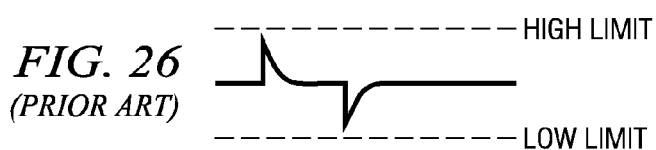
FIG. 26 illustrates a plot of the voltage response in a prior art system to positive and negative transients.

Referring now to FIG. 26, there is illustrated a prior art voltage plot of the voltage output in the presence of positive and negative transients. The power supply is typically given some type of specification for the regulation, i.e., the regulation must be within predetermined limits. There is a high limit and a low limit. The reason that the voltage may go outside of the limits is due to ripple or due to transient responses. The ripple is typically very tightly controlled. However, transient current surges can cause the voltage to increase or decrease. In FIG. 26, there are illustrated a positive transient and a negative transient. A positive transient will occur whenever a load is quickly removed from the output of the power supply and a negative transient will occur when a load is applied. When a load is applied, for example, there will be a large inrush of current. This current will have a tendency to pull the power supply voltage low and out of regulation shortly until it can be brought back into regulation. However, it may be that the current rush will pull the voltage down below a lower limit, thus falling outside of the specification. The way the prior art systems have accommodated this transient is to provide for a larger capacitor on the output node. This larger capacitor will tend to reduce the effect of the transient and maintain it within the limit. The problem with large capacitors is that they are expensive and large. There are two types of capacitors that can be utilized, ceramic capacitors or electrolytic capacitors. The ceramic capacitors have a relatively small equivalent series resistance (ESR), but they do not accommodate large capacitor values at economic costs. A typical value of a capacitor to accommodate transients would be 100 microfarads. For this size of a capacitor, a single discrete capacitor would typically utilize an electrolytic capacitor. However, these electrolytic capacitors have high ESRs. For any inductor current ripple, there would be a commensurate amount of power dissipated in the ESR of the capacitor. For DC voltages, there would be no dissipation, but, for even a small ripple, there would be some heating of the capacitor. This heating could cause failure of the capacitor, which is why ceramic capacitors are favored. Thus, even though the ceramic capacitor has a relatively small value, power supply manufacturers utilize a plurality of the power supply capacitors disposed in parallel. Thus, for large capacitors, there can be a large part count and, therefore, it is desirable to reduce this part count.

Figure 27A:
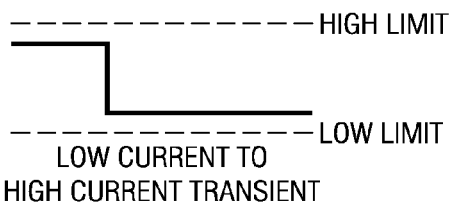
FIGS. 27a and 27b illustrate voltage plots for transients in the presence of voltage positioning for both low and high current, respectively.
Figure 27B:
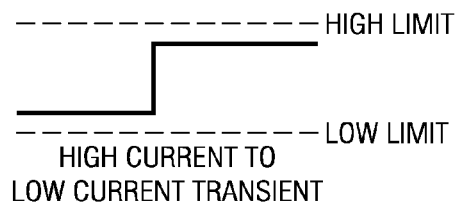

In the present disclosed embodiment, it is possible through the control of the reference DAC 506 that is part of the reference generator 410, to be controlled to reposition the set point for the reference input to the ADC 408. For situations where low current is present, well below the rated current of the power supply, it is anticipated that any transient would be a negative transient due to a sub increase in the load. Thus, the set point is positioned higher than median voltage and closer to the higher limit than the low limit. Thus, when a transient occurs, it has the full range between the high and low limit or substantially the full range, within which to pull the voltage down on the output of the power supply. This is illustrated in FIG. 27*a*, wherein the regulated DC voltage is disposed proximate the high limit. When high current is present, the set point is disposed proximate to the lower limit of the power supply specifications. When the load is removed, which would be expected, then a positive transient would occur and, with the embodiment illustrated in FIG. 27*b*, the transient can have a magnitude that his approximately equal to the difference between the high and low limits in the specification.

Figure 28A:
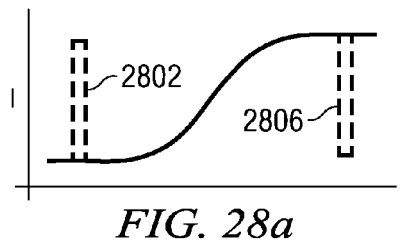
FIGS. 28a and 28b illustrate the relationship between the voltage set point and the current level.
Figure 28B:
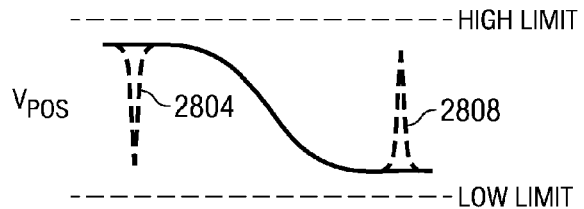

In order to appropriately set the value output by the reference DAC 506, it is necessary to determine the current level and then set the reference voltage level accordingly. FIGS. 28*a* and 28*b* illustrate this aspect. For low currents, the voltage is positioned proximate the high limit and for the high currents, the voltage is positioned proximate the lower limit. Illustrated in FIG. 28*a* is the current and 28*b* is the output voltage position, i.e., the set point. Superimposed on the current in phantom at the low current level is a current transient 2802. This results in a transient in the voltage in the transient 2804 in voltage that is negative going. However, since the voltage is positioned proximate the high limit, this transient has more room than if it were disposed at the midpoint between the high and low limits. Very similarly, when the current is high, there is illustrated a negative current transient 2806 in phantom. This would result in the regulated voltage experiencing a high voltage transient 2808. It can be seen that, since the voltage is repositioned for the higher current, that more room is allowed for the voltage mediation. The result of utilizing the voltage positioning is that a smaller capacitor can be utilized on the output, which can significantly reduce the part count.

Figure 29:
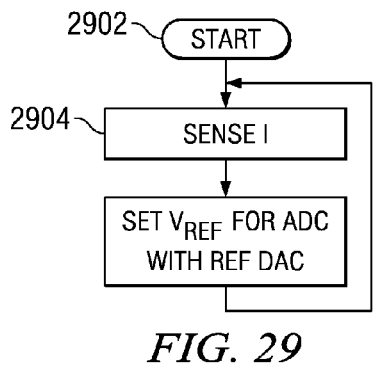
FIG. 29 illustrates a flow chart depicting the operation of voltage positioning.

Referring now to FIG. 29, there is illustrated a flow chart for the voltage positioning operation. This is initiated at a start block 2902 and the proceeds to a block 2904 to sense the current. The current is sensed with a Hall effect sensor 460 which generates a voltage output proportional to the current, these being conventional devices. This current is sensed and input to one of analog inputs to the chip and converted to a digital voltage with the SAR ADC converter 660. This is stored in the associated SFR/LIM register and can be examined by the core processor 602. Of course, any time the current exceeds the internal limit, this is accommodated by other circuitry. Once the current is sensed, then the value of $V_{REF}$ output by the reference DAC 506 is then set. This is set in accordance with a look-up table that can be stored in the memory or any other manner to set the values of the steps, including a simple algorithm. It could be that the voltage is positioned at three points, one when the voltage is above a threshold, one when it is below a threshold and one when it is between the thresholds. However, even finer graduations could be facilitated through the use of a look-up table.

Figure 30:
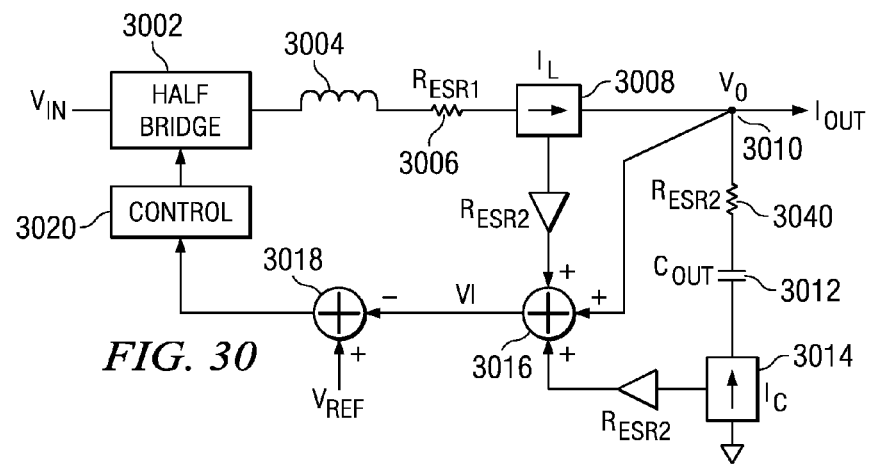
FIG. 30 illustrates a block diagram of the voltage positioning in the current sensing operation utilizing two current sensors.

Referring now to FIG. 30, there is illustrated a block diagram of a method for determining the total current. Hall sensors are fairly expensive and, therefore, a different technique is disclosed for measuring the currents and determining the change to the reference voltage to be made. As noted hereinabove with respect to FIG. 1, there is provided a half bridge power supply section 3002, which includes on the output side a series inductor 3004. Associated with this series inductor 3004 is an internal resistance 3006 with a resistive value. The current through the resistor 3006 is determined with a current detector 3008, which will be described in more detail hereinbelow. This provides the inductor current to the output node 3010 wherein the output voltage $V_O$ is provided. The output current, $I_{OUT}$, is output therefrom. Disposed between this output node and ground is the load capacitor 3012, $C_{OUT}$. This has associated therewith an internal resistance 3040. A current detector 3014 is disposed between the bottom plate of the capacitor 3012 and ground. The current detected by the current source 3008 is multiplied by a gain factor and input to a summing junction 3016. Similarly, the current detected by the current detector 3014 is multiplied by a factor and input to the summing junction 3016. In general, the ratio between the two internal resistors 3006 and 3014 determines what the multiplication factor is in both of the current detect legs. Additionally, the output voltage $V_O$ is input to the summing junction 3016. The output of the summing junction 3016 is an intermediate voltage $V_I$. The output of each of the current detect legs after the amplification stage is provided by the following equations:

$V_I = V_O + I_L R_{ESRZ} + I_C R_{ESRZ}$ $V_I = V_O + I_{OUT} R_{ESRZ}$

The output of the summing junction is then input to a summing junction 3018 to subtract the term $I_{OUT} R_{ESR2}$ from the value of $V_{REF}$ to provide the error voltage. This is input to a control block 3020 for input to the half bridge 3002. This is one implementation, but it indicates that the current can be determined from looking at particular voltages associated with the operation of the inductor and the capacitor. Once the currents are known, then a factor can be determined, such as the voltage across the resistor, and this can be utilized to perform the voltage positioning. Alternatively, the absolute value of the current can be determined and a look-up table utilized.

Figure 31:
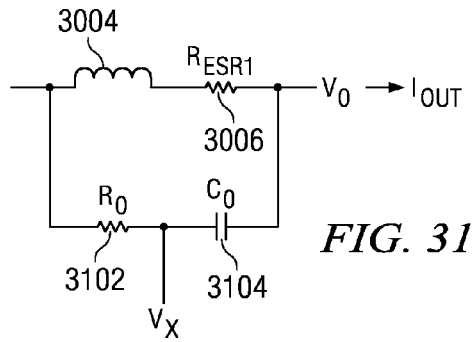
FIG. 31 illustrates a schematic diagram of the circuitry for determining the inductor current.

Referring now to FIG. 31, there is illustrated a schematic of the technique for measuring the current across the resistor without utilizing a Hall sensor. This is facilitated by disposing a series RC network between one side of the inductor 3004 and the other side of the internal resistor 3006. This is comprised of a resistor 3102 and a capacitor 3104 labeled $R_O$ and $C_O$. This is a monitoring circuit. If, for example, $V_O$ were equal to "0," then the following relationship would exist:

$$V_1 = I_{OUT}(sL + R_{ESRZ})$$

$$V_x = \frac{\frac{1}{C_O s}}{R_O + \frac{1}{C_O s}} = \frac{1}{1 + sR_O C_O} V_1$$

By combining the last two equations, the following exists:

$$I_{OUT}(sL + R_{ESR1})\left(\frac{1}{1 + sC_O R_O}\right) = V_s$$

$$I_{OUT} = V_x \frac{1 + sR_O C_O}{R_{ESR1} + sL}$$

$$I_{OUT} = \frac{V_x}{R_{ESR1}}\left(\frac{1 + sR_O C_O}{1 + \frac{sL}{R_{ESR1}}}\right)$$

By matching the poles and zeros of the above function, i.e., setting $R_O C_O = L/R_{ESRI}$ or $R_O R_{ESRI} C_O = L$, then $I_{OUT} = B_x/R_{ESRI}$. The output of $V_x$ is then equal to $I_{OUT}$ multiplied by the value of $R_{ESRI}$.

Figure 32:
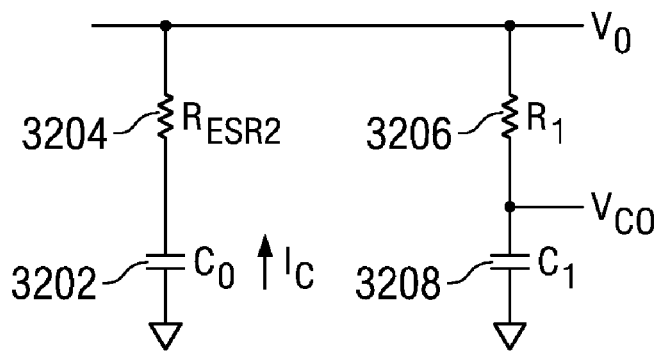
FIG. 32 illustrates a schematic diagram of the method for determining the capacitor current.

Referring now to FIG. 32, there is illustrated a diagrammatic view of the technique for determining the current through the capacitor. The capacitor is illustrated with an output capacitor 3202, the large filter output capacitor which has the internal resistance 3204. By providing a parallel series RC component comprised of a series resistor 3206 and series capacitor 3208, it is possible to determine at a junction between the resistor 3206 and capacitor 3208 a voltage which represents the voltage across resistor 3206. This is scaled such that the voltage across resistor 3206 is correlated with the voltage across resistor 3204 and current therefrom can be measured. The relationship is as follows:

$$V_O = -I_C R_{ESR} - \frac{I_C}{sC_O}$$

$$V_O = -I_C\left(\frac{1 + sR_{ESR} C_O}{sC_O}\right)$$

$$V_{CO} = \frac{-I_C}{sC_O}\left(\frac{1 + sR_{ESR} C_O}{1 + sR_1 C_1}\right)$$

$$R_1 C_1 = R_{ESR} C_O$$

$$V_{CO} = \frac{I_C}{sC_O}$$

$$V_{CO} = V_O + I_C R_{ESR}$$

Thus, it can be seen that the voltage at the junction between resistor 3206 and capacitor 3208 directly relates to the current through the capacitor 3202.

Figure 33:
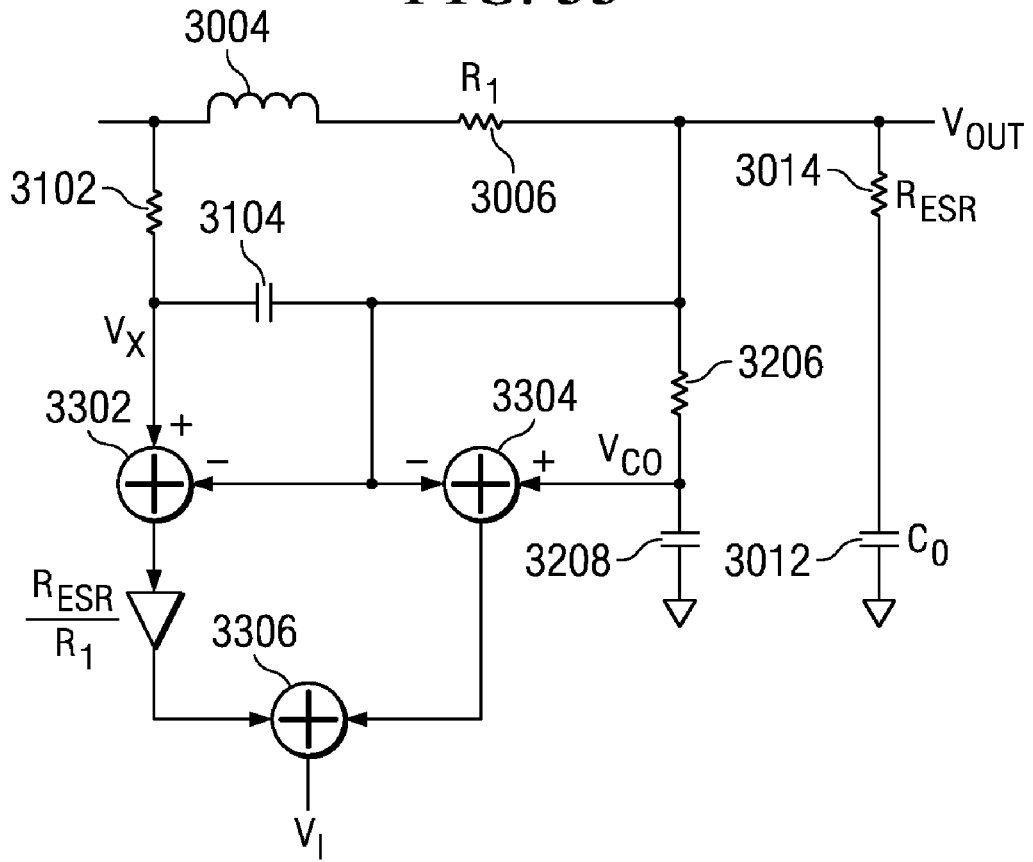
FIG. 33 illustrates a diagrammatic view of the method for measuring the total load current without Hall sensors.

Referring now to FIG. 33, there is illustrated an embodiment illustrating the current sensing of the inductor current and the capacitor current of the embodiments of FIGS. 31 and 32. The voltage $V_x$ from the junction between resistor 3102 and capacitor 3104 is input to one side of a summing junction 3302, the other side connected to the output voltage $V_O$. The voltage $V_{CO}$ from the junction between resistor 3206 and resistor 3208 is input to a summing junction 3304. Both summing junctions 3302 and 3304 are operable to subtract the voltage $V_{CO}$ and $V_X$ from the output voltage. The output of the summing junction 3302 is normalized to $R_{ESR}$ by multiplying by the function of $R_{ESR}/R_1$, where $R_1$ is the value of resistor 3006. Thus, this output can be summed with a summing junction 3306 with the output of summing junction 3004 to provide the voltage $V_i$, the intermediate voltage. This represents the voltage across the resistor 3014, which can then be utilized to determine current, as this voltage represents the current $I_{OUT}$ through a resistor of a value $R_{ESR}$. From an implementation standpoint, the voltage $V_X$ on the junction between resistors 3102 and 3104 is provided as an input to one of the analog inputs on the pin 652 for input to the multiplexer 656. The $V_{CO}$ output at the junction between resistors 3206 and 3208 is also provided as analog input. All the microcontroller requires is knowledge of the values of the resistor 3006 and the resistor 3014 in order to determine the current through the inductor and capacitor, respectively. The functions $R_{ESR}/R_1$ is a constant that can be determined from known values and this utilized in the microcontroller to perform the operations of the summing junctions 3302, 3304 and 3306 and the normalization stage.

DPWM

Figure 34:
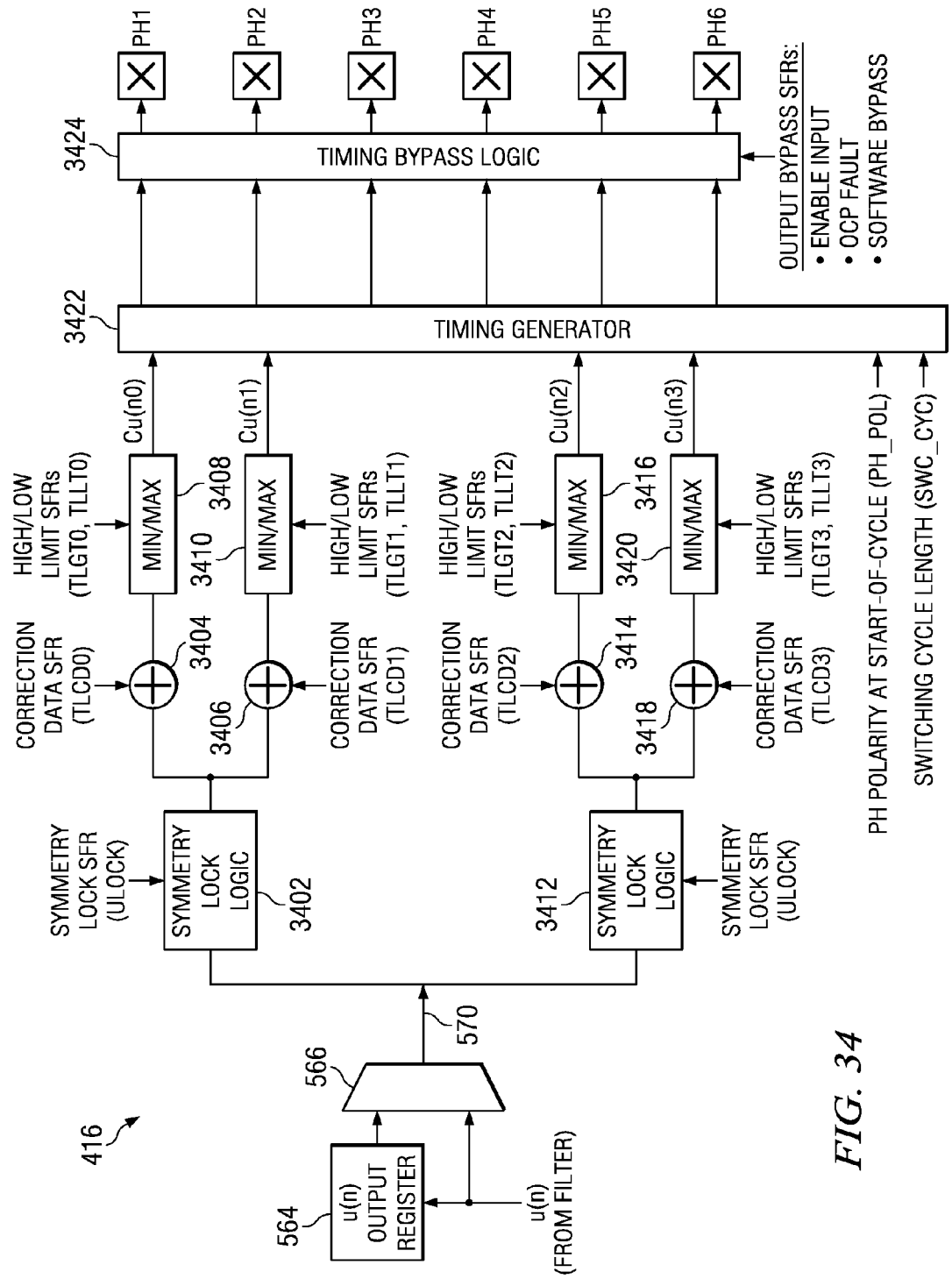
FIG. 34 illustrates a diagrammatic view of the DPWM.

Referring now to FIG. 34, there is illustrated a general block diagram of the DPWM 416. As noted hereinabove, the DPWM 416 is a state machine that is operable to generate up to six phases for use in driving external drivers that will control switches on the switching power converter. Each of these phases will be defined by a leading edge and a trailing edge, either leading or trailing edge being rising or falling. Either the u(n) signal from the digital compensator 412 or a microcontroller generated PID value from the register 564 is provided on the bus 570 as an input to the DPWM 416. The original u(n) represents a number of clock cycles that the PH1 output is turned on per frame. The DPWM 416 provides for highly flexible operation, which is operable to accommodate various pulse width and phase modulation schemes. Phase-to-phase timing can be programmed for fixed (or zero) dead time, or the microcontroller 440 can dynamically control dead time during converter operation. The DPWM 416 may be clocked at 200 MHz (5 nS resolution) or 50 MHz (20 nS resolution), depending on the setting associated therewith, these clocks generated by the PLL. It is noted that the DPWM is a state machine, such that, for each clock cycle, there is a result output by the state machine, as compared to an instruction based microprocessor or a DSP solution.

There are provided two paths from the input bus 570. The first path is associated with a Symmetry Lock logic block 3402, which is operable to interface with a Symmetry Lock SFR in the microcontroller 440. As noted hereinabove, there are a plurality of SFRs, some of which are not illustrated, each of these SFRs occupying a portion of the address space of the microcontroller 440, such that they can be written to or read from. The Symmetry Lock logic block 3402 is operable to latch each value output by the multiplexer 566 upon receiving a Data Ready signal. Since the digital compensator 412 operates at a clock rate of 10 MHz with a switching frequency of 500 kHz, for example, there will be many more samples of u(n) during a particular switching frame than may be required. However, u(n) can be changing and there may be modulation schemes and phase schemes that require an edge of the pulse to be sent based upon current data. The block 3402 latches each value and, upon the occurrence of a predetermined lock condition, the data will be "locked" into the logic block 3402. This situation occurs when, for example, the trailing edge of PH1 requires current data to determine the position thereof. Once the trailing edge occurs on PH1, a system may be set up that, for example, the leading edge of PH1, a relative edge to the trailing edge of PH1, calculates its position relative to PH1 based upon the locked data in the logic block 3402.

There are provided two separate paths output from the logic block 3402, a first path associated with a summation block 3404 and a second path associated with a summation block 3406. Each of the summation blocks 3404 and 3406 is operable to receive a 2's complement correction data value from a correction data SFR, labeled TLCD0 and TLCD1, respectively, which basically each provide an offset. There may be situations where the designer needs to compensate the mismatch of the components in the power supply. As such, it may be desirable to add an offset value increasing or decreasing the value of u(n). This would allow for the adjustment of dead time between two output phases. Once corrected, each of the paths flows to an associated limit block 3408 and 3410, respectively, which will provide a corrected u(n). The limit block 3408 is associated with the summation block 3404 and receives high and low limits, TLGT0 and TLLT0, wherein the limit block 3410 associated with the summation block 3406 receives high and low limits TLGT1 and TLLT1, these limits associated with respective SFRs. By providing two correction paths for each Symmetry Lock logic block, this allows a first edge to be defined based upon currently changing data and then subjected to two different correction factors and two different limit factors.

There is provided a second Symmetry Lock logic path associated with a logic block 3412, having associated therewith two paths associated with, in the first path, a summation block 3414 and the limit block 3416. The second path has associated therewith a summation block 3418 and a limit block 3420. These blocks have associated correction data and associated high/low limit values. This will provide two additional corrected u(n) values which can both be locked.

Each of the four corrected u(n) values form the blocks 3408, 3410, 3416 and 3420 are input to a timing generator 3422 which generates the phase values for output to a timing generator bypass logic block 3424. The length of a switching cycle can be defined by signal SWC_CYC and there is also provided via control of the microcontroller 440 a start of cycle signal DPWM_EN. The polarity of the initial pulse edge, rising or falling, is determined by PH_POL.

Symmetry Lock

Referring now to FIG. 35, there is illustrated a more detailed block diagram of the Symmetry Lock logic circuit. When enabled, the two Symmetry Lock logic blocks 3402 and 3412 store the value of u(n) once per switching cycle at a time specified by a register 3502, DPWMULOCK. The two latch u(n) values are paired with two trim and limit functions, resulting in four unique corrected u(n) functions, resulting in four unique corrected u(n) functions that can be mapped to any of the PHn outputs in any combination. The value of u(n) on the databus 570 is input to a data input of two latches 3504 and 3506 at the data input thereof. Each of the latches has a clock input. The clock input of latch 3504 is connected to the output of a leading/trailing edge select block 3508 which is controlled by the bit ULCK0_EDG bit of the register 3502. This is operable to select either the leading or trailing edge of one of the six phases PH1-PH6 that are selected by a multiplexer 3510. This is controlled by the first three bits of the register 3502. As noted, the latch is operable to latch each value of the u(n) data therein. The output of the latch 3504 is input to the trim and limit blocks 3512 and 3514, associated with the blocks 3404, 3408, 3406 and 3410 of FIG. 34. Similarly, there is provided in the second Symmetry Lock logic path a multiplexer 3516 controlled by the bits 4-6 of register 3502 for selecting one of the six phases and inputting that to a leading/trailing edge select block 3518, the output thereof driving the clock input of the latch 3506. The latch 3506 is associated with two trim and limit blocks 3520 and 3522 that correspond to blocks 3414 and 3416, and blocks 3418 and 3420.

The timing generator 3422 is comprised of a plurality of multiplexers and phase generators. Each path has a multiplexer 3526 associated therewith and a phase generator 3528, each of these being a pattern generator. Each multiplexer 3526 is operable to receive all four of the corrected u(n) values and, depending upon which one is mapped to the particular phase path, input that to the associated pattern generator 3528. The corrected u(n) values are mapped to one of the PHn outputs in any combination using the PHn_CNTL0 registers in the timing generator 3422. The pattern generators 3528 independently generate the PHn outputs responsive to the corrected u(n) values and the PHn_CNTL0 register values. This enables positive, negative or system management processor controlled dead times between the outputs which will be more fully discussed below. Each PHn output has its own pattern generator 3528 which may be programmed to be modulated by any u(n) value.

Trim and Limit

Figure 36A:
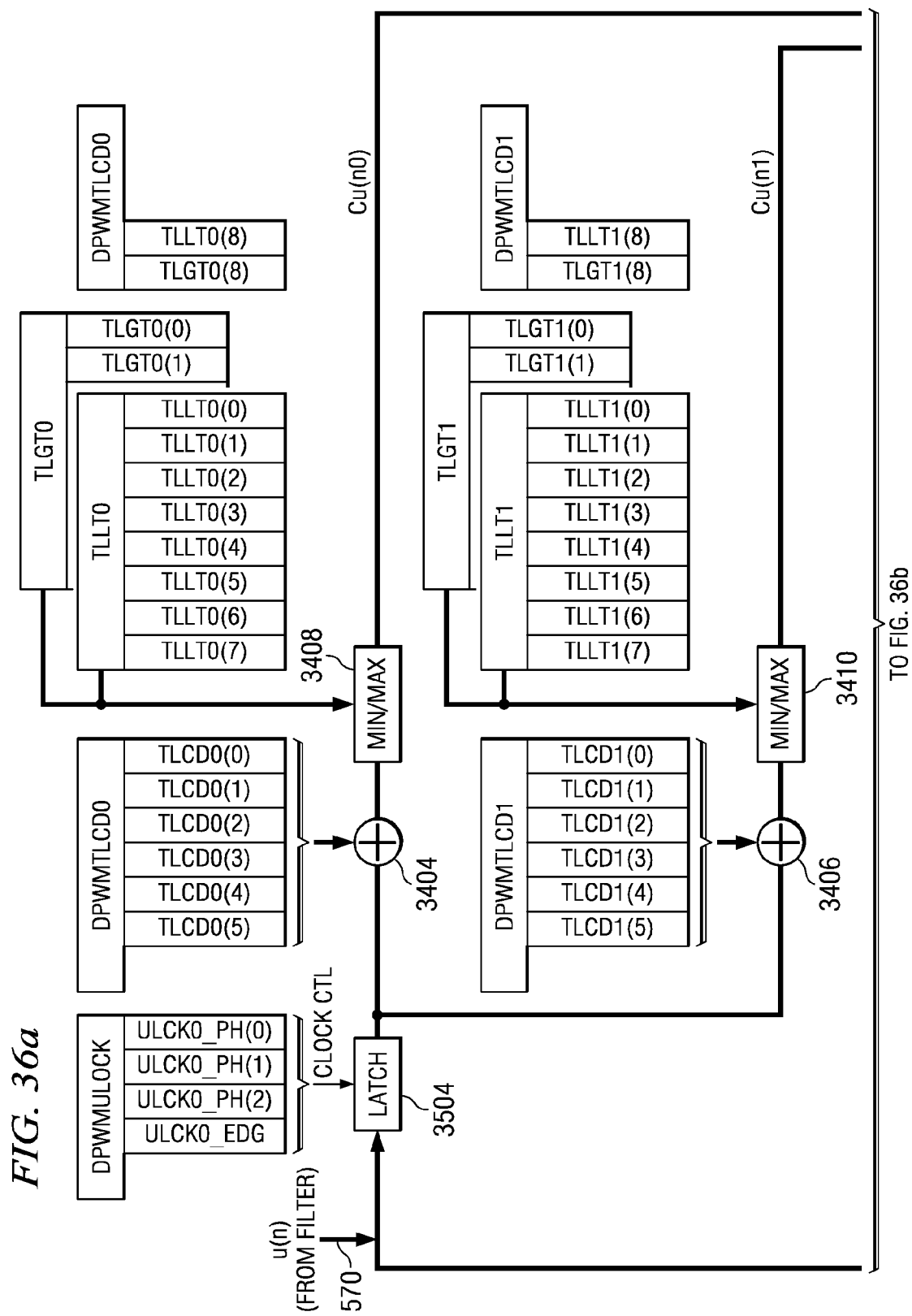
FIGS. 36a and 36b illustrate a block diagram of the trim and limit sub-system.
Figure 36B:
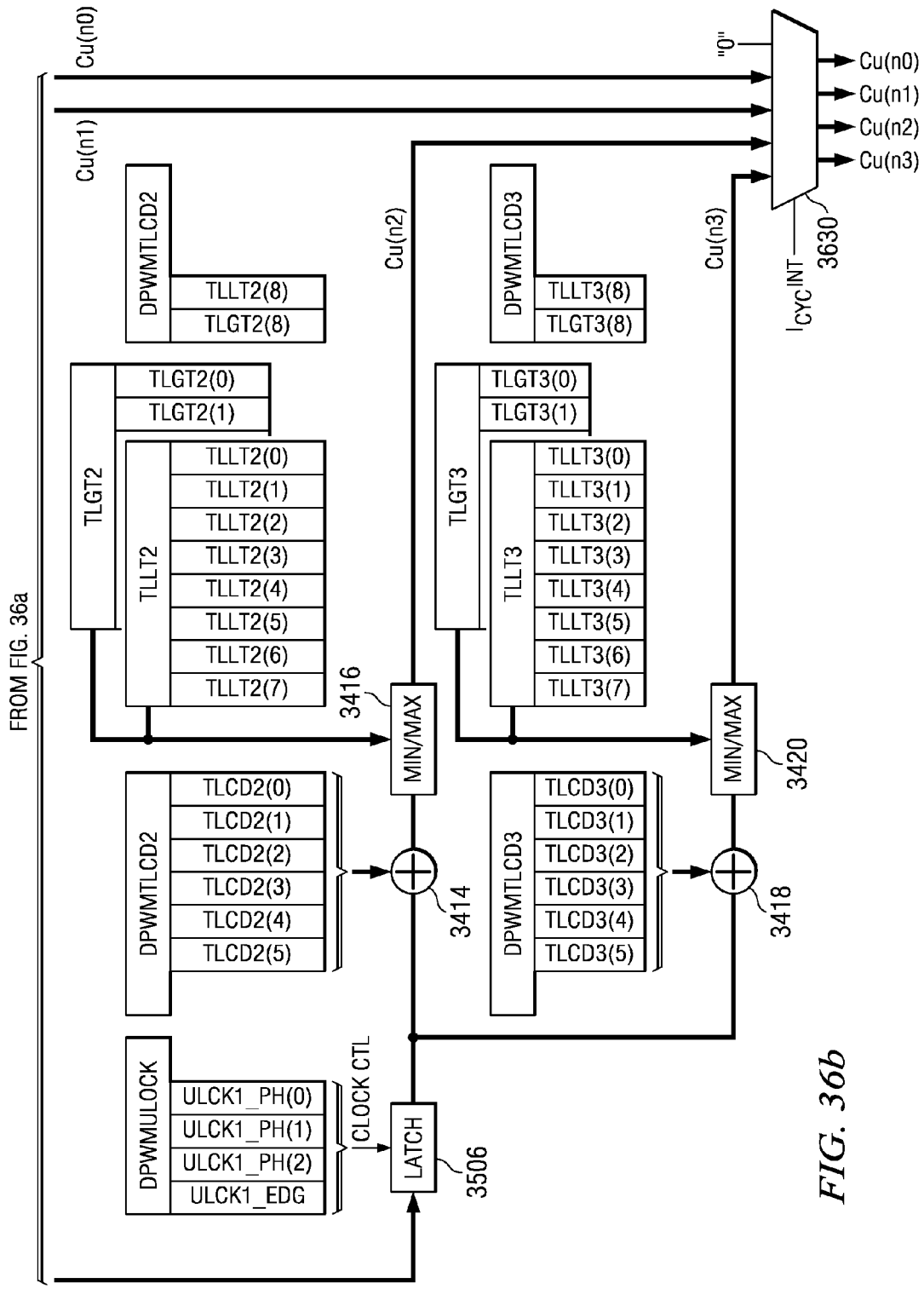

Referring now to FIGS. 36a and 36b, there is illustrated a more detailed diagram of the trim and limit sub-system, illustrating the registers and how they interface with various function blocks. The trim and limit sub-system enables the system management processor to set minimum and maximum limits and or bias each u(n). The u(n) output of the symmetry lock logic 3402 is applied to a two's complement adders 3404, 3406, 3414, 3418. The two's complement adders 3404, 3406, 3414, 3418 provide the means to apply a positive or negative offset to each u(n) value by writing the offset value to the trim-and-limit correction data register (DPWMTLCDn). This would provide the ability, for example, to positively or negatively adjust the dead time between two phase output signals. The min/max logic 3408, 3410, 3416, 3420 determines the min/max range of each adder output is within the limiter settings on the associated low limit register (TTLTn) and high limit register (TLGTn). A multiplexer 3630 is operable to be disposed between each of the outputs of the limiters 3408, 3410, 3416 and 3420 for forcing the operand to "0" such that the duty cycle of the output PH1-PH6 will be terminated when ICYC IRQ happens. This provides protection to the system from exposure to long term over current conditions. Note that, although the multiplexer 3630 is illustrated as a single multiplexer, there is actually a separate multiplexer for each cu(n) output.

Figure 37:
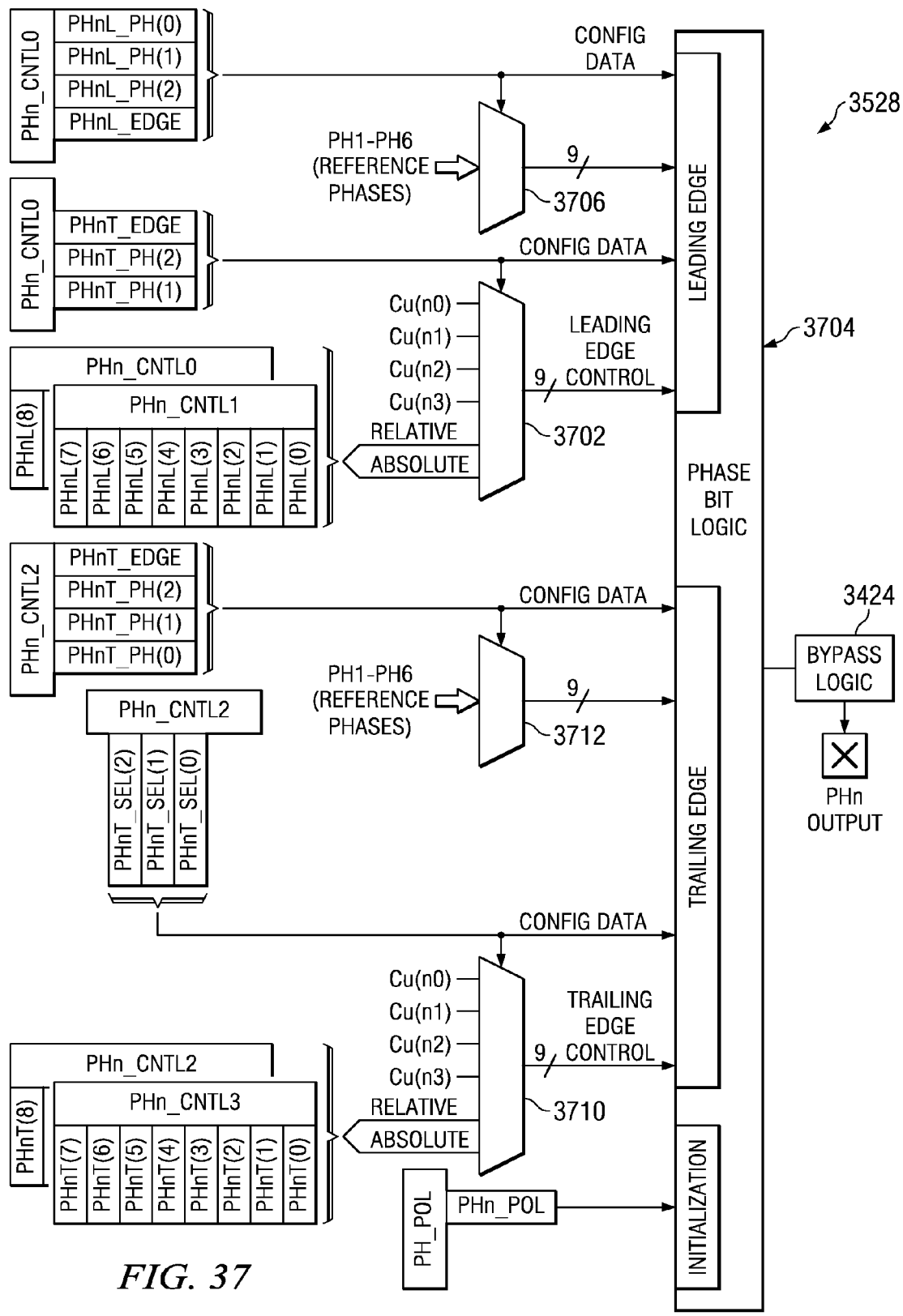
FIG. 37 illustrates a block diagram of the DPWM timing register program model.

Referring now to FIG. 37, there is illustrated a more detailed block diagram of the pattern generator 3528 for one of the phases. The timing of each PHn output is controlled by the programmed settings in the control registers PHn_CNTL0 through PHn_CNTL3. Each phase output is allowed to have a maximum of two transitions per switching cycle. Programming the DPWM consists of initializing the control registers, then programming the leading and trailing edge control registers for each PHn output that is used in the application. In this way, the dead times between control signals of complementary switches may be programmed using the pattern generators 3528 as described below. Each of the phase generators is divided into two sections, one for processing the leading edge and one for processing a trailing edge. As will be described hereinbelow, each phase generator is based upon a leading or trailing edge. It is the generation and positioning of this edge that is handled by the state machine. Each edge is associated with a specific timing type. The timing type is an absolute time, wherein edge is defined as one that unconditionally occurs at a specific time-tick. Relative time is associated with an edge that occurs a prescribed time after its reference edge transitions. For example, normally PH1 has a leading edge that occurs at time-tick #1 with a pulse width that is defined as a finite value of the u(n). The leading edge of PH2 is a relative edge, in some power converters, wherein the leading edge thereof occurs a number of time-ticks after the falling edge of PH1. Another is hardware modulation timing, which is associated with an edge that occurs at a time specified by the value of one of the four corrected u(n) modulation terms.

Each of the leading edge and trailing edge functionalities have associated therewith a portion of the multiplexer 3526. The leading edge portion has a multiplexer 3702 associated therewith which is operable to select one of the four corrected u(n) values, or a "relative" or a "absolute" input. These inputs are provided by the PHn_CNTL as one register for the lowermost eight bits and a ninth bit from the PHn_CNTL0 register. These are SFR control registers. This provides a leading edge control value for the leading edge portion. Configuration data is provided that is the select input to the multiplexer 3702 and is provided by the three lowermost bits of a PHn_CNTL0 SFR. The information in these three bits is also input, along with the output of the multiplexer 3702, to a phase bit logic block 3704 that is operable to carry out the operations associated with defining the leading edge and defining the trailing edge. Thus, a control value is what is provided by the multiplexer 3702. The reference phases are provided by multiplexer 3706 that selects between one of the six phases as a reference phase in the event that this is a relative edge created. This multiplexer is controlled by the four lowermost bits of the PHn_CNTL0 SFR.

The trailing edge is handled in a similar manner to the leading edge in that a multiplexer 3710 is provided for receiving the four corrected u(n) values and also Relative and Absolute inputs from the PHn_CNTL3 control register and the eighth bit from the PHn_CNTL2 register. This provides a trailing edge control. A multiplexer 3712, similar to the multiplexer 3706, selects one of the PH1-PH6 phases as the reference phase when a relative edge is being generated, and this is controlled by the four lowermost bits of the PHn_CNTL2 register.

The contents of the PHn_CNTL0 and CNTL2 registers is set forth in Tables 1 and 2.

TABLE 1

| | PHn_CNTL0: Phase n Leading Edge Control Register 0 |
|---|---|
| Bit 7 | PHnL(8): PHn Leading Edge Timing Data Bit 8<br>This is bit 9 (MSB) of the PHn_CNTL1 register |
| Bit 6-4 | PHnL_SEL2 - 0: Phase 3 Leading Edge Control Bits<br>000: PHn Leading Edge Timing Determined by u(n)0<br>001: PHn Leading Edge Timing Determined by u(n)1<br>010: PHn Leading Edge Timing Determined by u(n)2<br>011: PHn Leading Edge Timing Determined by u(n)3<br>100: PHn Leading Edge Timing is Relative to Another Timing Edge |

TABLE 1-continued

PHn_CNTL0: Phase n Leading Edge Control Register 0

|  |  |
| --- | --- |
|  | 101: PHn Leading Edge Timing is Relative to Another Timing Edge |
|  | 110: PHn Leading Edge Timing is Relative to Another Timing Edge |
|  | 111: PHn Leading Edge Timing is Absolute |
| Bit 3 | PHnL_EDGE: Relative Training Reference Edge Leading/Trailing Edge Select |
|  | 0: Relative Timing is Referenced to Leading Edge |
|  | 1: Relative Timing is Referenced to Trailing Edge |
| Bit 2-0 | PhnL_PHn - 0: PHn Leading Edge Relative Timing Reference Edge |
|  | 001: PHn Leading Edge Timing Relative to PH1 |
|  | 010: PHn Leading Edge Timing Relative to PH2 |
|  | 011: PHn Leading Edge Timing Relative to PH3 |
|  | 100: PHn Leading Edge Timing Relative to PH4 |
|  | 101: PHn Leading Edge Timing Relative to PH5 |
|  | 110: PHn Leading Edge Timing Relative to PH6 |

TABLE 2

PHn_CNTL2: Phase n Trailing Edge Control Register 2

|  |  |
| --- | --- |
| Bit 7 | PHnT(8): PHn Trailing Edge Timing Data Bit 8 |
|  | This is bit 9 (MSB) of the PHn_CNTL1 register |
| Bit 6-4 | PHnT_SELn - 0: Phase 2 Trailing Edge Control Bits |
|  | 000: PHn Trailing Edge Timing Determined by u(n)0 |
|  | 001: PHn Trailing Edge Timing Determined by u(n)1 |
|  | 010: PHn Trailing Edge Timing Determined by u(n)2 |
|  | 011: PHn Trailing Edge Timing Determined by u(n)3 |
|  | 100: PHn Trailing Edge Timing is Relative to Another Timing Edge |
|  | 101: PHn Trailing Edge Timing is Relative to Another Timing Edge |
|  | 110: PHn Trailing Edge Timing is Relative to Another Timing Edge |
|  | 111: PHn Trailing Edge Timing is Absolute |
| Bit 3 | PHnT_EDGE: Relative Training Reference Edge Leading/Trailing Edge Select |
|  | 0: Relative Timing is Referenced to Leading Edge |
|  | 1: Relative Timing is Referenced to Trailing Edge |
| Bit 2-0 | PHnT_PHn - 0: PHn Trailing Edge Relative Timing Reference Edge |
|  | 001: PHn Trailing Edge Timing Relative to PH1 |
|  | 010: PHn Trailing Edge Timing Relative to PH2 |
|  | 011: PHn Trailing Edge Timing Relative to PH3 |
|  | 100: PHn Trailing Edge Timing Relative to PH4 |
|  | 101: PHn Trailing Edge Timing Relative to PH5 |
|  | 110: PHn Trailing Edge Timing Relative to PH6 |

Bypass Logic

Figure 38:
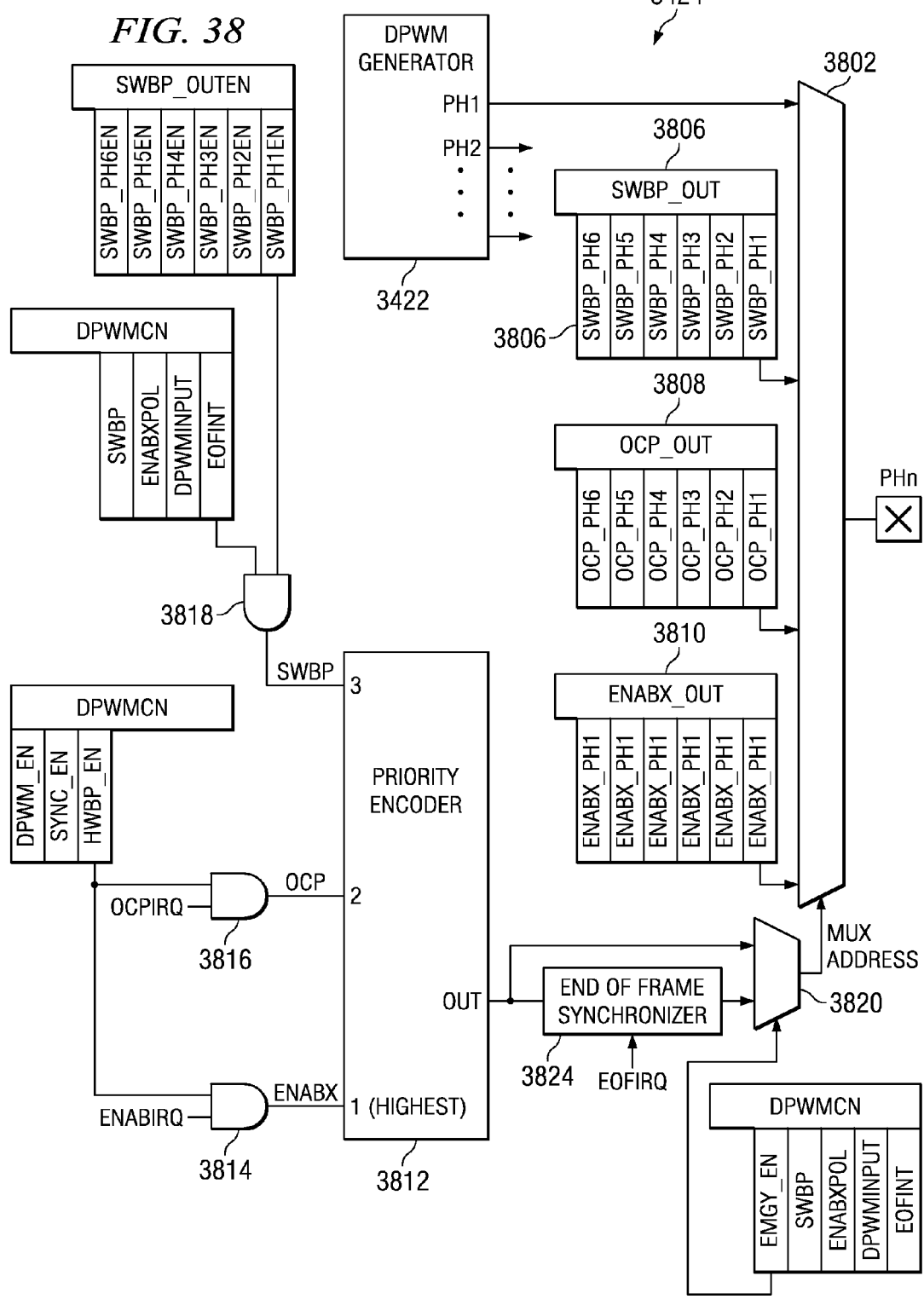
FIG. 38 illustrates a block diagram of the shut-down sources.

Referring now to FIG. 38, there is illustrated a diagrammatic view of the bypass logic block 3424. The bypass logic is operable to safeguard the power supply system by forcing each PH output into user-defined "safe" states during supply shutdown. The embodiment of FIG. 38 shows the bypass logic for each phase. An output multiplexer 3802 is operable to select, on one input, the output of the DPWM pattern generator 3422, the default output, or one of three static pre-defined states contained in the Software Bypass (SWBP_OUT) SFR 3806, the over-current protection fault (OCP_OUT) SFR 3808, or the Enable (ENABX_OUT) bypass SFR 3810. Therefore, the three shutdown sources, in priority, are the enable input, the over-current protection fault and the software bypass (noting that the software bypass is initiated by the microcontroller 440). Both the ENABLE input and the OCP are hardware shutdowns and are enabled by setting a bit in the DPWMCN register to a logic "1" which bit is the HWBP_EN bit. When enabled, a supply shutdown occurs when either the enable input pin is forced to its off state or the over-current protection interrupt (OCPIRQ) interrupts are asserted. If both occur simultaneously, the higher priority ENABLE interrupt will prevail. The lowest priority shutdown source is software bypass, which is invoked by the microcontroller 440 by setting an SWBP bit in the DPWMCN register to a logic "1." This is all facilitated with a priority encoder 3812 wherein the DPWMCN SFR is connected to the highest priority input through an AND gate 3814 on one input thereof, the ENABIRQ interrupt connected to the other input. The DPWMCN HWBP_EN bit is also input to one input of an AND gate 3816, which has the output thereof connected to the second priority input, with the other input of AND gate 3816 connected to the OCPIRQ interrupt. The SWBP bit of the DPWMCN register is connected to one input of an AND gate 3818, the output thereof connected to the lowest priority input of the encoder 3812, the other inputs of the AND gate 3818 connected to the SWBP_PHnEN bit associated with the particular phase. The transition from DPWM output to any of the three-defined states can be programmed to occur on switching frame boundaries, or instantaneously by setting the EMGY_EN bit of the DPWMCN register to a "1." This is input to a control input of a multiplexer 3820, which selects either the direct output of the priority encoder 3812 or the output of an end-of-frame synchronizer block 3824 disposed between the other input of multiplexer 3820 and the output of the priority encoder 3812. The frame synchronizer block 3824 is controlled by the EOFIRQ, the end-of-frame interrupt. For this end-of-frame synchronizing, this indicates that all operations, the generation of all leading and trailing edges for all phases, will occur prior to the bypass mode. With the use of the bypass safeguards, the state of each of the phases can be predetermined. In this manner, it can be insured that a transistor will not be closed and power being directed toward an inductor to basically destroy the transistor or other parts of the power converter.

SYNC Mode

Figure 39:
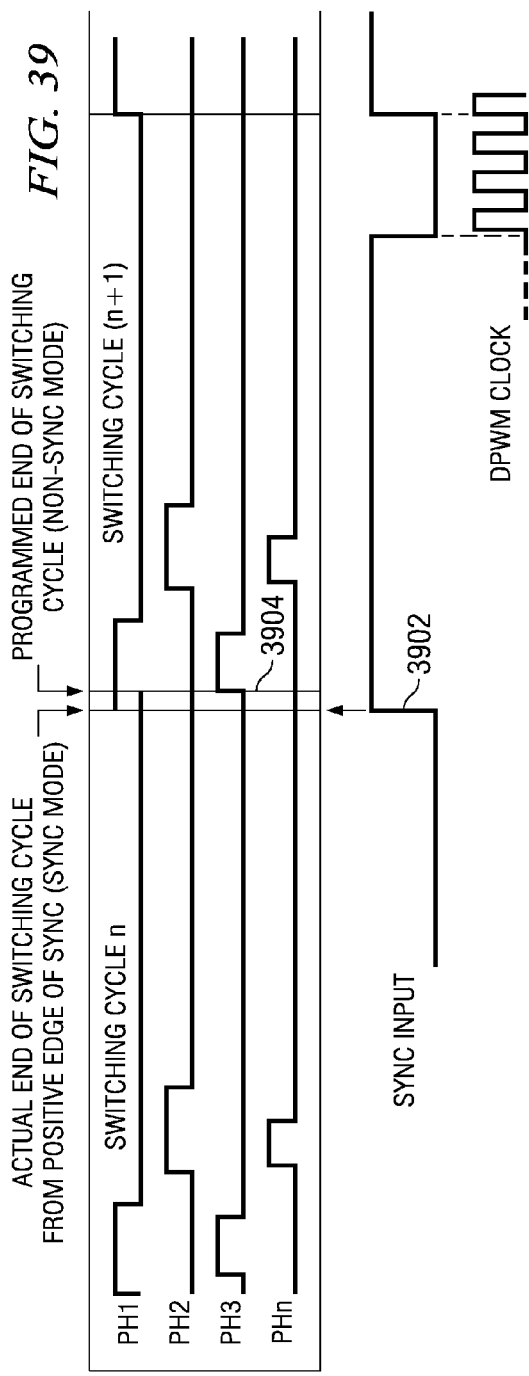
FIG. 39 illustrates a timing diagram for the sync operation.

Referring now to FIG. 39, there is illustrated a timing diagram depicting the SYNC Mode of operation. This mode allows the start of each switching cycle to be synchronized with an external clock. The user enables sync mode by assigning the SYNC input to the port I/O pins by setting a sync enable signal, SYNCEN, in the XBAR0 SFR and the SYNC_EN bit in the DPWMCN to a logic "1." A logic level sync pulse is applied to the SYNC input of the integrated circuit, the positive edge of which triggers (or re-triggers) the start of a new switching operation, shown in FIG. 39. It can be seen that when the SYNC input goes high, at an edge 3902, the switching cycle will terminate. The SYNC pulse must return low a minimum of three clock cycles of the DPWM prior to the next positive transition, as illustrated in the associated detail. The switching cycle in execution is unconditionally terminated and the new switching cycle initiated on the positive edge 3902 of the SYNC pulse. In non-sync mode, SWC_CYC in SFR register defines the switching cycle period.

The DPWMCN register is illustrated as follows:

| DPWMCNTL: DPWM Control Register Reset Value = 00000000 SFR Addresses: 7'h00 | | | | | | | |
|---|---|---|---|---|---|---|---|
| R/W | R/W | R/W | R/W | R/W | R/W | | R |
| DPWM_EN Bit 7 | SYNC_EN Bit 6 | HWBYP_EN Bit 5 | EMGY_EN Bit 4 | SWBYP Bit 3 | — Bit 2 | DPWMINPUT Bit 1 | EOFINT Bit 0 |

Bit 7 DPWM_EN: DPWM Enable Bit
    0: DPWM Disabled
    1: DPWM Enabled
Bit 6 SYNC_EN: Sync Input Function Enable Bit
    0: Sync Input Function Disabled
    1: Sync Input Function Enabled
Bit 5 HWBYP_EN: Hardware DPWM Bypass Enable (ENABLE or OCP interrupt asserted)
    0: Hardware DPWM Bypass Disabled
    1: Hardware DPWM Bypass Enabled
Bit 4 EMGY_EN: Emergency Shutdown Mode Enable Bit
    0: Emergency Shutdown Mode Disabled (wait for end-of-frame to switch to bypass mode)
    1: Emergency Shutdown Mode Enabled (switch to bypass mode immediately)
Bit 3 SWBP: Software DPWM Bypass Control
    0: Software DPWM Bypass Off
    1: Software DPWM Bypass On
Bit 2 Unused
Bit 1 DPWMINPUT: DPWM input MUX control bit
    0: Filter output selected (high-speed hardware modulates DPWM).
    1: MCU selected (MCU directly modulates DPWM)
Bit 0 EOFINT: End-of-Frame Interrupt Status Bit
    0: Switching Frame in Progress
    1: Switching Frame Completed.

Figure 39A:
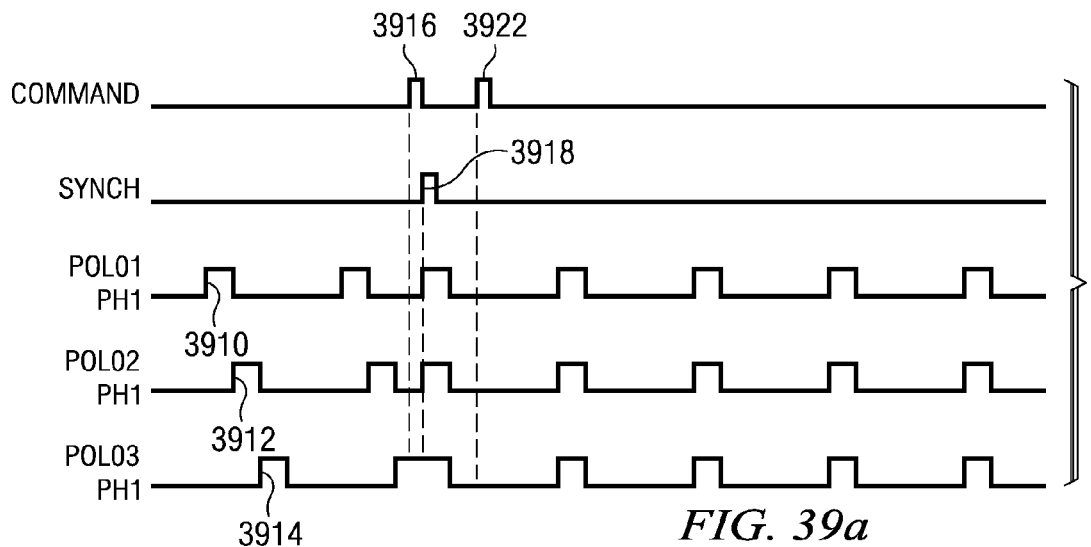
FIGS. 39(a)-39(c) illustrate timing diagrams for the SYNC function.

Referring now to FIG. 39a, there is illustrated a plurality of different scenarios for handling the SYNC operation. In general, the preferred operational mode is to transmit a command to the slave portion of each of the POLs 140 that enables the SYNC operation. Once this is enabled, in the preferred mode of operation, the rising edge of the SYNC signal will result in an initiation of a switching cycle, i.e., it will reset and start the switching cycle counter (the length of the switching cycle in counts of the switching cycle counter is a parameter that is downloaded to an associated SFR). Additionally, what the SYNC command does by setting the SYNC enabled bit is to define for the crossbar matrix 646 the mode of operation wherein SYNC is now one of the active inputs and this must be assigned to a pin. This will be assigned to a pin depending upon what, if any, other resources are associated with the crossbar matrix. If the SMBus is enabled in the initial configuration, for example, this will occupy the lower priority pins associated therewith, this typically being two pins. The next unassigned pin of lower priority in port "0" will then be assigned to the SYNC enable input signal. When this pin is pulled high, this will create a rising edge that is recognized by the processor core 602 to initiate a switching cycle. In the preferred mode when operating in the SYNC mode of operation, each switching cycle requires a SYNC command for the initiation thereof, i.e., it is externally enabled. A SYNC disable command is required wherein a "0" is written to the SYNC enable bit of the DPWMCN register. This will be described in more detail hereinbelow.

With reference to FIG. 39a, there is illustrated a timing diagram of the preferred mode. This is illustrated with respect to three POLs for Phase I thereof. Three of these POLs have been illustrated. Initially, each of the POLs operates its associated DPWM and the switching cycle thereof from its internal clock. Therefore, the leading edge of the Phase I pulses of the various POLs 140 in a network will not necessarily be synchronized, i.e., they will be different in time. This is illustrated in FIG. 39a with three different edges, 3910, 3912 and 3914 for the three different POLs 140 in a network. A command 3916 is sent, illustrated by a pulse representation, at a first time. This command 3916 is, as described hereinabove, is basically transmitted in accordance with the protocols associated with the SMBus or any other protocol that may be utilized for serial data communication. This is typically transmitted with the address of the POL and the address of the destination register in the target POL, followed by data, in the form of the command. This command basically defines the address of the POL and then the address of the particular SFR to which data is to be written. This bus address will be that of the DPWMCN SFR, bit 6, wherein a "1" is written thereto. Once this SYNC enable signal bit is toggled to a "1," then the crossbar switch 646 will assign the appropriate pin thereto. It is noted that the XBARE crossbar enable bit was written to earlier during initial configuration of the part since the serial data bus would have been required to have been available through the crossbar matrix 646. It is noted that the SYNC pin through the crossbar could have been enabled "on the fly" at any time just by writing ti the XBARO register, bit "1."

After the SYNC command has been transmitted, the DPWM of each of the POLs will then be disposed in a SYNC mode and they will not initiate an additional switching cycle until they receive a SYNC signal. The SYNC signal will, first of all, reset the counter, such that a switching cycle can be terminated earlier than the full count stored in the associated SFR. However, at the end of the full count for the particular switching cycle, which is a configured value that is one of the operating parameters downloaded to the POL during operation thereof, the next switching cycle will be initiated only upon receiving the SYNC signal. A SYNC signal is generating with a rising edge 3918. When this rising edge occurs, each of the POLs will reset their internal counter and initiate their switching cycle such that the rising edge of Phase I thereof is initiated. This rising edge could be delayed depending upon the configuration. However, for illustrative purposes, all rising edges of Phase 1 of each of the POLs are illustrated as occurring at the time of the rising edge 3918. If the SYNC operation, in the preferred operation mode, is maintained, a SYNC signal will be required for the next switching cycle. In the preferred operating mode, what occurs is that a second command 3922 is generated to disable the SYNC command by writing a "0" into bit "6" of DPWMCN SFR. Thereafter, the non SYNC mode of operation is continued wherein the next switching cycle will begin at the end of the count cycle for the switching cycle length, a pre-stored value. Of course, since the clocks may be slightly different, there may be some drift over time and the SYNC signal may be sent at a later time.

Figure 39B:
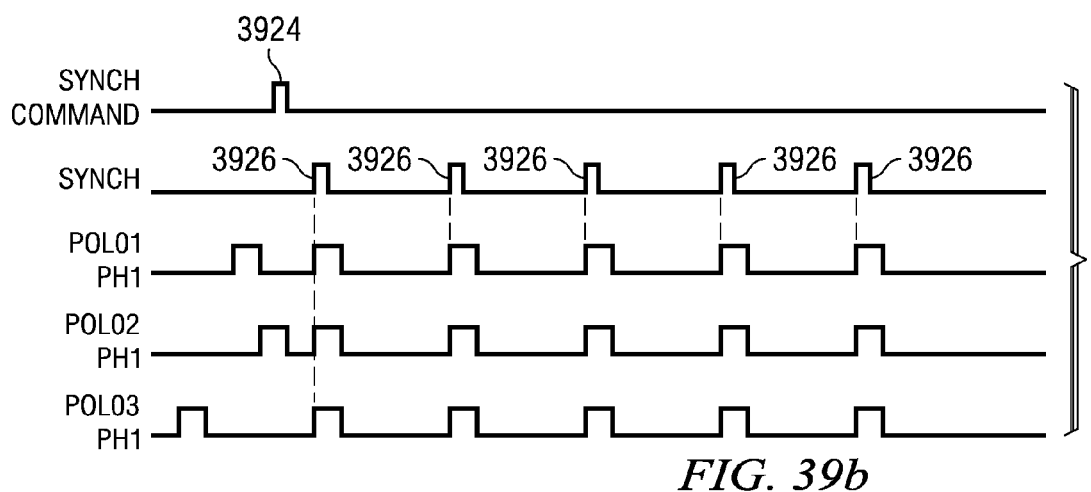

Referring now to FIG. 39b, there is illustrated an alternative operational mode. In this operational mode, the three POLs operate asynchronously until a command 3924 is sent, this being a SYNC command. This places the system into a SYNC mode and maintains it in the SYNC mode. This requires a SYNC rising edge 3926 to be generated for each switching cycle, the master would have to control the switching cycle initiation for each of the POLs on a continuing basis. This would be the case if the SYNC signal were not disabled.

Figure 39C:
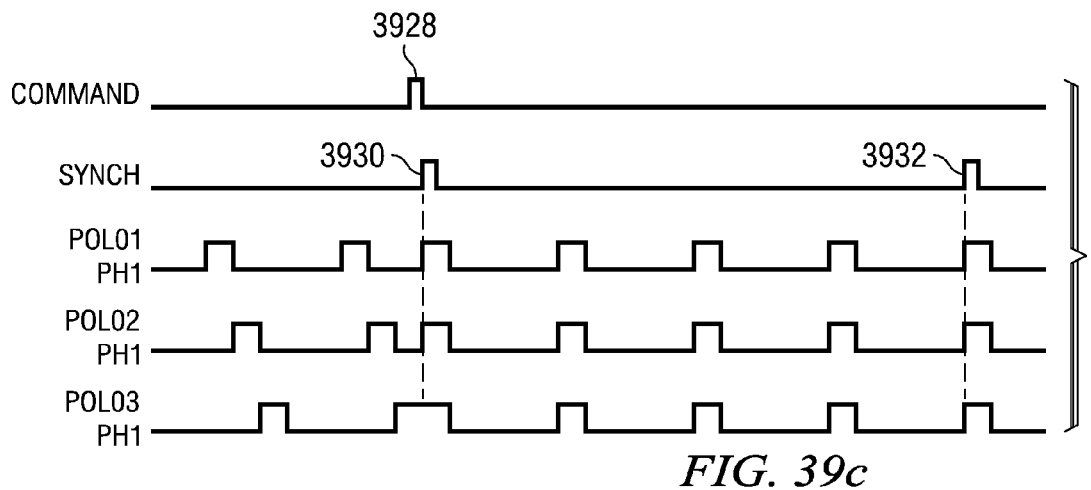

Referring now to FIG. 39c, there is illustrated a further alternative operational mode. In this mode, a command signal 3928 is generated for the SYNC command. This enables the SYNC mode. In this mode, what occurs is that the rising edge of the SYNC signal, a rising edge 3930, will reset the switching cycle counter, upon which reset operation a new switching cycle will be initiated. If, at the end of the count, there is no earlier reset, the system will automatically reset and it will operate similar to the non SYNC mode and initiate another switching cycle. It is just that, without another SYNC command, the system will always be in a mode waiting for a potential reset signal that will terminate a switching cycle early. It can be seen that a later SYNC edge 3932 will again perform a reset and align all of the switching cycles of the different POLs.

Figure 39D:
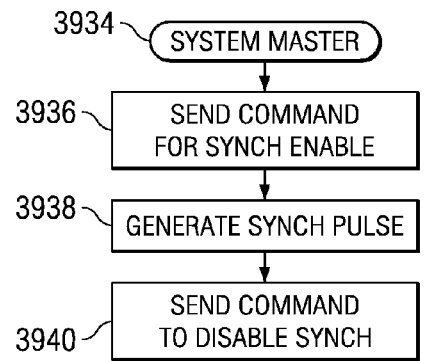
FIGS. 39(d)-39(f) illustrate flow carts for the operation of the SYNC function in the network of FIGS. 1a and 1b.

Referring now to FIG. 39d, there is illustrated a flow chart depicting the operation at the master in SYNC mode. This is initiated at block 3934 and then proceeds to a function block 3936 to send the SYNC command to enable the SYNC operation. Thereafter, a SYNC pulse is generated in a function block 3938, followed by a disable SYNC command in function block 3940, this corresponds to the operation in FIG. 39a.

Figure 39E:
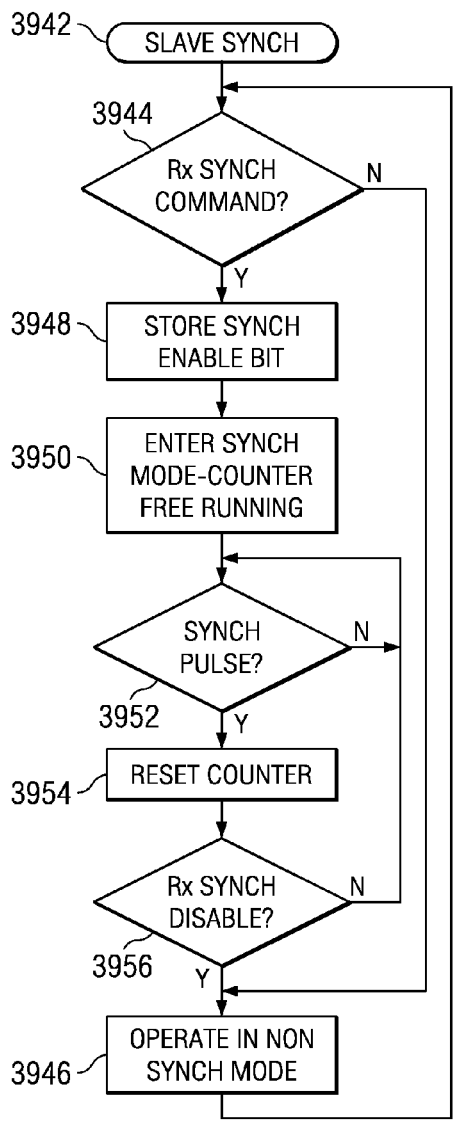

Referring now to FIG. 39e, there is illustrated a flow chart depicting the operation at the slave portion of the POL, which is initiated at block 3942 and then proceeds to a decision block 3944. At the decision block 3944, the system awaits the receipt of a SYNC command. If not received, the program flows along the "N" path to a function block 3946 to operate in a non-SYNC mode. When the SYNC command has been received, the program flows along the "Y" path to a function block 3948 to store the SYNC enable bit in the XBAR register. The program then flows to a function block 3950 to enter the SYNC mode, as the switching cycle counter is basically free running. The program then flows to a function block 3952 in order to wait for the receipt of the SYNC pulse. When received, the program flows along a "Y" path to a function block 3954 to reset the counter and initiate a new switching cycle. The program then flows to a decision block 3956 to determine if a SYNC disable command has been received. If not, the program flows along an "N" path to the input of the decision block 3952 in order to wait for the additional SYNC pulse. This is the mode associated with FIG. 39b. When a SYNC disable signal is received, the program flows along a "Y" path to the input of function block 3946 to operate in a non-SYNC mode.

Figure 39F:
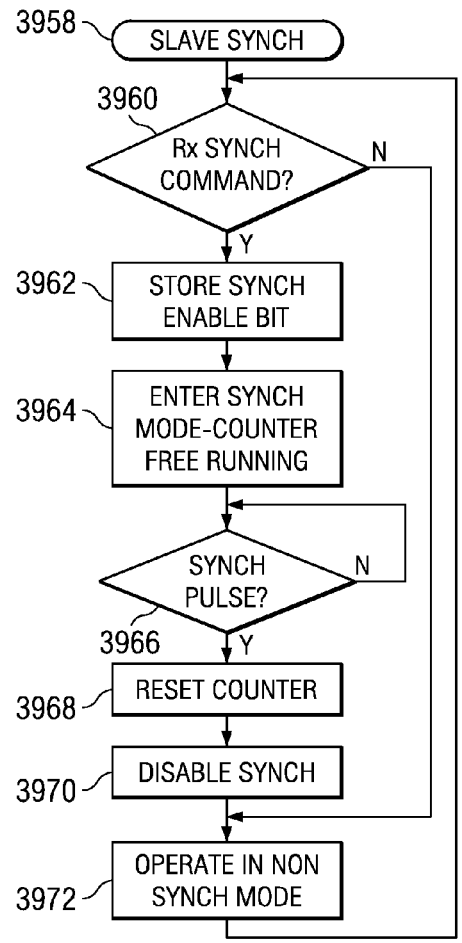

Referring now to FIG. 39f, there is illustrated a flow chart for an alternate operational mode, which is initiated at a block 3958 and then proceeds to a decision block 3960 to await the receipt of the SYNC command and, if not received, proceeds to a function block 3972 in order to operate in a non-SYNC mode. When received, the program flows along the "Y" path to a function block 3962 in order to store a SYNC enable bit (enabling the SYNC function) and then to a function block 3964 to enter the SYNC mode with the counter free running and not being automatically reset at the end of the switching cycle. The program then flows to a decision block 3966 to determine if the SYNC pulse has been received, which upon receipt causes the program to flow along a "Y" path to reset the counter at function block 3968 to initiate a new switching cycle and then to a function block 3970 wherein the SYNC operation will be automatically disabled. The program then flows back to input of function block 3972. In this operational mode, only a single SYNC signal is required in order to SYNC the operation of the system. Thus, for a SYNC signal that would be desired to be transmitted, all that is required is the transmission of a SYNC command followed by a SYNC pulse. If it is noted that the SYNC pulse is always transmitted via a separate transmission line.

Figure 40:
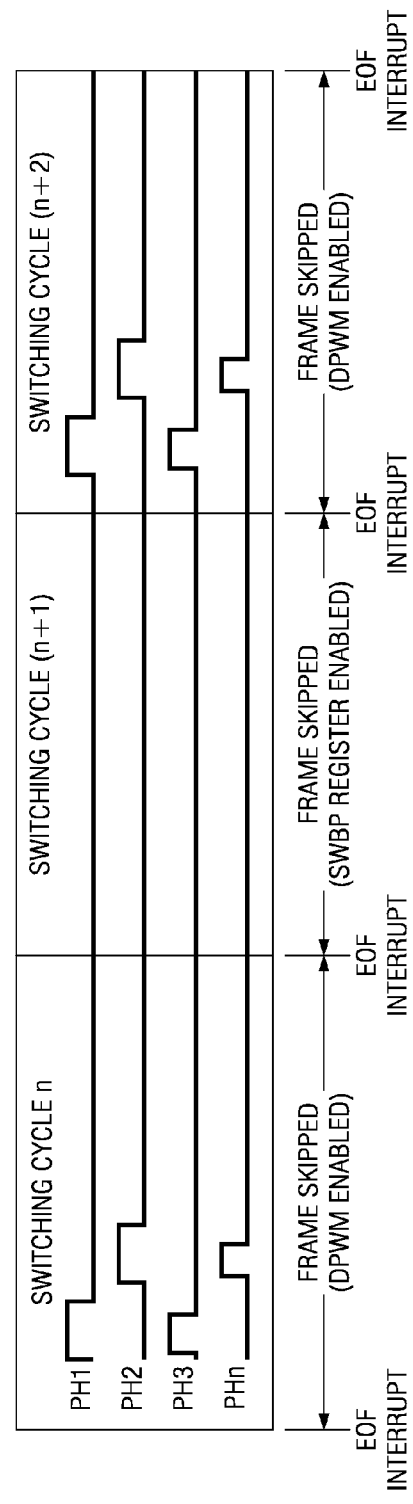
FIG. 40 illustrates a timing diagram for the frame skipping operation.
Figure 41:
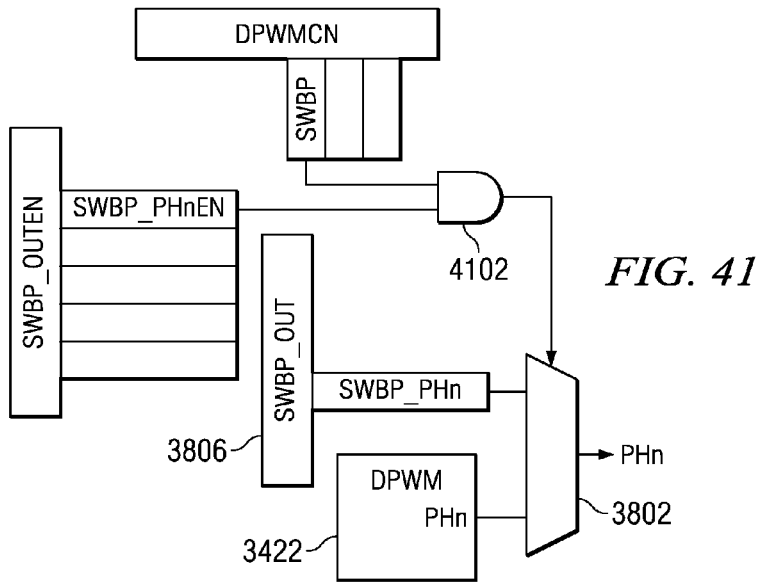
FIG. 41 illustrates a simplified block diagram of the bypass logic.

Referring now to FIG. 40, there is illustrated a timing diagram for the operation of frame skipping, with FIG. 41 illustrating a detail of the bypass operation of FIG. 38. In the illustration of FIG. 41, the SWBP_PHnEN bit of the SWBP_OUTEN SFR is input to one input of an AND gate 4102, the other input thereof connected to the SWBP bit of the DPWMCN register. For frame skipping, even at a minimum PWM duty cycle, system losses at minimum may be insufficient to prevent $V_{OUT}$ from rising above its specified maximum. Frame skipping reduces the effect of energy transferred to the load by momentarily shutting the supply output off on alternate cycles. It is analogous to pure skipping, but applies to all PH outputs. In reference to the timing diagram of FIG. 40, it can be seen that each PHn bit has a corresponding PHn enable bit in SWBP_OUTEN and a SWBP bit in SWBP_OUT. The end-of-frame interrupt interrupts the microcontroller 440 at the end of each switching cycle. When this occurs, the microcontroller 440 will clear the SWBP bit in DPWMCN register, forcing the output multiplexer 3802 for each PH output to pass either the DPWM output (active switching cycle), or the OFF state contained in SWBP_OUT. Frame skipping can be configured to skip any number of cycles. Normal (continuous active frame) load resumes when firmware detects an increase in output loading.

Figure 42:
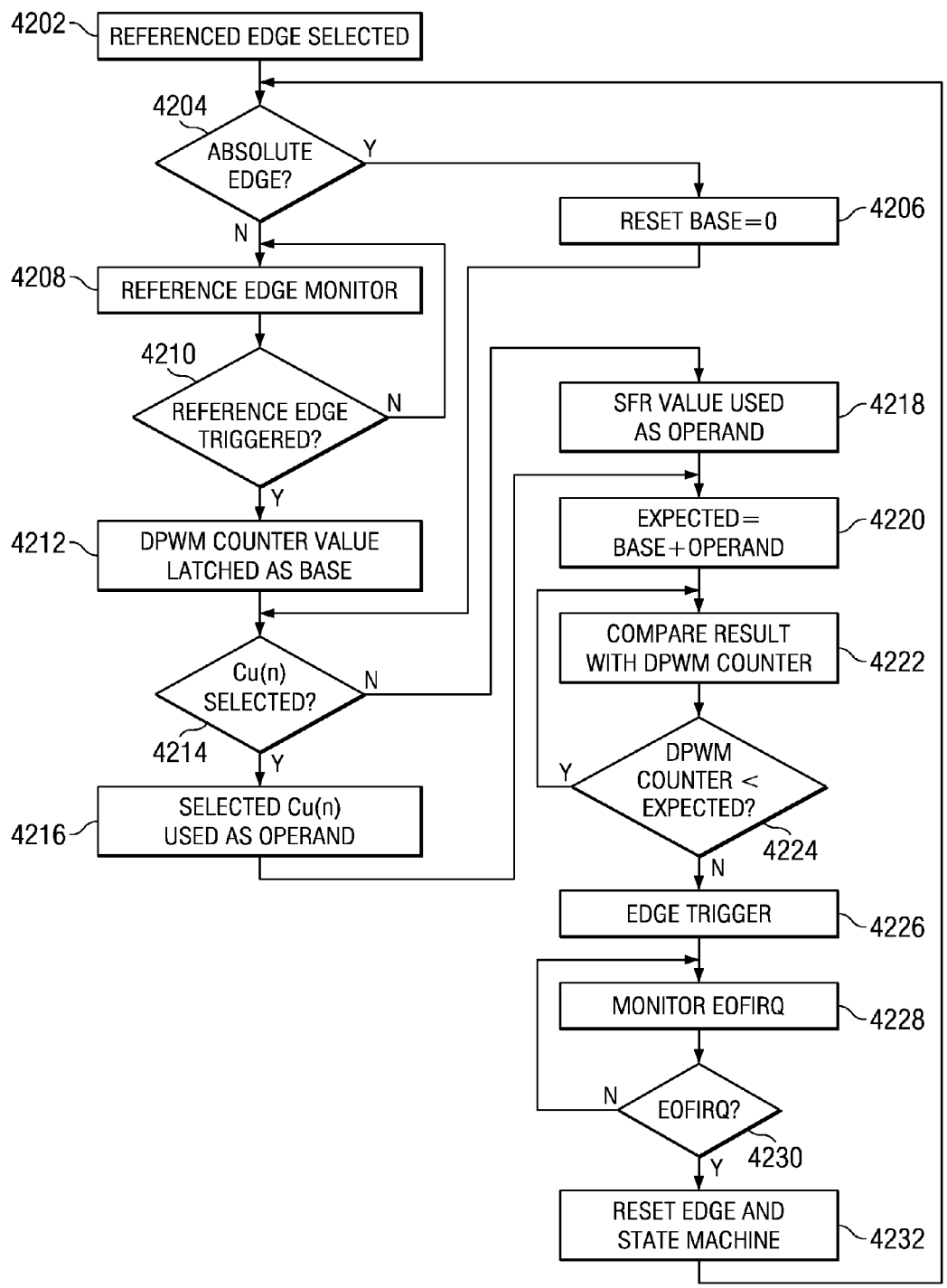
FIG. 42 illustrates a flow chart for the operation of the pattern generator for creation of the edges of the various phases.

Referring now to FIG. 42, there is illustrated a flow chart depicting the operation of creating an edge in a driving pulse in the pattern generator. Each edge is created similar to another edge by this procedure, such that the pattern generator is operable to operate on edges, such that all that needs to be defined by the power supply designer is the parameters of an edge, whether it is an absolute edge, a relative edge, how many ticks to wait before generating the edge, whether it is a leading edge or a trailing edge and whether it is falling or rising. The program is initiated at a block 4202 wherein the referenced edge is selected in the appropriate phase, i.e., either the leading edge or the trailing edge. The program then flows to a decision block 4204 to determine if it is an absolute edge. An absolute edge, as described hereinabove, is one that has a defined starting point from the edge of the initiation of the frame. If so, the program flows along the "Y" path to a function block 4206 to reset the base to a value of "0." If it is not an absolute edge, then the program flows along the "N" path to a function block 4208 to monitor for the reference edge, i.e., to determine when the reference edge has occurred.

This program flows to a decision block 4210 to determine if it has been triggered and it will maintain itself in a loop until such time, at which time it will flow along the "Y" path to a function block 4212 to latch the value of the DPWM counter as the base value. This basically sets the reference edge as the base. The program then flows to a decision block 4214 to determine if the corrected value of u(n) is selected. This is also the point in the program to which the function block 4206 flows. If the corrected u(n) is selected, the program flows along the "Y" path to a function block 4216 to select the corrected u(n) as the operand. If not, the program flows along the "N" path to a function block 4218 to select the value from the SFR register as the operand, this being a fixed value. Both function blocks 4216 and 4218 flow to a function block 4220 to set the expected value equal to the base value plus the value of the operand. The program then flows to a function block 4222 wherein the result is compared with the DPWM counter value. A decision block 4224 determines when the expected value is greater than or equal to the DPWM counter value, at which time it will flow along a "N" path to a function block 4226 to trigger the edge, i.e., create the edge. The program then flows to a function block 4228 to monitor for the end of frame interrupt and, if it occurs, the program will flow from a decision block 4230 along a "Y" path to a function block 4232 in order to reset the edge and the state machine, at which time the program will flow back to the input of function block 4202.

Figure 43:
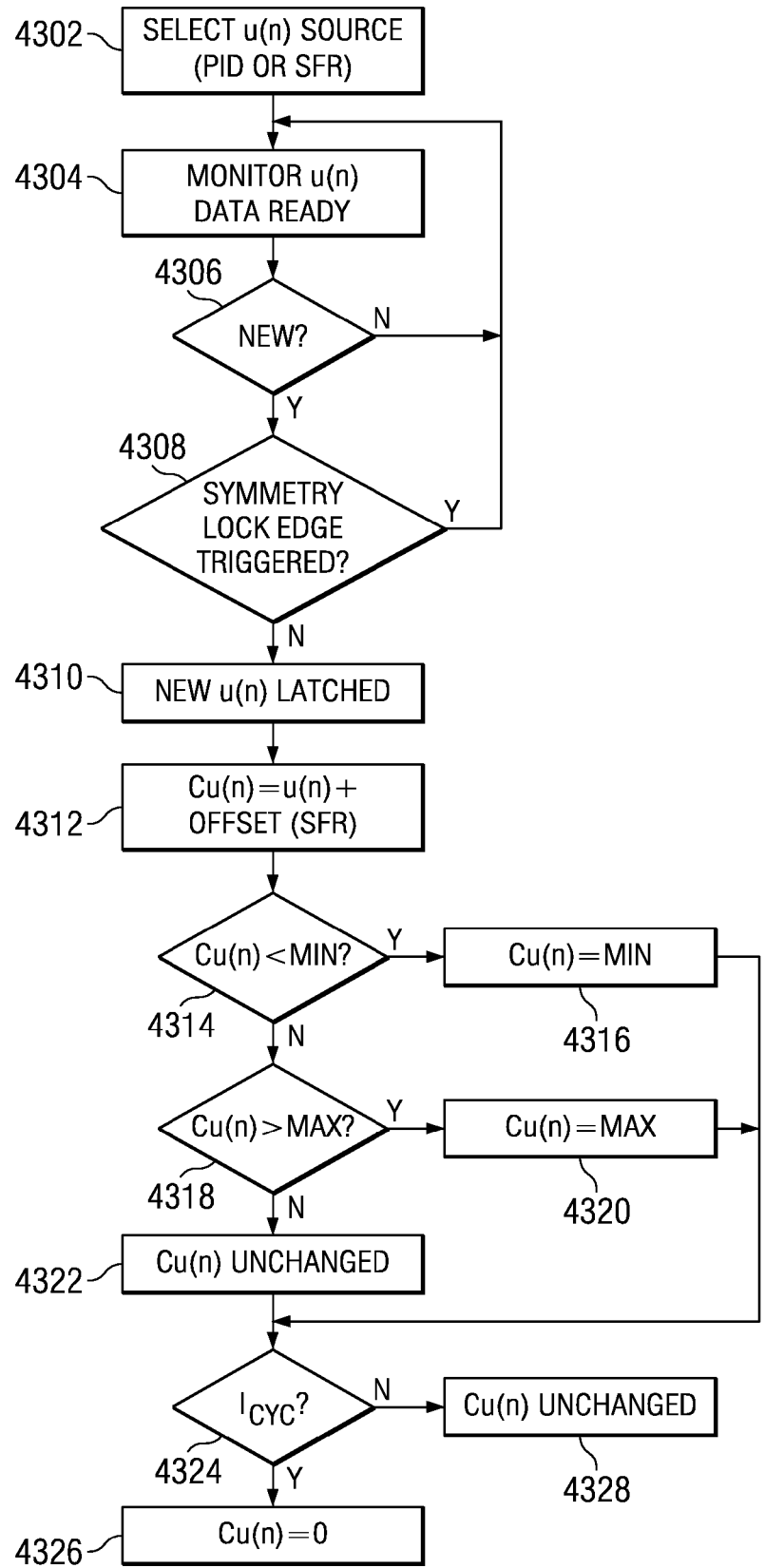
FIG. 43 illustrates a flow chart for the operation of the u(n) selection.

Referring now to FIG. 43, there is illustrated a flow chart depicting the operation of selecting the value of u(n) from either the PID or the SFR. The program is initiated at a block 4302 and then proceeds to a block 4304 to monitor if the corrected u(n) value is ready for latching. As described hereinabove, the data is ready after it has been processed through the conversion cycle of the ADC and then passes through the digital compensator. At the digital compensator, for example, the sinc filter may take longer to process due to the decimation aspect thereof. The program then flows to a decision block 4306 to determine if a new u(n) is ready and, if not, it loops back to function block 4304. When ready, the program flows to a decision block 4308 to determine if the Symmetry Lock edge has been triggered such that Symmetry Lock is present. If so, this indicates that the new u(n) should not be processed and the program flows back to the input of the function block 4304. If not, the program then flows to a function block 4310 to latch the new u(n) into the register and then to a function block 4312 to correct the value of u(n) by the offset to provide a corrected value thereof. The program then flows to a decision block 4314 to determine if a corrected value of u(n) is less than the minimum limit and, if so, then it flows to a function block 4316 to set the corrected value of u(n) to the minimum limit. If not, then the program flows to a decision block 4318 to determine if the corrected value of u(n) is greater than the maximum and, if so, the program flows to a function block 4320 to set the corrected value of u(n) to the maximum limit. If neither limit has been breached, the program flows to a function block 4322 to leave the corrected value of u(n) unchanged and then to a decision block 4324 to determine if the ICYC interrupt has occurred. If so, the program flows to a function block 4326 to set the corrected value of u(n) to "0" and, if the interrupt has not occurred, the program flows to a function block 4328 to leave the corrected value of u(n) unchanged.

Figure 44A:
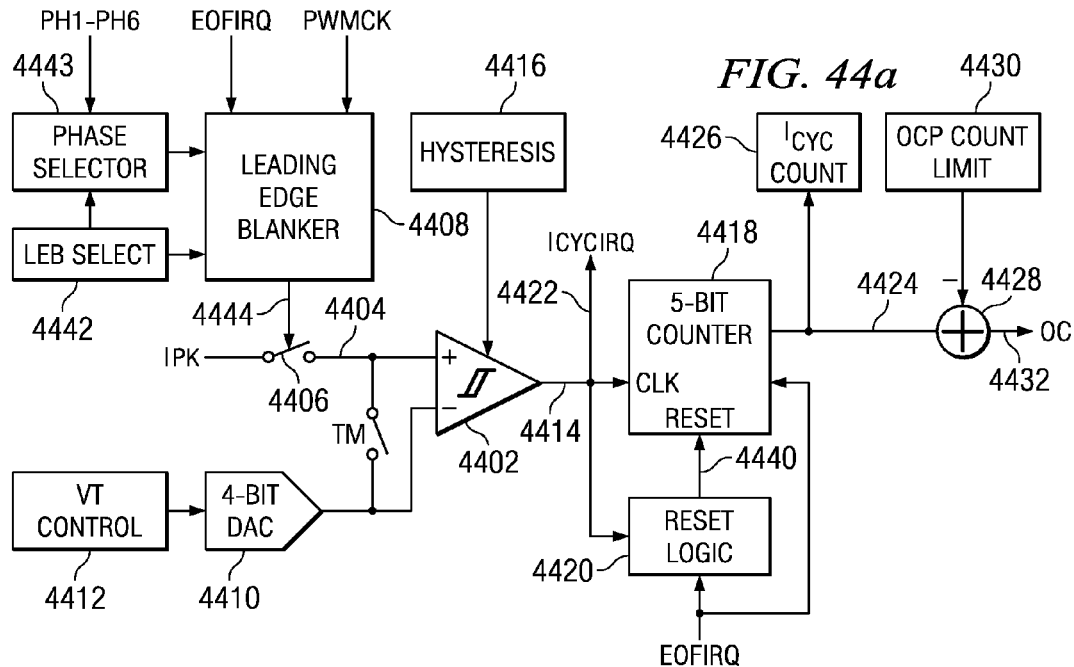
FIG. 44a is a functional block diagram of over current protection circuitry.

Referring now to FIG. 44*a*, there is more fully illustrated the over current protection circuitry 4400 of the digital pulse width modulator circuit 416 contained within block 446 (FIG. 4). The over current protection circuitry 4400 has provided thereto a voltage related to the output current IPK of the buck converter 402. The output current IPK is measured via a hall sensor which provides the measured current output. The voltage related to the output current IPK is provided to the positive input of a comparator 4402 via input line 4404. The switch 4406 on the input line 4404 is associated with the leading edge blanker circuit 4408 which be more fully discussed herein below. The negative input of the comparator 4402 is connected to the output of a 4-bit programmable digital to analog controller (DAC) 4410. The 4-bit programmable DAC 4410 provides a voltage related to the threshold current $I_{TH}$ to the negative input of comparator 4402. The 4-bit programmable DAC 4410 is programmed to provide a desired threshold by a control register 4412 having a control value stored therein. The comparator 4402 compares the provided voltage related to the output current IPK of the buck converter 402 with the programmed voltage related to the threshold current $I_{TH}$ and when the voltage related to IPK exceeds the voltage related to the threshold current $I_{TH}$, a primary interrupt (ICYCIRQ) is generated on line 4414 from the output of comparator 4402. The value to which the voltage related to the $I_{TH}$ current is programmed by the digital to analog controller 4410 is based upon the limits of the buck converter 402 to which the DPWM is connected. Hysteresis for the comparator 4402 is controlled from hysteresis control values from a control register 4416. The primary interrupt (ICYCIRQ) is provided to a clock input of 5-bit counter 4418. The primary interrupt (ICYCIRQ) is also provided to the input of reset logic 4420. The primary interrupt is output via line 4422 to the DPWM 416, the controller 440 and to the integrator stage of the PID 540.

The 5-bit control register 4418 monitors the number of occurrences of the primary interrupt. The present count for the number of occurrences is provided as an output on line 4424. The present primary interrupt count is stored within a control register 4426 called ICYC count. The present ICYC count on line 4424 is compared at a comparator 4428 with an over current protection count limit provided from register 4430. The OCP current limit comprises the maximum number of occurrences of primary interrupt ICYCIRQ in consecutive frames that may occur. The present ICYC count from the 5-bit counter 4418 is compared with the OCP count limit, which is stored in register 4430, at comparator 4428, and if the ICYC count from the 5-bit counter 4418 equals the OCP count limit, a secondary interrupt OCPIRQ is generated from the comparator 4428 on output line 4432. The secondary over current interrupt is provided to the DPWM 416 to indicate the occurrence of a serious over current condition.

The primary over protection interrupt ICYCIRQ provides an indication of over current conditions which may or may not fix themselves in a next frame period. The occurrence of consecutive primary interrupt conditions are monitored by the 5-bit counter 4418 such that when a predetermined number of primary interrupts have occurred, the secondary interrupt OCPIRQ may be generated to indicate a more serious over current problem such as a dead short. The primary interrupt ICYCIRQ performs a number of functions within the switch power supply device described with respect to FIG. 1. The primary interrupt ICYCIRQ is provided to the DPWM 416 such that each of the switches connected to the phase outputs of the DPWM 416 are turned off. Additionally, the primary interrupt ICYCIRQ is provided to the PID 540 to hold the integrator to prevent it from overloading.

Figure 44B:
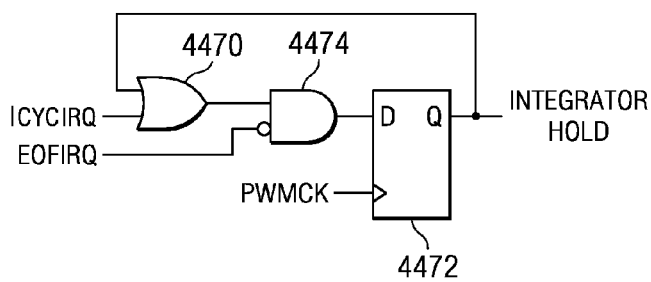
FIG. 44b illustrates an integrator hold circuit responsive to the primary interrupt.

Referring now to FIG. 44*b*, there is illustrated the circuit for providing the integrated hold to the PID 540. The primary interrupt ICYCIRQ is applied to a first input of OR gate 4470. The second input of OR gate 4470 is connected to the integrator hold output from a latch 4472. The output comprises the Q output of the latch 4472. The output of OR gate 4470 is applied to an input of AND gate 4474. The other input of AND gate 4474 is an inverted input of the end of frame interrupt EOFIRQ. The output of AND gate 4474 is connected to the D input of latch 4472. A clock signal PWMCK is applied to the clock input of the latch 4472.

Figure 44C:
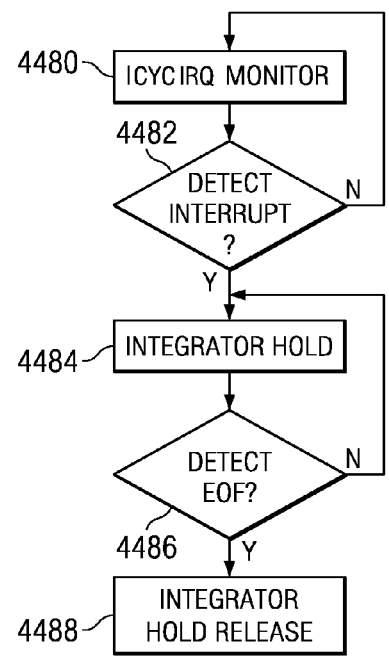
FIG. 44c is a flow diagram illustrating the operation of the integrator hold circuit of FIG. 44b.

FIG. 44c describes the operation of the circuit of FIG. 44b. At step 4480, the integrator hold circuit monitors for the primary interrupt ICYCIRQ. Inquiry step 4482 determines if the ICYCIRQ interrupt has been detected. If not, control passes back to step 4480. Once the primary interrupt is detected, the integrator hold circuit is initiated at step 4484. Once the integrator hold circuit has been initiated, inquiry step 4486 determines if the end of frame interrupt has been received. If not, the integrator hold circuit remains active at step 4484. Once the end of frame interrupt is detected, the integrator hold circuit is released at step 4488.

Figure 45:
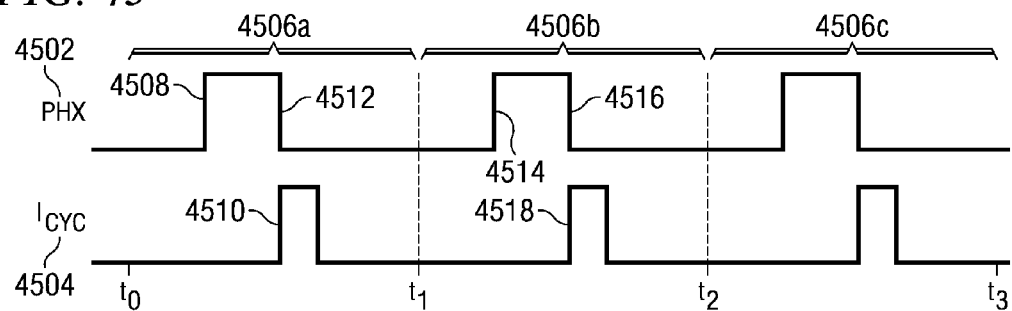
FIG. 45 is a timing diagram illustrating the operation of a phase output of the digital pulse width modulator responsive to an over current detection signal.

This is more fully illustrated in FIG. 45 where there is shown the pulsed output 4502 associated with PH X which could be any phase outputs of the DPWM 416, and the primary interrupt signal ICYCIRQ provided from the output of the comparator 4402. FIG. 45 illustrates three separate frame periods. Occurring from times $T_0$ to $T_1$. is a first frame 4506a, from time $T_1$. to time $T_2$ is a second frame 4506b and from time period $T_2$ to time period $T_3$ is a third frame 4506c. During time frame 4506a, a switch connected to the output of PH X would be turned on by the rising pulse edge 4508. Upon detection of a pulse indicating a primary interrupt at rising edge 4510, the switch connected with output PH X would be turned off by the signal being driven low at 4512 by the DPWM 416. Likewise, in frame 4506b, the switch associated with DPWM output PH X would be turned on at 4514 and turned off at 4516 responsive to detection of the primary interrupt ICYCIRQ at 4518. The turning off of a switch in response to detection of the ICYC interrupt occurs similarly in frame 4506c.

If the over current condition continues over multiple frames and the secondary interrupt OCPIRQ is generated, this signal is provided to the DPWM 416 which then has the option of immediately stopping operation of the DPWM upon receipt of the secondary interrupt OCPIRQ, or alternatively, may wait to cease operation of the DPWM at the end of the next frame. Whether the DPWM ceases operation right away or at the end of the frame is programmable by the user.

Referring now back to FIG. 44a, the reset logic 4422 is responsive to the primary interrupt ICYCIRQ and the end of frame interrupt EOFIRQ provided from the DPWM 416 to reset the 5-bit counter to "0" when pulses of the primary interrupt ICYCIRQ are no longer received in consecutive frames. Thus, if the reset logic 4420 within a previous frame has detected occurrence of a primary interrupt ICYCIRQ, and in the next frame, as indicated by the occurrence of the end of frame interrupt EOFIRQ, there is detected no occurrence of the primary interrupt ICYCIRQ, the reset logic 4420 provides a signal to the reset input of the 5-bit counter 4418 via line 4440 to reset the 5-bit counter to "0." The end of frame interrupt EOFIRQ is additionally provided as an input to the 5-bit counter 4418. This enables the 5-bit counter to only count a single occurrence of the primary interrupt ICYCIRQ within a particular frame. If the 5bit counter 4418 had already counted the occurrence of a primary interrupt ICYCIRQ during a single frame period and receives a second primary interrupt pulse, the counter 4418 will not count this pulse since the counter had not received an end of frame interrupt since receiving the last ICYCIRQ primary interrupt.

The leading edge blanker circuit 4408 mentioned herein above receives an input from the leading edge blanker select register 4442. The leading edge blanker select register 4442 provides a control input for actuating or not actuating the leading edge blanker circuit 4408. The leading edge blanker select register 4442 also provides an indication to the phase selector 4443 of the phase output of the DPWM 416 that is to be blanked. The phase selector 4443 is connected to receive each of the PH1-PH6 outputs of the DPWM 416, such that the leading edge blanker circuit may know when to actuate a leading edge blanker output via output 4444 to switch 4406 corresponding to a leading edge on one of these phase outputs. The leading edge blanker select register 4442 also provides the length of the blanking time of the blanking pulse. Additionally, the leading edge blanker circuit 4408 receives an input from the end of frame interrupt EOFIRQ to indicate when a frame has ended. This enables the leading edge blanker circuit 4408 to know when to begin looking for a next leading edge pulse. Finally, the PWMCK is a clock input clocking operations of the leading edge blanker circuit 4408. The output of the leading edge blanker circuit 4408 is provided to switch 4406 to provide an open switch condition at switch 4406 to keep the input of the comparator 4402 from seeing a spiked current output on the IPK line. This is more fully illustrated in FIG. 46.

Figure 46:
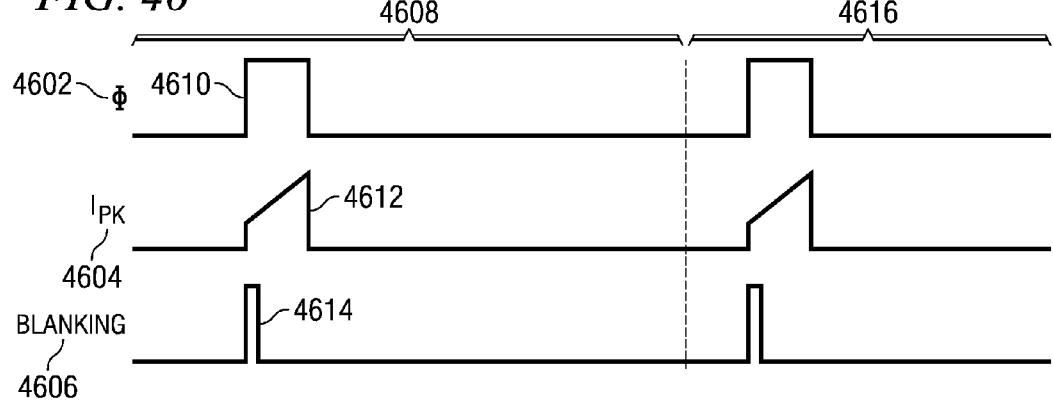
FIG. 46 is a timing diagram illustrating the use of a blanking pulse.

FIG. 46 illustrates the output of one of the phase outputs 4602 from the DPWM 416, the output current IPK 4604 and the blanking signal 4606. Within a first frame 4608, the phase output of one of the outputs of the DPWM circuit 416 goes high at 4610. This comprises the leading edge of this switching pulse. In response to the output 4602 going high at 4610, a current spike 4612 due to parasitic capacitance is created at the current output IPK. If the voltage related to the current spike 4612 were applied to the input of the comparator 4402, the comparator 4402 might inadvertently register an over current condition responsive to the current spike even though no over current condition actually existed. A blanking pulse is provided from the leading edge blanker circuit 4408 via the output 4444 to the blanking switch 4406 to set the switch to an open condition to keep the comparator 4402 from monitoring the current spike on IPK. The current blanking pulse 4614 will only open the blanking switch 4406 during the time of current spike 4612. The remainder of the time the switch is closed enabling the comparator 4402 to compare the output current to the threshold current. The operation of the blanking signal 4606 in the following frame 4616 occurs in a similar fashion. The phase blanked by the leading edge blanker circuit 4408 and the length of the blanking pulse 4614 are each programmable by the user through the LEB select register 4442. The blanking circuit 4408 may also detect a falling edge signal that comprises a leading edge signal.

Referring now to FIG. 47, there is illustrated a flow diagram describing the operation of the over current protection circuitry in the manner for generating both the primary interrupt ICYCIRQ and the secondary interrupt OCPIRQ. The leading edge blanker circuit initially monitors at step 4702 the output current IPK. The output current IPK is compared at step 4704 with the threshold current $I_{TH}$ to determine whether the output current exceeds the threshold current. If inquiry step 4706 determines that the output current does not exceed the threshold current, control passes back to monitoring step 4702.

Once the inquiry step 4706 determines that the output current has exceeded the threshold current, a primary interrupt ICYCIRQ is generated at step 4708. Inquiry step 4710 determines if the interrupt is occurring within a new frame. If not, control passes back to monitoring step 4702 to continue to monitor for the occurrence of a primary interrupt in a new frame. If inquiry step 4710 determines that the primary interrupt has occurred within a new frame, the interrupt count is incremented at step 4710.

Next, at inquiry step 4714, a determination is made if the interrupt count has reached the count limit. If not, control returns to monitoring step 4702 to begin monitoring for a next interrupt pulse. If the interrupt count limit has been equaled, a secondary interrupt OCPIRQ is generated at step 4716. The controller 440 will reset the OCPIRQ when the OCP condition is removed, and process flow returns to monitoring step 4702 to continue monitoring the output current.

Referring now to FIG. 48, there is illustrated the process of operation of the reset logic 4420. The reset logic 4420 monitors at step 4802 the occurrence of the primary interrupt from the comparator 4402. If inquiry step 4804 detects an interrupt, control passes back to monitoring step 4802. If no interrupt is detected, inquiry step 4806 determines if an end of frame interrupt has been received by the reset logic 4420. If no end of frame interrupt has been received, control passes back to step 4802 to continue monitoring the primary interrupt output. When inquiry step 4806 detects an occurrence of an end of frame interrupt and no primary interrupt has been detected within that frame, the counter 4418 is reset at step 4808. Control then returns to monitoring step 4802 to repeat the process.

Figure 49:
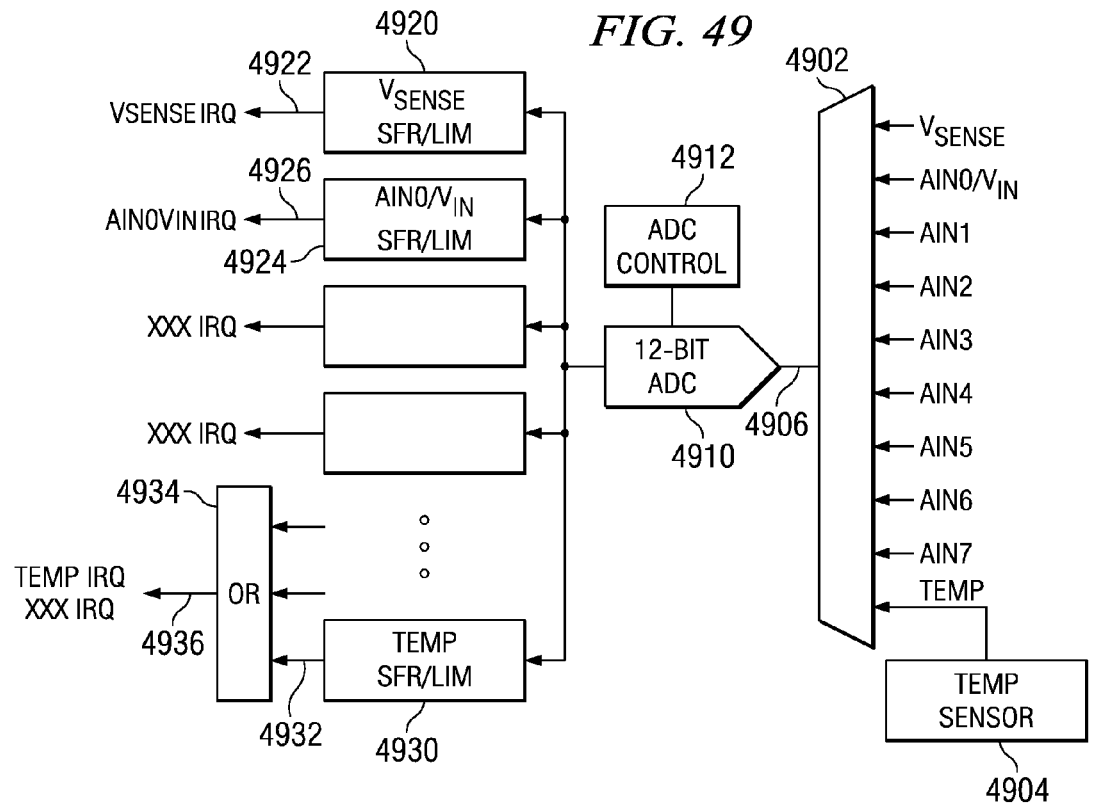
FIG. 49 is a functional block diagram illustrating the circuitry for providing over voltage and over temperature protections for a digital pulse with modulator.

Referring now to FIG. 49, there is illustrated the circuitry for providing both over voltage and temperature protection for the DPWM 416 contained within block 446 (FIG. 4). A number of analog signals are applied to the input of a multiplexor 4902. These signals are provided from various analog outputs and include a VSENSE input sensing the output voltage of the switched power supply and an AINO/NVIN input which is monitoring the input voltage of the switched power supply. Also, a TEMP signal is provided by a temperature sensor 4904 that measures the temperature of the device. These signals are multiplexed to the output 4906 of the multiplexor 4902 and provided to the input of a 12 bit analog to digital converter (ADC) 4910. The 12 bit ADC 4910 is controlled from values from an ADC control register 4912. The output of the 12 bit ADC is a digital output which is applied to the input of a special function register/limit (SFR/LIM) register set. There are a number of SFR/LIM register sets associated with output of the ADC 4910. Each of the SFR/LIM register sets are associated with one of the input analog signals provided to the multiplexor 4902. The SFR/LIM register sets have stored therein a limit value. The SFR/LIM register set compares a provided input from the ADC 4910 to this limit value, and if the limit value is exceeded, generates an associated interrupt signal at the output of the SFR/LIM register set.

Thus, when the VSENSE signal is applied to the input of the 12 bit ADC 4910, a digital VSENSE signal is applied to the input of SFR/LIM register set 4920. The SFR/LIM register set 4920 compares the provided digital value of VSENSE to the predetermined value stored within the register set 4920. If the provided value exceeds the stored value, a VSENSEIRQ is generated at output 4922. If the provided value does not exceed the stored limit value in register set 4920, no VSENSEIRQ is generated. Likewise, if the VIN value is applied to the input of the 12 bit ADC 4910, the digitized value is applied to the input of SFR/LIM 4924. If the provided digital value of the VIN exceeds the stored limit value in the register set 4924, a AINO/VINIRQ is generated at output 4926. The remaining SFR/LIM register sets operate in a similar manner responsive to a digital input that is compared to a limit value stored within the register set. When the limit value is exceeded an appropriate interrupt is generated.

When the temperature value is applied to the input of 12 bit ADC 4910, the digitized temperature signal is applied to the input of the TEMP SFR/LIM register set 4930. As described previously, this value is compared with a temperature limit value in the register set 4930, and if this value is exceeded, a TEMPIRQ is generated at output 4932. However, the output of the TEMP SFR/LIM register set 4930 is connected to the input of an OR gate 4934. This is due to the fact that not enough interrupt resources are available for each of the SFR/LIM register set, so a limited number of the register sets have their outputs applied to the input of OR gate 4934. The interrupt provided to the input of OR gate 4934 is also provided at the output 4936 of OR gate 4934. Thus, when the TEMP's IRQ is applied to input 4932, it will also be provided at the output pin 4936. When a digital value is applied to a particular SFR/LIM register set, the remaining SFR/ILIM register sets are each disabled. Thus, when a digital signal associated with a particular register set is being applied, that register set is the only register set which is presently enabled.

Referring now to FIG. 50, there is more fully illustrated the process of operation of the SFR/LIM register sets. Initially, at step 5002 each of the VSENSE input voltage, the input voltage VIN and the temperature are monitored by the above-described circuitry. When a particular SFR/LIM register set determines at inquiry step 5004 that a limit value has been exceeded, the interrupt is generated at step 5006. If inquiry step 5004 determines that no value has been exceeded, control passes back to the monitoring step 5002. Once the interrupt 5006 has been generated and provided to the controller 440 of the switched power supply, the controller will access at step 5008 the special function register set to determine what the present problem may be.

Figure 51:
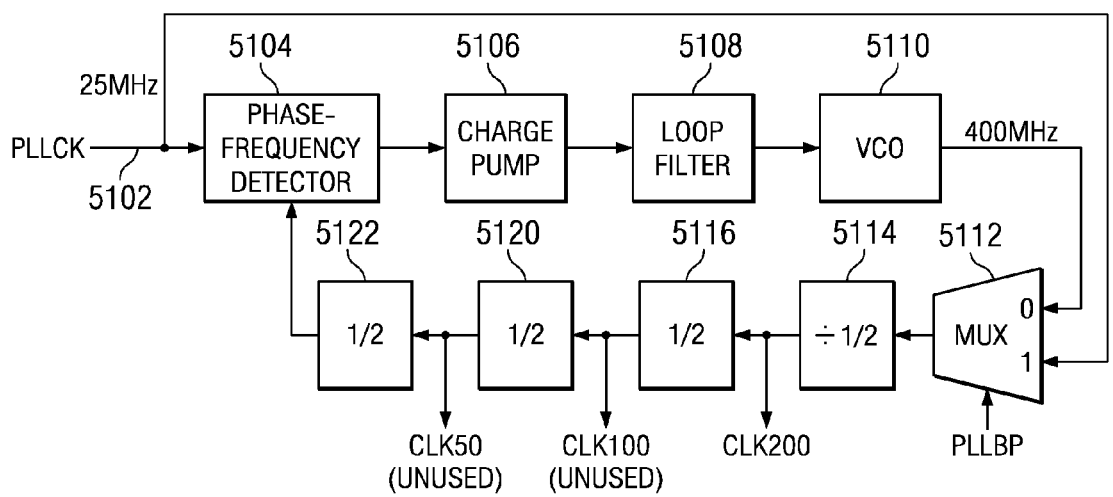
FIG. 51 illustrates a diagrammatic view of the PLL.

Referring now to FIG. 51, there is illustrated a block diagram of the PLL block. The reference phase, i.e., an external or internally generated signal, is received on an input 5102 and input to one input of a phase-frequency detector 5104. The output of this is input to a charge pump circuit 5106 which is operable to charge a node from a positive sourcing circuit or to discharge the node to a sinking circuit. This is conventional. The output of the charge pump circuit 5106 is input to a loop filter 5108 to generate a control voltage for a voltage controlled oscillator (VCO) 5110. This output is provided as the upper level frequency of, in this example, 400 MHz. This is input to one input of a multiplexer 5112. This is then output to a divide-by-two circuit 5114, which provides on the output a 200 MHz clock, this being the preferred DPWM clock. The output of block 5114 is then input to another divide-by-two circuit 5116 to provide a 100 MHz clock signal, which is typically unused, which is then output to a third divide-by-two circuit 5120, which provides a 50 MHz output and then to a divide-by-two block 5122 to provide on the output thereof a 25 MHz signal for input to the other input of the phase-frequency detector 5104. This PLL provides the 200 MHz clock for the DPWM clock. The filter clock is provided by dividing this by a factor of 20.

In an alternate operation, there is a test mode provided wherein the input 5102 is input to the other input of a multiplexer 5112 for bypassing the PLL operation in the blocks 5104-5110. This allows the dividers to be directly controlled and the frequency of operations to be controlled also.

Dead Time

Figure 52A:
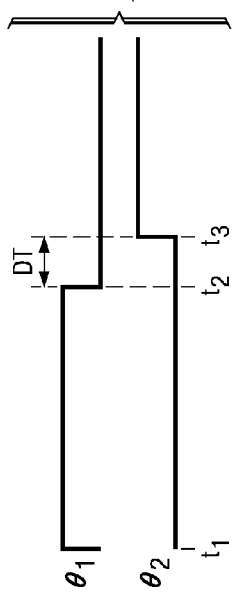
FIGS. 52a-d are timing diagrams illustrating a programmable dead time for complementary switches.

Referring now to FIGS. 52a- 52d, there is illustrated the manner in which the dead time between two switching control signals may be controlled using the programmability of the pattern generators and a corrected signal u(n) from the trim and limit circuitry. FIG. 52a illustrates a prior art configuration wherein first and second control signals for complementary switches within a power supply are both turned off from a time period between time $t_2$ and time $t_3$. The rising edge at $t_3$ is determined with respect to the falling edge at $t_2$. This time period is referred to as the dead time (DT). Within prior art analog control systems, this dead time is adjustable only as to controlling a delay between the generation of the trailing edge of $\phi1$ and the leading edge of $\phi2$, but the trailing edge of $\phi2$ referenced to the beginning of the switching cycle can never occur prior to the trailing edge of $\phi1$. However, utilizing the DPWM controller described hereinabove with respect to FIGS. 34-37, a microprocessor may program the output of the two phase control outputs to enable the dead time between times $t_2$ and $t_3$ to be increased, decreased, or even made negative.

Figure 52B:
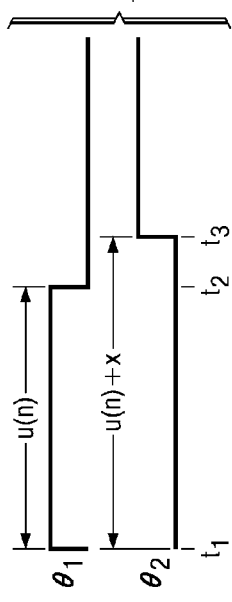

Referring now to FIG. 52b, there is illustrated a situation wherein the trailing edge of a first control signal $\phi1$ is generated responsive to a corrected signal u(n). In response to the signal $u(n)_1$, the control signal $\phi1$ goes low at time $t_2$, this occurring when the correct value of the master counter for the DPWM equals $u(n)_1$. The leading edge of the control signal $\phi2$ is responsive to the corrected signal C(u(n)) which equals u(n) plus some offset value set by the trim and limit amount. The leading edge of control signal $\phi2$ is programmed responsive to its associated control registers and the corrected u(n) signal such that it will have its leading edge go high when u(n) plus or minus some value x equals the count value of the master DPWM counter at time $t_3$. Thus, for example, the leading edge of control signal $\phi2$ can be configured to go high five clock cycles after the $\phi1$ signals goes low at $t_2$.

Figure 52C:
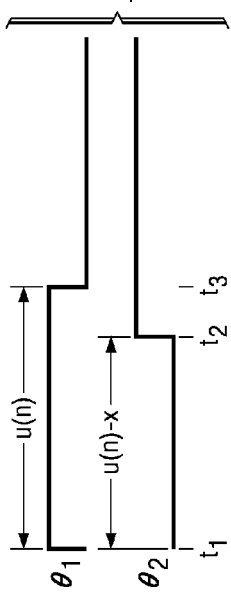

The advantage of the DPWM controller described with respect to FIGS. 34-37 is that it enables the point at which the leading edge of control signal $\phi2$ goes high at time $t_3$, and thus the dead time to be programmably adjusted independently of the trailing edge of control signal $\phi1$. Thus, the value of x may comprise any positive or negative value adjusted by the offset adders in the trim and limit circuitry. If the value x comprises a negative value, the situation as illustrated in FIG. 52c occurs. In this case, the first control signal $\phi1$ is a function of u(n) as before with the trailing edge going low at time $t_3$. However, in this case the dead time between the trailing edge of control signal $\phi1$ and the leading edge of control signal $\phi2$ is negative such that the leading edge of control signal $\phi2$ goes high at time $t_2$ before the trailing edge of control signal $\phi1$ goes low at time $t_3$. The ability of the leading edge of control signal $\phi2$ to go high at a time prior to trailing edge of control signal $\phi1$ going low is not available within previous analog or digital systems. In previous analog or digital systems the control of the leading edge control signal $\phi2$ was always responsive to the trailing edge of control signal $\phi1$ occurring at time $t_3$. Since control signals $\phi1$ and $\phi2$ are programmed independently of each other with separate and individual finite state machines, the leading edge of control signal $\phi2$ may go high at any point in time. This is useful in situations wherein complementary switches of a switched power supply have different switching times associated therewith, and the switch associated with signal $\phi2$ takes longer to reach its steady state operating condition.

Figure 52D:
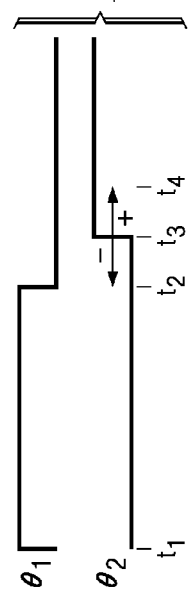

Thus, as illustrated in FIG. 52d, a second control signal $\phi2$ may have its leading edge independently programmed from the trailing edge of the first control signal $\phi1$ such that the dead time between the trailing edge of control signal $\phi1$ and the leading edge of control signal $\phi2$ may be adjusted in a positive direction from $t_3$ to $t_4$ or in a negative direction from time $t_3$ to time $t_2$ and referenced to the beginning of the switching cycle, or to any other edge in the system other than the trailing edge of $\phi1$, the edge relating to the dead time requirement.

Figure 53:
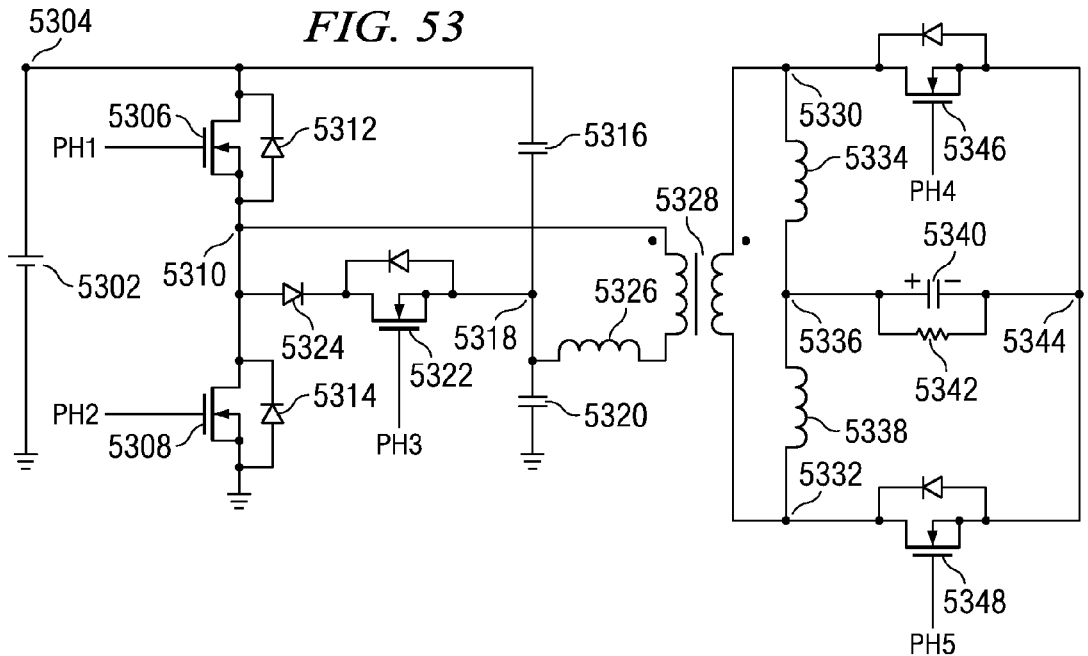
FIG. 53 is a schematic diagram of a multi-phase switched power circuit.

Referring now to FIG. 53, there is illustrated a schematic diagram of a multiphase switched power supply wherein the programmable nature of the phased outputs will enable controlling of the dead times between switches on the primary side and the secondary side. The primary side of the switched power supply includes a DC supply 5302 connected between node 5304 and ground. A pair of switching transistors 5306 and 5308 are connected between node 5304 and ground. The drain/source path of transistor 5306 is connected between node 5304 and node 5310. The gate of transistor 5306 is connected to the PH1 control output. Transistor 5308 has its drain/source path connected between node 5310 and ground. The gate of transistor 5308 is connected to the PH2 control output. The body diodes 5312 and 5314 are connected across each of the transistors 5306 and 5308 respectively. A capacitor 5316 is connected between node 5304 and node 5318. Another capacitor 5320 is connected between node 5318 and ground. A third switching transistor 5322 has its source/drain path connected between node 5318 and the annode of diode 5324. The gate of transistor 5322 is connected to the PH3 control output. The cathode of diode 5324 is connected to node 5310. Inductor 5326 is connected between node 5318 and one input of the primary side of power transformer 5328. The second input of the primary side of power transformer 5328 is connected to node 5310.

The secondary side of power transformer 3328 is connected between nodes 5330 and 5332. A first inductor 5334 is connected between node 5330 and node 5336. A second inductor 5338 is connected between node 5336 and node 5332. A capacitor 5340 is connected in parallel with a resistor 5342 between node 5336 and node 5344. A fourth switching transistor 5346 has its source/drain path connected between node 5344 and node 5330. The gate of transistor 5346 is connected to the PH4 control output. A fifth switching transistor 5348 has its source/drain path connected between node 5344 and node 5332. The gate of transistor 5348 is connected to the PH5 control output.

Figure 54:
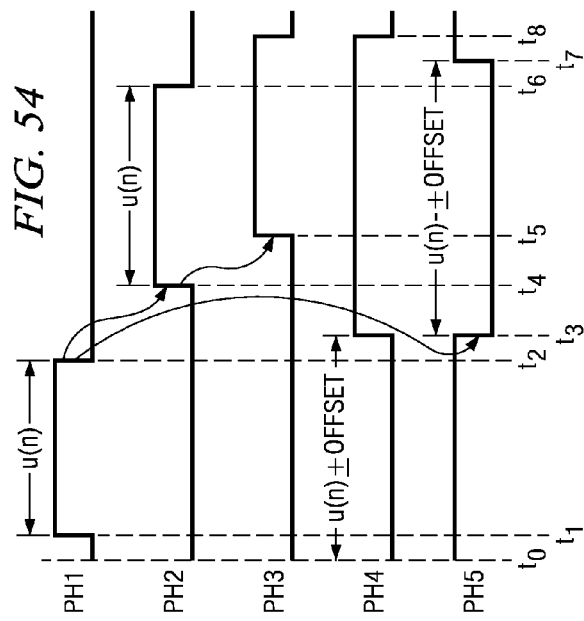
FIG. 54 is a timing diagram for the phase inputs to each of the switching transistors of the circuit in FIG. 53.

Referring now to FIG. 54, there is illustrated a timing diagram for the phase control signals applied to each of the switching transistors of the switched power supply illustrated in FIG. 53 by way of example. In this case, it is desired to control the dead time between the phase control signals PH1 on the primary side of the switched power supply and PH4 on the secondary side of the switched power supply due to switching delays within the switching transistors and across the power transformer. The control signal PH1 has a leading edge occurring at time t, and a trailing edge occurring at time $t_3$. The distance between the leading edge of time t, and the trailing edge at time $t_3$ is a function of the u(n) value determined by the filter and the trailing edge occurs when the count value between the leading and trailing edges is equal to u(n). The leading edge of the PH1 control output at the time $t_1$ is an absolute edge occurring at a defined count value of the master DPWM clock from the beginning of the switching cycle. The control signal PH2 has a leading edge occurring at time $t_4$ which is relative distance from the falling edge of signal PH1 at time $t_2$ of a predetermined number of clock cycles of the master clock. The trailing edge of the PH2 control signal occurs at time $t_6$, and is a function of the u(n) signal. (It is noted that u(n) continually changes and, thus, a counter counts the number of clock cycles from the time $t_4$ until the count value equals the instantaneous value of u(n) at time $t_0$.) The leading edge of the PH3 control output occurs at time $t_5$, and is a relative edge to the leading edge of the PH2 control output occurring at $t_4$. The trailing edge of the PH3 control signal occurs at time $t_8$, and is an absolute edge always occurring at the same defined point in a frame, i.e., at the end of the switching cycle. The leading edge of the PH4 output is an absolute edge occurring at time $t_0$ in a frame, i.e., the beginning of the switching cycle with an absolute value of "0". The trailing edge of the PH4 output occurs at time $t_3$, and has a dead time period from the trailing edge of PH1 occurring at time $t_2$. In this case, the dead time is established by generating the trailing edge of the PH4 control output at time $t_3$ and dependent upon the value of u(n) plus some defined offset value. By establishing this offset in conjunction with the value of u(n), a set dead time may be established, since the PH4 output edges and PH1 output edges are both dependent on u(n). Since both are dependent on u(n), the edges may be generated independently with a defined positive or negative offset. With respect to the PH5 control output its leading edge occurs at time $t_3$, and is a relative edge to the trailing edge of the PH1 control output occurring at time $t_2$ by a final number of cycles. A dead time period between the leading edge of the PH2 control output and the trailing edge of the PH5 output occurring at time $t_7$ is established by generating the trailing edge at time $t_7$ in such a manner that it is dependent upon the u(n) signal plus some offset value, but referenced to the PH2 control output rising edge. In this case, the trailing edge of the PH5 control output at $t_7$ will always be different from the falling edge of the PH2 output by the established offset since both signals are generated based upon u(n) and both are a fixed number of clock cycles delayed from the trailing edge of PH1. By making the leading or trailing edges of signals dependent of the u(n) signal plus or minus some offset, a programmable dead time may be established between various phase output control signals. As such, the trailing edge of PH5 is based on the leading edge of PH2 as a reference edge that sets a reference count value and then the value of u(n)+/−an offset is added thereto such that, when the master counter equals the is equal to PH2$_{LE}$+u(n)+/−offset, then the trailing edge of PH5 will be generated.

Figure 55:
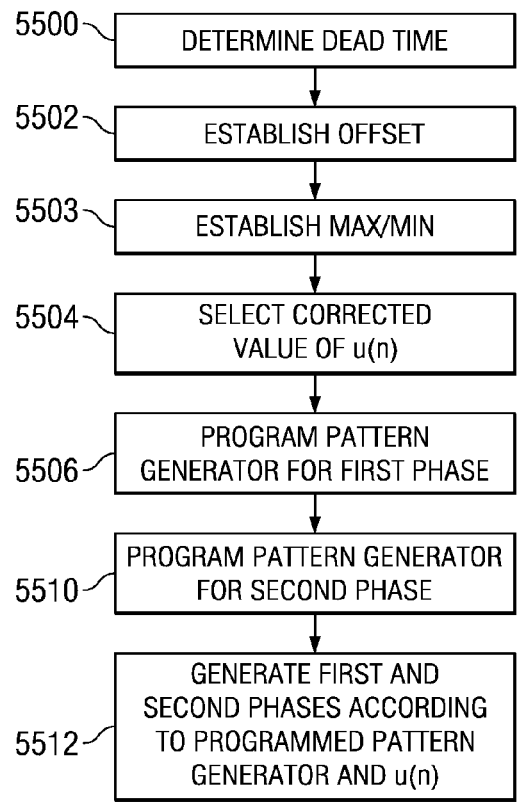
FIG. 55 is a flow diagram illustrating the method for establishing a dead time between to phase outputs.

Referring now to FIG. 55, there is illustrated a flow diagram describing the manner in which the dead time between a first and a second phase control signal output may be established. Initially, at step 5500, the desired dead time to occur between the first and second phase output control signals is determined. The requirements for a pair of corrected values of u(n) are established within the trim and limit circuitry in the manner described previously with respect to FIGS. 36a and 36b. A desired positive or negative offset may be applied at step 5502 to one u(n) signal to establish the dead time period for a corrected u(n) signal. A second corrected u(n) signal is established without the offset. The minimum and maximum ranges are established at step 5503 for each corrected u(n) signal in accordance with the low limit registers and the high limit registers as described with respect to FIGS. 36a and 36b. The trim and limit circuitry provides a number of corrected values of u(n), and the desired corrected values of u(n) are selected at step 5504.

Using first selected value of u(n) without an offset and the established control values within the control register for a particular phase output, the pattern generator for a first phase output and either the leading or trailing edge is programmed at step 5506 to generate the control phase output edge in a desired manner. The control values are used along with the value of u(n) to create a leading edge and a trailing edge at desired locations in a frame, each potentially independent of the other. This process is more fully described with respect to FIGS. 34-37. Using the desired dead time, a pattern generator for the second phase output signal is programmed at step 5510 using a second corrected value of u(n) having the necessary offset included therein and the necessary control values within the control register for the leading and trailing edges of the second phase output. The control values for the trim and limit circuit and the control registers are provided by the controlling microprocessor. Once the desired control values are set within the control registers for the first phase output and the second phase output, the leading and trailing edges for the first and second phase outputs are each independently generated at step 5512 using the programmed pattern generators and the corrected value of u(n). This will provide the first and second control signals having a dead time between the control signals programmed to a desired value.

Finite State Machine

Figure 56:
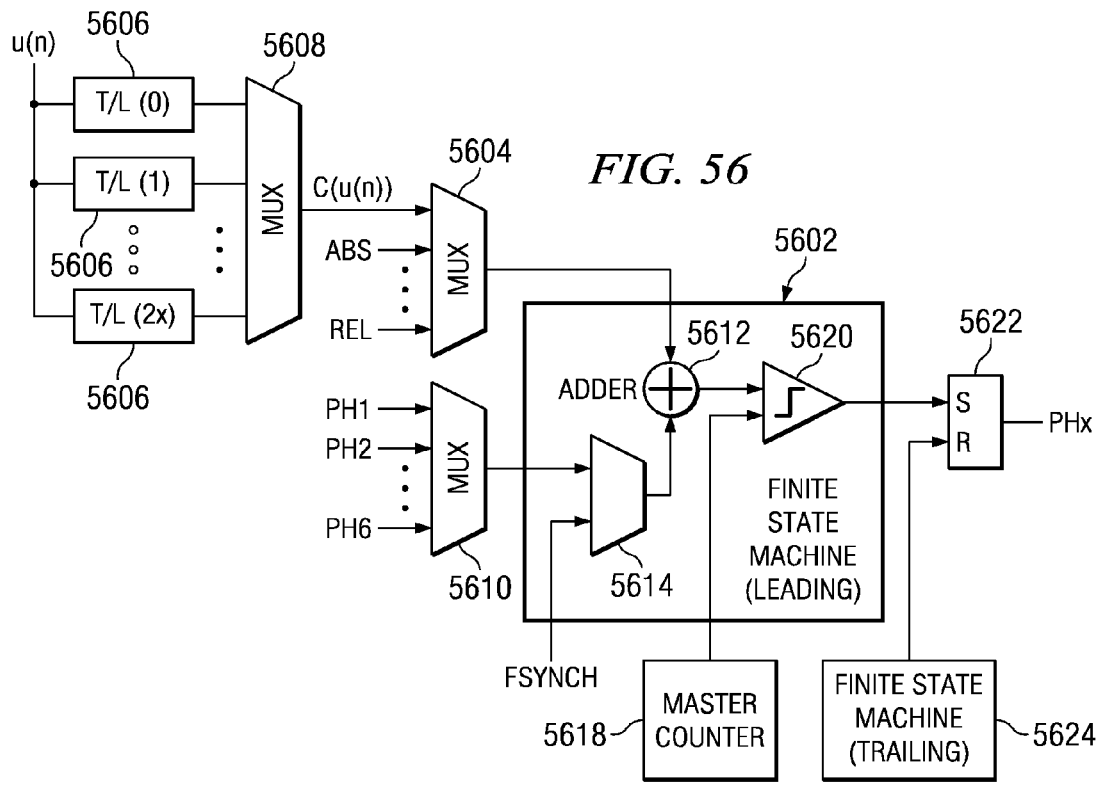
FIG. 56 illustrates a more detailed block diagram of one pattern generator for a single phase illustrating the operation of the associated finite state machine for a given edge of a particular phase output, either the leading or the trailing edge.

Referring now to FIG. 56, there is illustrated a more detailed diagrammatic view of a portion of a pattern generator for the generation of a single edge associated with generating a particular phase control output. As noted hereinabove, each phase output is comprised of a leading edge and trailing edge, this leading edge being either rising or falling and the trailing edge either falling or rising, respectively. The embodiment of FIG. 56 is for a single edge in a single phase, wherein the embodiment of FIG. 37 illustrates the generation of both the leading and trailing edge for a given phase output. Essentially, the leading edge operation and the trailing edge operation are logically OR'ed together to provide an output phase control signal for a given switching device.

In general, each edge for each phase control output is generated utilizing a finite state machine (FSM). This finite state machine is noted with a reference numeral 5602. As noted in FIG. 37 and the description associated therewith, there are multiple inputs that are provided to the finite state machine. There is provided an operand value from a multiplexer 5604, that being similar to multiplexers 3702 and 3710, these being the primary edge control. The operand is selected to either be the number of counts associated with the duty cycle, u(n), the fixed value of counts representing an absolute value or a fixed number of counts representing relative value. The absolute and relative counts are derived from the registers PHn_CNTL1/3, as set forth in FIG. 37. These are 9-bit values. The u(n) value is the value that is determined at the control loop and represents the number of counts for the width of PH1. This is effectively the number of counts that PH1 is active high and allows current to be passed to the inductive element. The duty cycle is equal to u(n) divided by the total count for a given frame, which total count for a given frame represents the length of the switching cycle in counts of a master counter. The master count is initiated upon the initiation of a particular switching cycle and it is incremented by the master clock. This switching cycle has a fixed number of counts.

As noted hereinabove, the value of u(n) determined through the loop controller and output by the PID can be corrected by the trim and limit circuitry to provide a positive or negative offset. Therefore, the uncorrected u(n) is input to one of multiple trim and limit circuits 5606, one potentially for each edge, such that if there are "x" phases, there could potentially be "2x" trim and limit circuits. In the circuit illustrated in FIG. 34, there are only four trim and limit circuits provided, it being understood that more could be utilized. Thus, each edge can independently be determined utilizing a value of u(n) that is either increased by a positive offset or decreased in value by a predetermined negative offset without reference to the generation of other edges by the finite state machines associated with the other edges. The finite state machine 5602 selects the output C(u(n)) one of these trim and limit circuits 5606 for use therewith by a multiplexer 5608, it being understood that each trim and limit circuit 5606 can have a different and programmable offset associated therewith. This provides the corrected value C(u(n)). The multiplexer 5604 selects this input if the edge associated therewith is to be based upon this potentially corrected value. The other input that is provided, as set forth with respect to the multiplexers 3706 and 3712 of FIG. 37, is the selection of an edge control from another phase generator, i.e., the generation of another edge in the system. This is provided by a multiplexer 5610 and provides the frame of reference for the associated edge. This selects between one of the multiple phase edges, it being a leading or a trailing edge. Additionally, the initial edge of the switching cycle will be provided by an FSYNC signal. Essentially, this is a zero count value of the master counter at the beginning of the switching cycle.

As described hereinabove with reference to FIG. 37, finite state machine 5602 is operable to generate an edge based upon an absolute value of counts from the initiation of the switching cycle, a fixed number of counts relative to another edge in the system, this being a relative value, or a number of counts based upon the u(n) value. Thus, the edge generation is either absolute, relative or u(n). This u(n) value based decision, when selected, determines a count value from either the beginning of the switching cycle or another edge generated in the system. Each of these will be described hereinbelow.

Inside the finite state machine 5602, there is provided an adder 5612. The adder 5612 is operable to add the value of the operand, which constitutes a count value with the value of the selected phase from the multiplexer 5610 or an external beginning of switching frame signal referred to as FSYNC. This is facilitated with a multiplexer 5614. Therefore, the actual reference is provided out of the multiplexer 5614 from which the operand is to count. This reference represents a count value within the switching frame for either the occurrence of one of the edges in one of the phases or an external pulse, which represents the "0" count of the master counter represented by block 5618. Therefore, the adder will provide on the output thereof the desired count value. This is compared in a comparator 5620 to the count value of the master counter which, as described hereinabove, is reset at a value of "0" at the beginning of a switching cycle. By adding the count value output by the multiplexer 5604 to the reference phase, this count value output by the multiplexer 5604 basically provides an additional count to that already provided by the output of multiplexer 5610 such that this output of the multiplexer 5610 provides a reference or "normalized" count value. When the desired count value output by the adder 5612 is equal to the master counter output, the output of the comparator 5620 will go high representing the generation of an edge. This is input to a set/reset latch 5622 which is associated with each phase control signal, PHx. This provides the appropriate edge on the output. This latch 5622 is controlled such that it is biased one direction or the other, i.e., it will be a rising edge or a falling edge on the output thereof. This merely requires inverting the value thereof. This is provided by one of the control signals in the register such that the leading edge will either be a high going edge or a low going edge. The finite state machine 5602 represents the "leading" edge of the particular phase control output. The other edge, the trailing edge, of the phase control output is provided through a substantially identical finite state machine 5624 which is connected to the reset input of the latch 5622. Thus, each edge is independently generated and then combined with the latch 5622 in order to provide a "state change" from an initial state to a second state with a leading edge and then back to the initial state with a trailing edge. Each of the finite state machines 5602 and 5624 associated with the associated phase control signal operate independently and are each programmable such that the output of the multiplexer 5604 associated with finite state machine 5602 and the corresponding multiplexer associated with finite state machine 5624 can independently select the type of edge that is generated and the multiplexer 5610 and corresponding multiplexer in the finite state machine 5624 can select the reference edge or count of the master counter from which the count is calculated. Each of the finite state machines 5602 and 5624 have a self contained adder 5612 and comparator 5620 for determining when the edge is to be generated. All the finite state machines for each of the phase control signals operate off of the master counter 5618.

Figure 57A:
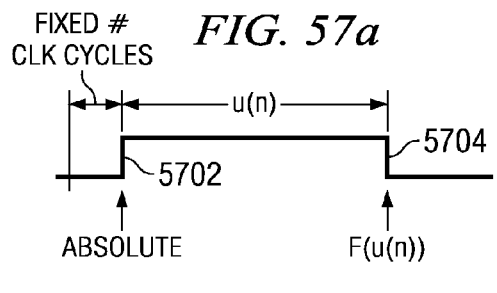
FIGS. 57a-57d illustrate timing diagrams for the various methodologies for generating an edge.
Figure 57C:
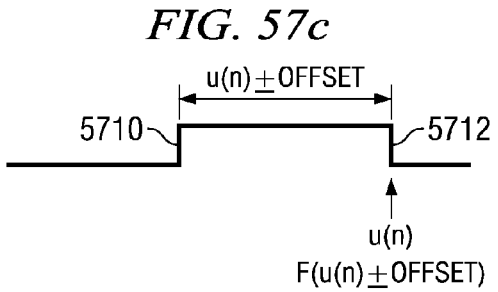
Figure 57B:
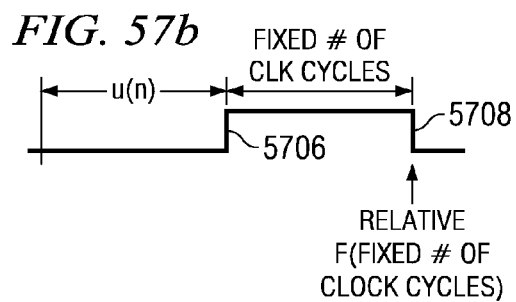

Referring now to FIGS. 57a-57b, there are illustrated diagrams for each of the edge generation decisions for respective edge generated. Specifically, FIG. 57a illustrates the generation of an edge based upon either Absolute value or a u(n) value. This wave form requires generation of both a leading and a trailing edge for PH1. There will typically be a fixed number of clock cycles before the generation of a leading edge 5702. This can be a value of "0" or it can be a fixed number of clock cycles. It may be desirable to actually utilize a fixed number of clock cycles for this. After the generation of the leading edge, this being the Absolute edge decision for the leading edge of PH1, the trailing edge is the next edge that has to be generated. It should be understood that this edge is generated independently of the leading edge 5702. The trailing edge is indicated by a reference numeral of 5704. This edge is a function of u(n). It is generated from the absolute edge 5702 or from the beginning of the switching cycle if the absolute value of the leading edge is "0." Thus, the number of counts represented by the output of the loop filter for u(n) determines when the edge 5704 will be generated. In general, the value of u(n) is a varying value output by the filter. Thus, it is possible that this value can vary from the beginning of the switching cycle to the generation of the edge 5704. Basically, the finite state machine 5602 that is associated with the trailing edge 5704 will determine when the edge 5704 will be generated. This is facilitated by comparing a count value of the master DPWM counter with the desired count value at the output of the adder 5612, which is representative of a normalized count value at the edge 5702, and, when it equals u(n), the edge 5704 is generated.

Referring now to FIG. 57b, there is illustrated an edge generated using the relative input value stored in the register and selected by the multiplexer 5604. In this embodiment, the pulse generated has a rising edge 5706 that is the trigger edge, this also being the leading edge. This is generated, in this illustration, by an independent finite state machine that generates edge 5706 at a count value of u(n) from the start of the switching cycle. However, an edge 5708, the trailing edge associated with leading edge 5706, is generated a fixed number of cycles after leading edge 5706. Thus, to define this edge 5708, it is only necessary to store the relative value and the edge to which it is referenced, this edge being any edge in the system.

Referring now to FIG. 57c, there is illustrated an edge generated utilizing the value of u(n) but generating this relative to another edge. Further, this is generated not only with the value of u(n), but also a corrected value, by adding or subtracting an offset therefrom. The reference edge is noted as being a leading edge 5710 on the same pulse (but could be from another phase control signal). A trailing edge 5712 is generated by adding or subtracting an offset with a trim and limit circuit from the value of the u(n) measured relative to the edge 5710. Therefore, the width of this particular pulse is the C(u(n)) generated by the trim and limit circuit. Since the value of C(u(n)) is equal to u(n)+/−offset, the offset is determined by the contents of the offset register and then only modifies the value of u(n). When the normalized count value measured from the reference edge 5710 equals C(u(n)), the edge 5712 is generated.

Figure 57D:
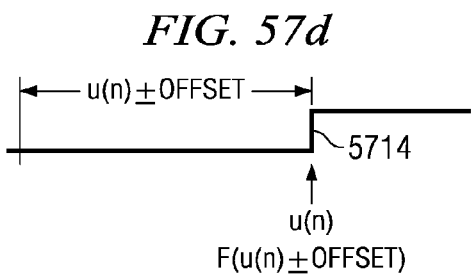

Referring now to FIG. 57d, there is illustrated a diagram showing an edge generated based upon u(n)+/−offset and based upon the start of the switching cycle as the reference edge. This is a single edge, the leading edge, 5714. It should be noted that this edge can be utilized for the dead time determination due to the fact that it is generated based upon a reference edge to which another pulse is initially referenced to when generated. This will be described hereinbelow.

Referring now to FIGS. 58a and 58b, there is illustrated a diagrammatic view of how the dead time is determined utilizing the embodiment of FIG. 57d. In this embodiment, the initial phase, PH1, is generated by generating a leading edge 5802 from the beginning of the switching cycle by a distance equal to the value in the Absolute register, it being noted that this could be "0." The trailing edge, an edge 5806, is generated after the normalized count value from the edge 5802 has been determined to equal u(n). This was noted hereinabove. A second pulse generates a leading edge 5708 a predetermined amount of time from the edge 5806. The reason for this, as described hereinabove, is to ensure that there is some type of dead time in the conduction of one active device versus another in a complimentary pair. However, as also noted hereinabove, it may be that, due to the parasitics in the system, the edge 5708 is required to be generated prior to edge 5806. The edge 5708 is generated not based upon the edge 5806 but based upon a corrected u(n) value reference to the edge 5802, i.e., the same as was the case for the edge 5806. Thus, even though the dead time is important to be determined between the edge 5806 and the edge 5708, the edge 5708 is generated from another reference than that to which it is actually desirable to be relative to. Since both are relative to the same reference edge, they are essentially related edges. However, in certain situations, as noted hereinabove, it may be desirable that the edge 5708 occurs before the edge 5806. If this is the case, it is difficult to do that in an analog situation wherein one edge is generated from another, i.e., they are pipelined. With the offset actually being a negative value such that the corrected value of u(n) can be less than u(n), then this edge 5708 can be generated prior to the edge 5806. This is illustrated in FIG. 58b wherein the edge 5708' is generated prior to the edge 5806.

Referring now to FIG. 59, there is illustrated a flow chart depicting the generation of a Relative edge. This is initiated at a block 5902 and then proceeds to decision block 5904 to determine if a reference edge has been generated to which the relative edge is related. When this occurs, the program will flow to a function block 5906 to fetch the contents of a relative edge, this, as noted hereinabove, being a 9-bit fixed value. The program then flows to a function block 5908 to normalize the count value. (Note that this is just to provide a frame of reference). As noted hereinabove, the master counter is initiated at the beginning of the switching cycle. The count value is normalized at the reference edge, such that this now becomes the virtual "0" count value. The program then flows to a decision block 5910 to determine if the normalized count, i.e., that from the reference edge, is equal to the value of the Relative register. When this occurs, the program flows to a function block 5912 to generate the edge and then to an End block 5914.

Referring now to FIG. 60, there is illustrated a flow chart depicting the generation of the Absolute edge, which is initiated at a block 6002. The program then flows to a decision block 6004 to determine if the master DPWM counter value associated with the start of the switching cycle has occurred. The master DPWM counter is reset at the beginning of the switching cycle. As noted hereinabove, the Absolute operational mode is a mode wherein the count value is measured from the edge of the initiation of the switching cycle. When the switching cycle has been initiated, the program will flow along a "Y" path to a function block 6006 to fetch the contents of the Absolute register. The program then flows to a function block 6008 to determine if the count value, this not being a normalized count, is equal to a register value. When this occurs, the program flows to a function block 6010 to generate the edge and then to an End block 6012.

Figure 61:
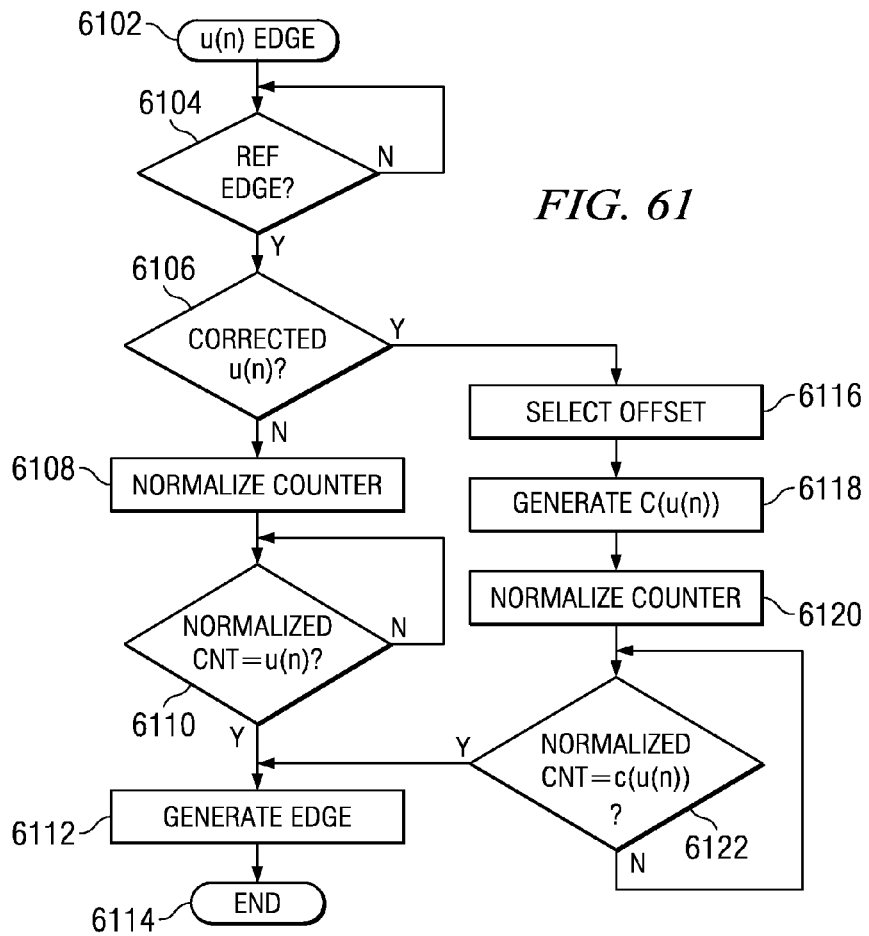
FIG. 61 illustrates a flow chart depicting the operation of generating the u(n) edge.

Referring now to FIG. 61, there is illustrated a flow chart depicting the operation of generating a u(n) related edge, which is initiated at a block 6102 and then proceeds to a decision block 6104. Decision block 6104 determines when a reference edge occurs, it being noted that the u(n) based edge can be generated based upon a reference edge generated by another finite state machine, it can be generated based upon the initiation of the switching cycle, or it can be generated from another edge in the same phase control output for that associated PHx. As noted hereinabove, each edge is generated independently, such that each other edge in the system constitutes a potential reference edge. When this reference edge occurs, the program flows to a decision block 6106 to determine if a corrected u(n) value is to be utilized. If not, this indicates that the actual u(n) value is to be utilized, and then the program flows to a function block 6108 to normalize the counter value at the reference edge and then flows to a decision block 6110 to determine if the normalized count value determined from the reference edge is equal to the value of u(n). When this occurs, the program flows along the "Y" path to a function block 6112 to generate the edge and then to an End block 6114.

If the corrected u(n) value is to be utilized, i.e., there is to be provided an offset, the program flows along the "Y" path to the function block 6116 from the decision block 6106 to select the offset stored in the register. This if facilitated by both selecting one of the trim and limit circuits with the multiplexer 5608 and then fetching the contents of the offset register therefrom. The program then flows to a function block 6118 to generate the corrected value of u(n) and then to a function block 6120 to normalize the counter at the reference edge. The program then flows to a decision block 6122 in order to determine if the normalized count measured from the reference edge is equal to the corrected value of u(n). When this occurs, the program flows to the function block 6112 in order to generate the edge.

It can be seen that since this is a finite state machine, it takes a very small number of cycles in order to execute the operation. In general, it basically takes one cycle to determine the value and then another clock cycle in order to clock this through to the output, which is typically what is required for a gated operation.

Dead Time Operation

Figure 62:
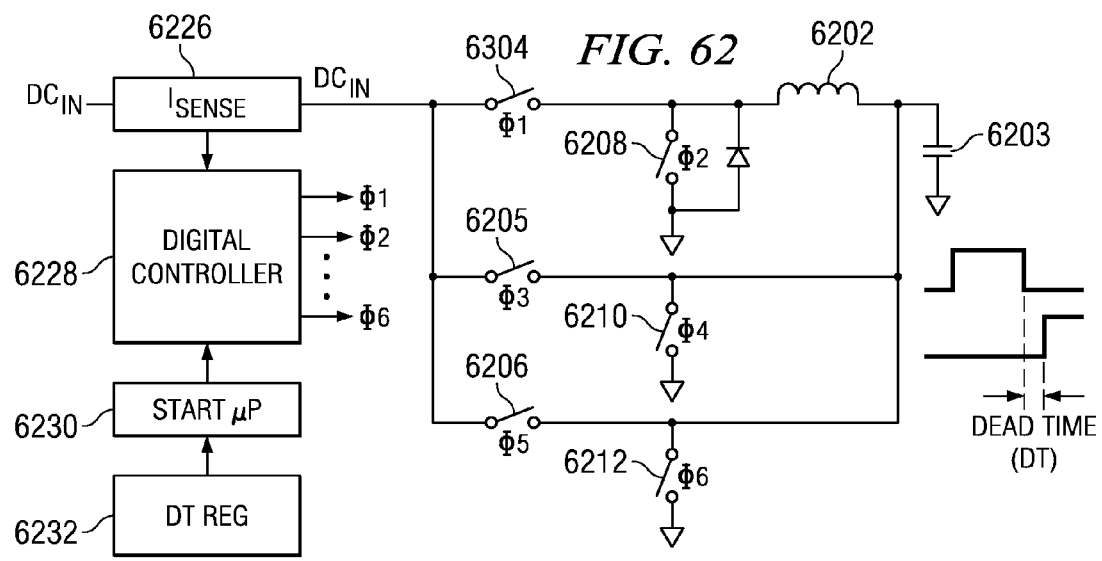
FIG. 62 illustrates a diagrammatic view of a multi-phase system for determining dead time.

Referring now to FIG. 62, there is illustrated a diagrammatic view of a dead time optimization system. This is a multi-phase system, as described hereinabove. For illustrative purposes, six different switches have been provided and interfaced with an inductive element 6202 that drives the capacitive element 6203. A first switch, the primary switch, driven by a phase $\phi 1$, connects the input voltage to the top side of the inductor 6202, with a second switch 6208 driven by phase $\phi 2$. These are complimentary switches. A second set of complimentary switches is provided by a switch 6205 connected between the input and the top level of capacitors 6204 with a switch and driven by phase φ and a switch 6210 connected to ground and driven by phase φ4. A third set of complimentary switches is provided by a switch 6206 driven by φ5 connected between the input voltage and the top of capacitor 6203 with a switch 6212 connecting the top layer of the capacitor to ground with a phase φ6. These switches and their configurations are for exemplary purposes only to show three sets of complimentary switches. An example of a multiphase system is illustrated in FIG. 53.

The current input to the switch 6204 is sensed with a current sense circuit 6226, which is a Hall sensor. This is provided to a digital controller block 6228, which represents the overall digital control loop that generates the six different phases. This is controlled in part by a start-up block 6230 which is basically operable to initiate the dead time optimization routine whenever a power-up condition exists, a re-start-up condition exists or even a manual input is received for such dead time optimization. Any other reason for initiating a dead time optimization routine will be represented by the block 6230. This is typically facilitated with the microcontroller. A dead time register 6232 is provided for storing the dead time value. It is noted that the user can initially set a dead time value for the purpose of configuring the overall power supply. This dead time will then be varied with the optimization routine. It can be seen from the timing diagram associated with FIG. 62 that there will be two edges represented by the complimentary switches wherein one edge is desired to occur after another edge, such that one switch is turned off before another switch in a complimentary pair is turned on. This was described hereinabove.

Figure 63:
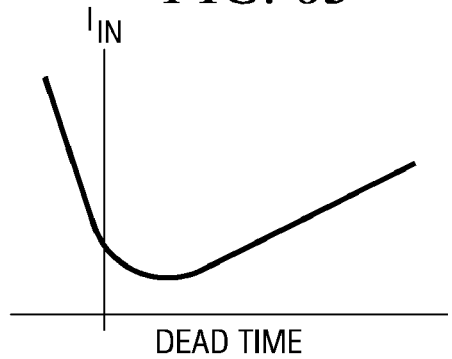
FIG. 63 shows a plot of dead time versus input current.

Referring now to FIG. 63, there is illustrated a plot of dead time versus current wherein it can be seen that, as the dead time decreases, the current will increase, resulting from the one complimentary switch connected to ground shunning current. Further, as the dead time increases, current will also increase due to inefficiencies. There will be a minimum current versus dead time that will occur, which is desirable from the optimization routine. This is the desirable operating mode.

Figure 64:
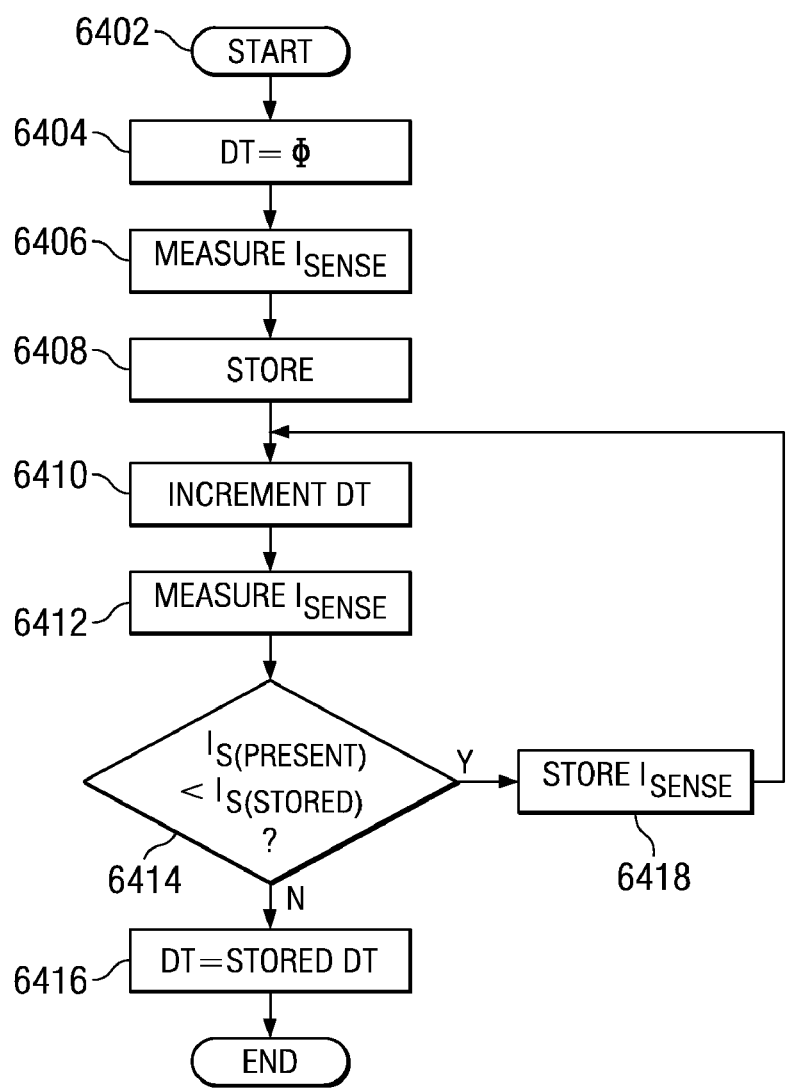
FIG. 64 illustrates a flow chart for optimizing the dead time value.

Referring now to FIG. 64, there is illustrated a flow chart depicting the optimization routine for optimizing dead time. This is initiated at the block 6402, which can be initiated, as noted hereinabove, through either power up, manually or restart. The program then flows to a function block 6404 wherein the initial value of the dead time is set to "0" or to some other value, even the value designated by a user. The program then flows to a function block 6406 wherein the current is measured and is stored, as noted in a function block 6408. The value of dead time is then incremented, as indicated by the function block 6410 and then the current measured, as indicated by a function block 6412. The program then flows to a decision block 6414 to determine if the present current is less than the stored current. If so, the program then flows to a function block 6418 to store the current and then back to the function block 6410 to again increment the dead time value. If the current at decision block 6414 is determined to be greater than the stored current, then the final current is the stored current from the last cycle, as indicated by block 6416. However, it is noted that this routine must be cycled through for both the negative direction and the positive direction from the initial value to determine the actual minimum.

Although the preferred embodiment has been described in detail, it should be understood that various changes, substitutions and alterations can be made therein without departing from the scope of the invention as defined by the appended claims.

What is claimed is:

1. A distributed power system for delivering DC power to a plurality of loads, comprising;
   a plurality of power converter modules having associated therewith a DC/DC power conversion operation, each disposed proximate an associated one of the loads, each of said converter modules having associated therewith a switching pulse generator for generating switching pulses;
   a distributed power line for distributing input power to each of said modules;
   a data communication line for distributing command data between said modules, each of said modules uniquely addressable over said data communication line;
   a timing communication line for distributing timing information to each of said switching pulse generators in each of said modules; and
   a master controller for generating commands and communicating them to said data modules over said data communication line, said master controller operable to generate timing information over said timing communication line to each of said modules for controlling said associated switching pulse generator.

2. The power system of claim 1, wherein said data communication line is a serial data bus.

3. The power system of claim 1, wherein said master controller is operable to precede any timing information communicated to said modules over said timing communication line with a timing command which is required by said switching pulse generators prior to being able to receive and utilize such timing information.

4. The power system of claim 1, wherein each of said switching pulse generators operate on a switching cycle for generating during said switching cycle a plurality of control pulses, said switching cycle being a periodic cycle, and wherein said timing information controls the operation of said switching cycle.

5. The power system of claim 4, wherein said switching pulse generators in each of said modules operate asynchronously relative to each other with respect to timing information when operating in a non-SYNC mode of operation in which said associated switching cycles are controlled locally thereto, and each of said modules operable to operate in a SYNC mode of operation wherein said associated switching cycles are controlled with an external signal received from said timing communication line.

6. The power system of claim 5, wherein each of said modules is switched between said non-SYNC mode of operation to said SYNC mode of operation in response to at least a single SYNC command received from said master controller, and wherein said switching pulse generators are controlled by said external signal after being switched to said SYNC mode of operation.

7. The power system of claim 6, wherein said switching cycle for each of said modules is terminated upon receipt of said external signal and a new switching cycle initiated thereafter, such that all of said switching pulse generators are synchronized to said external signal at each of said modules at least at the beginning of such newly initiated switching cycle.

8. The power system of claim 7, wherein the generation of an external signal is required to generate each new switching cycle.

9. The power system of claim 7, wherein, after initiation of a new switching cycle in response to the receipt of said external signal, each of said switching pulse generators in each of said modules operates asynchronously during said associated switching cycle.

10. The power system of claim 8, wherein said master controller is operable to generate a SYNC disable command after generation of said external signal and prior to the termination of said switching cycles in each of said modules to switch the operational mode to a non-SYNC mode of operation.

11. The power system of claim 1, wherein said distributed power line distributes DC power.

12. A distributed power supply system for controlling the delivery of DC power to a plurality of loads, comprising:
- a data communication bus for data communication for carrying commands and configuration information;
- a distributed power line for distributing primary DC power;
- a timing communication line for carrying timing information;
- a plurality of point of load (POL) converters each associated with one of the loads and each comprising:
  - a switching DC/DC converter section for receiving a DC input voltage and converting it to a DC output voltage at a different DC voltage level to the associated load and controlled by switching pulse control signals,
  - a switching pulse controller for generating said switching pulse control signals, said switching pulse generator interfacing with said timing communication line for receiving the timing information carried thereover and selectively using said received timing information for use in the generation of said switching pulse control signals, and
  - a processor for interfacing with said data communication bus and uniquely addressable thereon and for receiving commands and configuration information therefrom, said processor for controlling the operation of said associated POL; and
- a master controller for communicating command information associated with the operation of said switching pulse controller over said data communication bus and, in association therewith, timing information over said timing communication line.

13. The system of claim 12, wherein said communication bus comprises a serial data communication bus.

14. The system of claim 12, wherein said switching pulse controller is operable to generate a plurality of switching control pulses during a switching cycle, which switching cycle is repeated in a periodic manner, and wherein said timing information can be used by said switching pulse controller to control the timing of the initiation of said switching cycle.

15. The system of claim 14, wherein said switching pulse generator operates in a first non-SYNC mode of operation where the timing of the generation of the switching control pulses and the initiation of a switching cycle is internally controlled by said switching pulse generator, and in a second SYNC mode of operation where the initiation of the switching cycle is influenced by said timing information received from said master controller over said timing communication line.

16. The system of claim 15, wherein said switching cycle in said SYNC mode of operation is terminated upon receiving said timing information and a new switching cycle initiated.

17. The system of claim 16, wherein the mode of operation of said switching pulse generator is controlled by commands received from said master controller, such that a SYNC command must be received by said associated processor prior to receipt of said timing information to allow said processor to control said switching pulse generator to operate in the SYNC mode of operation.

18. The system of claim 17, wherein said master controller is operable to generate a SYNC disable command that causes said processor to control said associated switching pulse generator to switch back to said non-SYNC mode of operation.

19. The system of claim 18, wherein said SYNC disable command is generated prior to the end of the newly generated switching cycle.

* * * * *